US012575187B2

(12) United States Patent
Wu et al.

(10) Patent No.: US 12,575,187 B2
(45) Date of Patent: Mar. 10, 2026

(54) INTEGRATED CIRCUIT AND METHOD OF FORMING THE SAME

(71) Applicant: TAIWAN SEMICONDUCTOR MANUFACTURING COMPANY, LTD., Hsinchu (TW)

(72) Inventors: Chia Chun Wu, Hsinchu (TW); Chih-Liang Chen, Hsinchu (TW); Hui-Zhong Zhuang, Hsinchu (TW); Jerry Chang Jui Kao, Hsinchu (TW); Yung-Chen Chien, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 614 days.

(21) Appl. No.: 17/857,663

(22) Filed: Jul. 5, 2022

(65) Prior Publication Data

US 2023/0290766 A1     Sep. 14, 2023

Related U.S. Application Data

(60) Provisional application No. 63/323,958, filed on Mar. 25, 2022, provisional application No. 63/318,231, filed on Mar. 9, 2022.

(51) Int. Cl.
*H10D 89/10*          (2025.01)
*G06F 30/392*        (2020.01)

(52) U.S. Cl.
CPC ........... *H10D 89/10* (2025.01); *G06F 30/392* (2020.01)

(58) Field of Classification Search
CPC ... H01L 23/522; H01L 23/5226; H01L 29/06; H01L 29/423
See application file for complete search history.

(56) References Cited

U.S. PATENT DOCUMENTS

| | | | | |
|---|---|---|---|---|
| 8,217,429 B2 * | 7/2012 | Yamashita | ......... | H10D 84/8311 |
| | | | | 257/390 |
| 9,318,476 B2 * | 4/2016 | Chen | .................. | H10D 84/0149 |
| 9,997,617 B2 * | 6/2018 | Yang | ..................... | H10D 30/62 |
| 10,096,546 B2 * | 10/2018 | Yoon | .................. | H10D 84/0186 |
| 10,297,596 B2 * | 5/2019 | Sharma | ................ | H10D 84/834 |

(Continued)

FOREIGN PATENT DOCUMENTS

TW          202032262          9/2020

*Primary Examiner* — Dale E Page
*Assistant Examiner* — Rohit Parthasarathy
(74) *Attorney, Agent, or Firm* — Hauptman Ham, LLP

(57) ABSTRACT
An integrated circuit includes a first and second active region extending in a first direction, and a floating gate, a first dummy gate, a first conductor and a second conductor extending in the second direction. The floating gate is electrically floating. The first dummy gate is separated from the floating gate in the second direction. The dummy gate and the floating gate separate a first cell that corresponds to a first transistor from a second cell that corresponds to a second transistor. The first and second conductors are separated from each other in the first direction, and overlap the second active region. The first and second conductors are electrically coupled to a corresponding source/drain of the second active region, and are configured to supply a same signal/voltage to the corresponding source/drain of the second active region. The floating gate is between the first and second conductors.

20 Claims, 28 Drawing Sheets

100

(56)                    References Cited

U.S. PATENT DOCUMENTS

| | | | | |
|---|---|---|---|---|
| 10,361,195 | B2 * | 7/2019 | Sengupta | H10D 84/834 |
| 10,679,994 | B1 * | 6/2020 | Yang | H10D 84/853 |
| 11,152,384 | B2 * | 10/2021 | Chuang | H01L 21/02164 |
| 12,142,637 | B2 * | 11/2024 | Lin | H01L 23/5226 |
| 2007/0028195 | A1 * | 2/2007 | Chidambarrao | G06F 30/367 |
| | | | | 716/112 |
| 2011/0147765 | A1 * | 6/2011 | Huang | H01L 21/28123 |
| | | | | 257/E27.06 |
| 2011/0233674 | A1 * | 9/2011 | Sleight | H10D 30/0217 |
| | | | | 438/151 |
| 2013/0157451 | A1 * | 6/2013 | Lin | G06F 30/398 |
| | | | | 438/587 |
| 2014/0252477 | A1 * | 9/2014 | Tseng | H10D 62/151 |
| | | | | 438/151 |
| 2014/0264610 | A1 * | 9/2014 | Yang | H01L 21/765 |
| | | | | 438/283 |
| 2016/0027499 | A1 * | 1/2016 | Liaw | H10D 84/853 |
| | | | | 365/154 |
| 2020/0126901 | A1 * | 4/2020 | Chen | H01L 23/50 |
| 2020/0135869 | A1 * | 4/2020 | Ciou | H10D 62/127 |
| 2022/0416026 | A1 * | 12/2022 | Lin | H10D 84/85 |

* cited by examiner

100

102 — Generate a layout design of an integrated circuit based on a set of design rules 104 — Manufacture at least an initial gate structure based on the layout design, and remove a portion of the initial gate structure 106 — Manufacture a whole integrated circuit based on the layout design

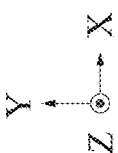
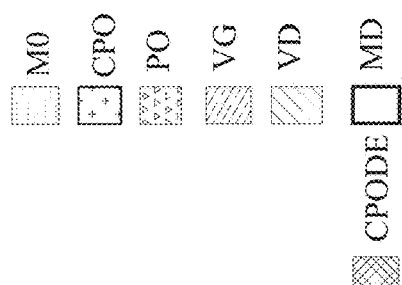
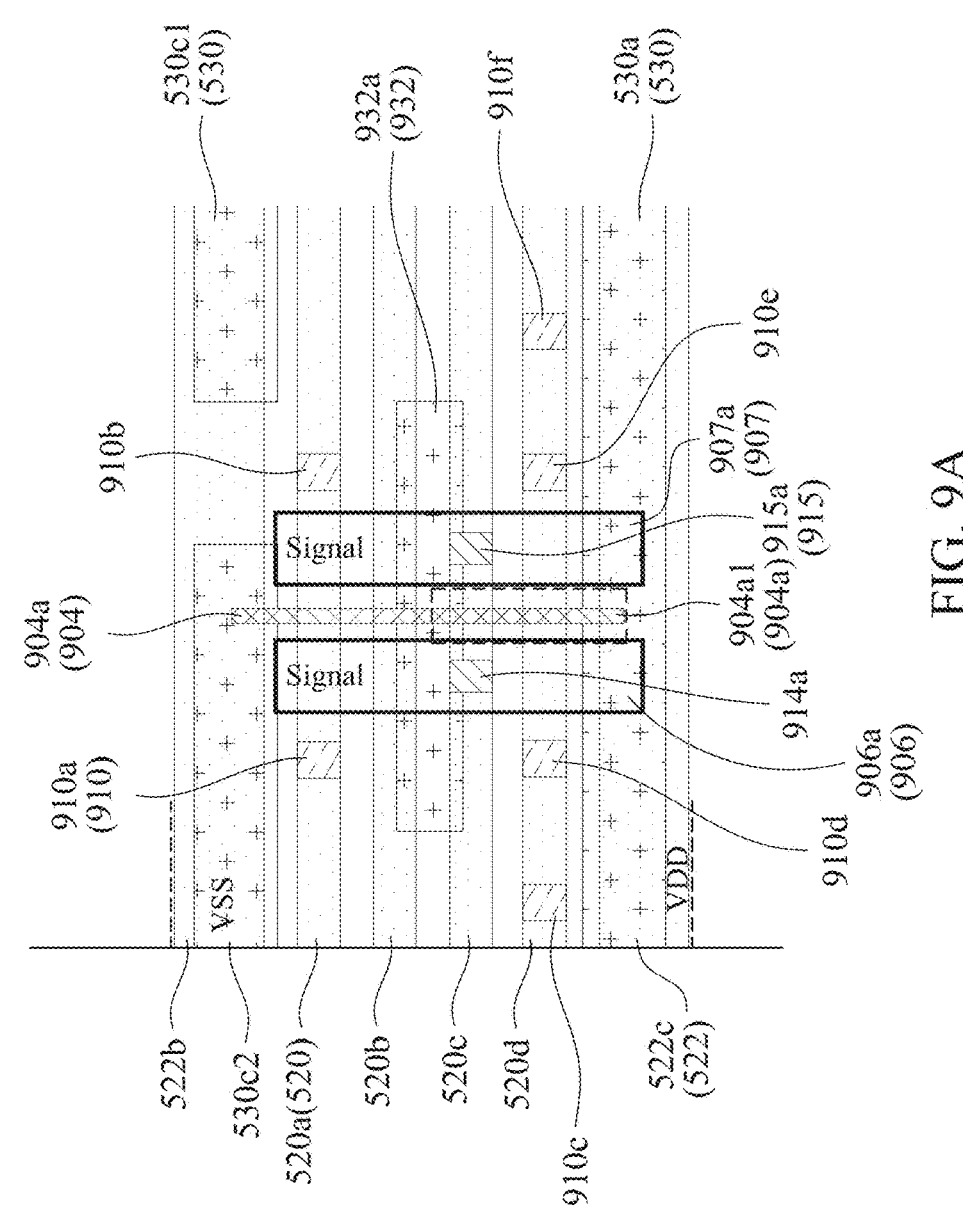
FIG. 9A

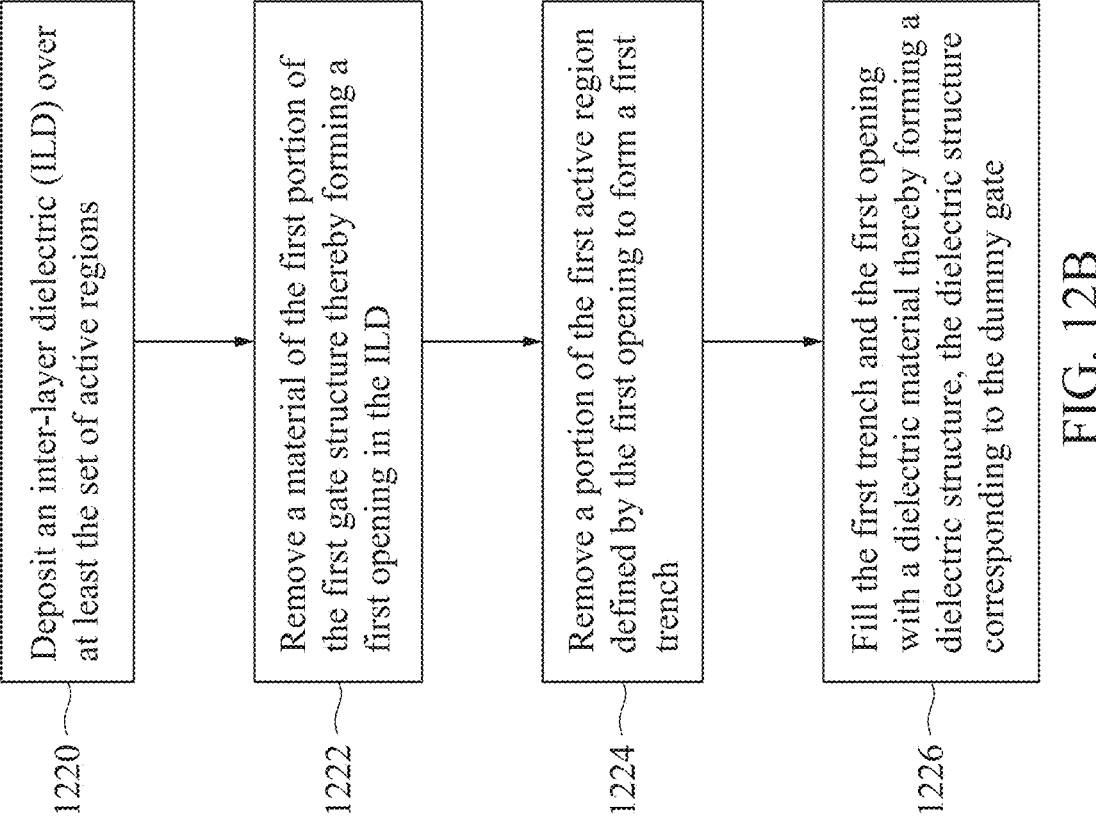

1200B

1220 — Deposit an inter-layer dielectric (ILD) over at least the set of active regions 1222 — Remove a material of the first portion of the first gate structure thereby forming a first opening in the ILD 1224 — Remove a portion of the first active region defined by the first opening to form a first trench 1226 — Fill the first trench and the first opening with a dielectric material thereby forming a dielectric structure, the dielectric structure corresponding to the dummy gate

FIG. 12B

INTEGRATED CIRCUIT AND METHOD OF FORMING THE SAME

PRIORITY CLAIM

This application claims the benefit of U.S. Provisional Application No. 63/323,958, filed Mar. 25, 2022, and U.S. Provisional Application No. 63/318,231, filed Mar. 9, 2022, which are herein incorporated by reference in its entirety.

BACKGROUND

The recent trend in miniaturizing integrated circuits (ICs) has resulted in smaller devices which consume less power yet provide more functionality at higher speeds. The miniaturization process has also resulted in stricter design and manufacturing specifications as well as reliability challenges. Various electronic design automation (EDA) tools generate, optimize and verify standard cell layout designs for integrated circuits while ensuring that the standard cell layout design and manufacturing specifications are met.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 9A-9B are diagrams of a corresponding layout design of an integrated circuit, in accordance with some embodiments.

FIG. 12B is a flowchart of a method of forming or manufacturing an integrated circuit, in accordance with some embodiments.

DETAILED DESCRIPTION

Figure 1:
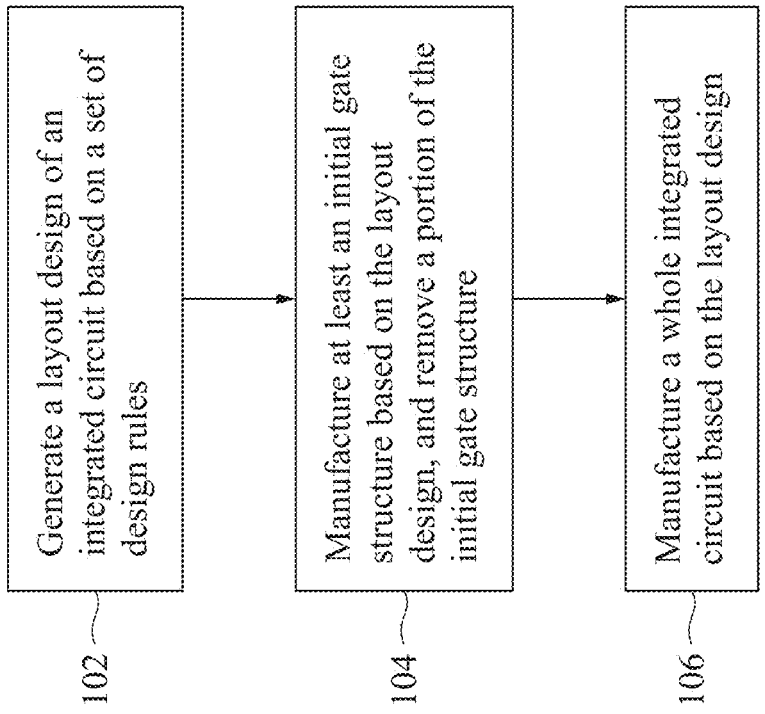
FIG. 1 is a flowchart of a method of manufacturing an integrated circuit in accordance with some embodiments.

The following disclosure provides different embodiments, or examples, for implementing features of the provided subject matter. Specific examples of components, materials, values, steps, arrangements, or the like, are described below to simplify the present disclosure. These are, of course, merely examples and are not limiting. Other components, materials, values, steps, arrangements, or the like, are contemplated. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In accordance with some embodiments, a method of forming an integrated circuit includes identifying a dummy gate isolation pattern that continuously extends between a first power rail pattern and a second power rail pattern of a first layout design.

In some embodiments, the dummy gate isolation pattern is located on a first level. In some embodiments, the dummy gate isolation pattern separates a first cell from a second cell in the first layout design.

In some embodiments, the first power rail pattern and the second power rail pattern extend in a first direction, and are located on a second level different from the first level. In some embodiments, the dummy gate isolation pattern extends in a second direction different from the first direction.

In some embodiments, the method further includes replacing a first portion of the dummy gate isolation pattern with a floating gate pattern in response to determining that the first layout design includes at least the dummy gate isolation pattern that satisfies at least one replacement criterion. In some embodiments, the floating gate pattern corresponds to a floating dummy gate of a first transistor.

In some embodiments, replacing the first portion of the dummy gate isolation pattern with the floating gate pattern results in a layout design having more routing resources and occupying less area than other approaches.

FIG. 1 is a flowchart of a method 100 of manufacturing an integrated circuit in accordance with some embodiments. It is understood that additional operations may be performed before, during, and/or after the method 100 depicted in FIG. 1, and that some other processes may only be briefly described herein.

In some embodiments, other order of operations of one or more of methods 100, 200, 300A, 300B, 1200A-1200B or 1300 (FIG. 2, 3A-3B, 12A-12B or 13) are within the scope of the present disclosure. One or more of methods 100, 200, 300A, 300B, 1200A-1200B or 1300 include exemplary operations, but the operations are not necessarily performed in the order shown. Operations may be added, replaced, changed order, and/or eliminated as appropriate, in accordance with the spirit and scope of disclosed embodiments.

In some embodiments, the method 100 is usable to form integrated circuits, such as at least integrated circuit 600 (FIGS. 6A-6G). In some embodiments, the method 100 is usable to form integrated circuits having similar structural relationships as one or more of layout designs 500A-500D (FIGS. 5A-5D), 700A-700B (FIGS. 7A-7B), 800A-800B (FIGS. 8A-8B), 900A-900B (FIGS. 9A-9B), 1000A-1000B (FIGS. 10A-10B) or 1100A-1100B (FIGS. 11A-11B).

In operation 102 of method 100, a layout design of an integrated circuit is generated based on a set of design rules.

Figures 10A, 10B:
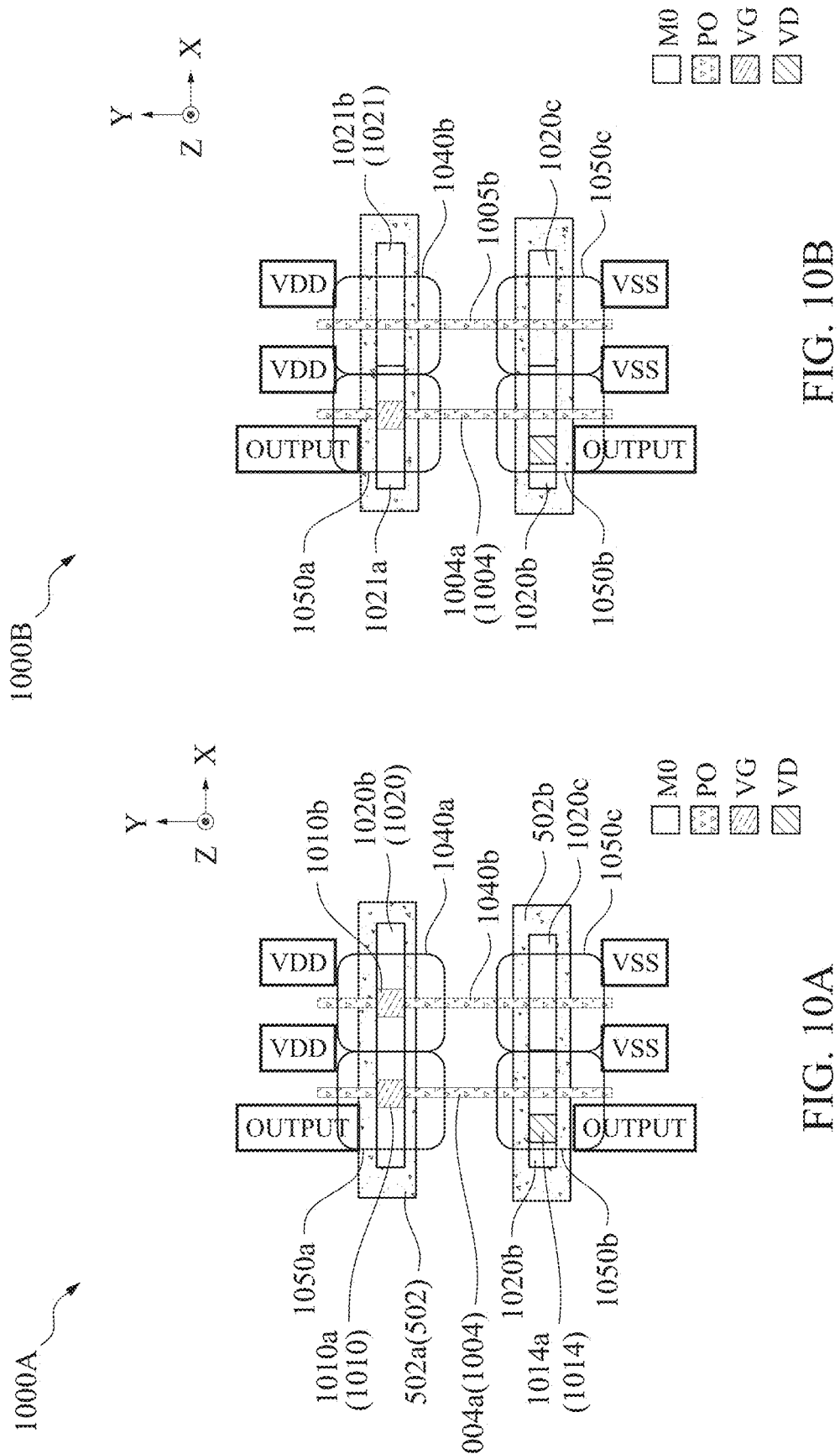
FIGS. 10A-10B are diagrams of a corresponding layout design of an integrated circuit, in accordance with some embodiments.
Figures 11A, 11B:
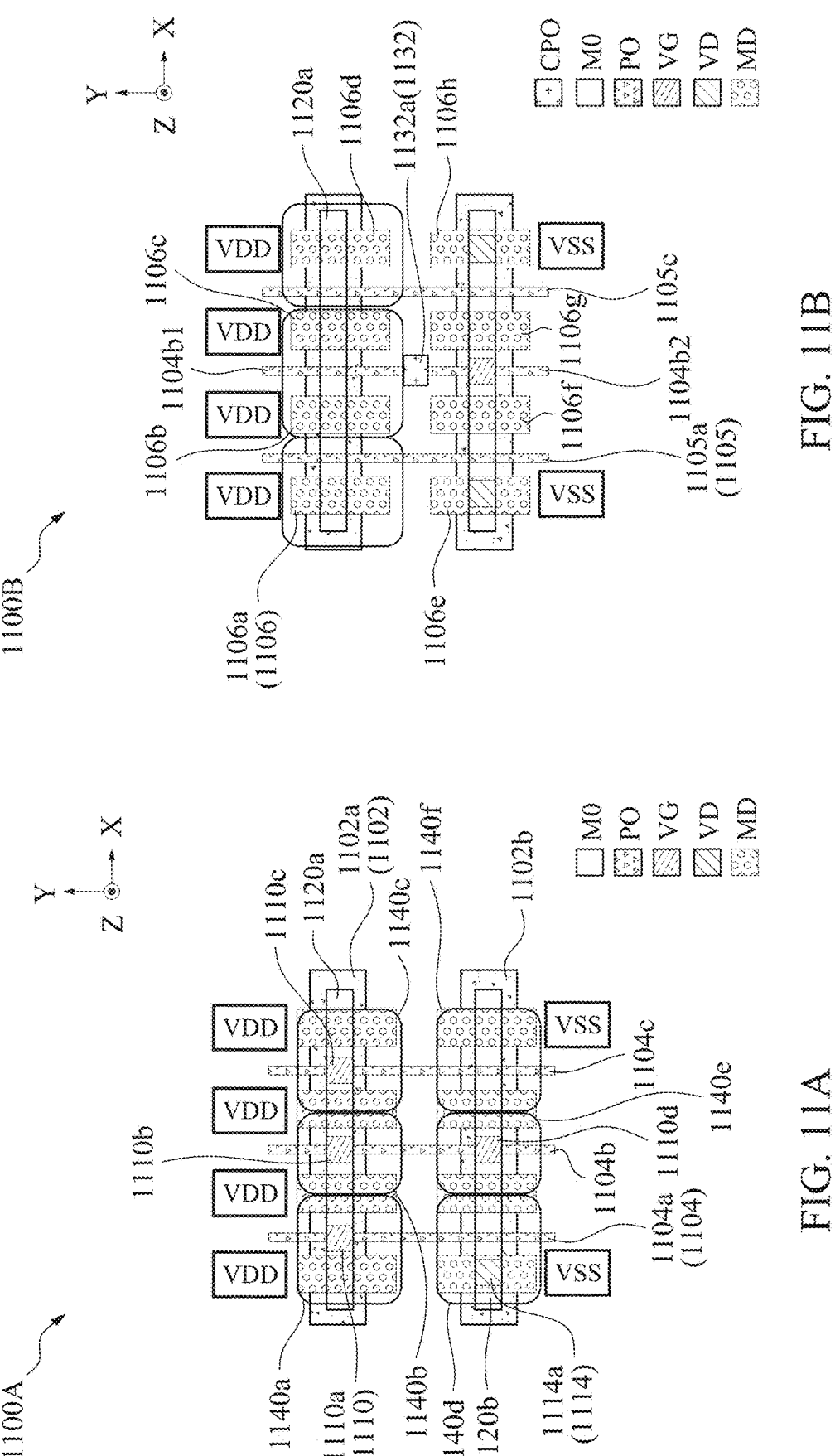
FIGS. 11A-11B are diagrams of a corresponding layout design of an integrated circuit, in accordance with some embodiments.

In some embodiments, the layout design of method 100 includes one or more patterns or layout designs, such as one or more of layout design 500A (FIG. 5A), layout design 500B (FIG. 5B), layout design 500C (FIG. 5C), layout design 500D (FIG. 5D), layout design 700A (FIG. 7A), layout design 700B (FIG. 7B), layout design 800A (FIG. 8A), layout design 800B (FIG. 8B), layout design 900A (FIG. 9A), layout design 900B (FIG. 9B), layout design 1000A (FIG. 10A), layout design 1000B (FIG. 10B), layout design 1100A (FIG. 11A) or layout design 1100B (FIG. 11B).

In some embodiments, the layout design of method 100 includes one or more layout designs of an integrated circuit, such as integrated circuit 600 (FIGS. 6A-6E). In some embodiments, the layout design of the present application is in a graphic database system (GDSII) file format.

In some embodiments, operation 102 of method 100 is performed by a processing device (e.g., processor 1402 (FIG. 14)) configured to execute instructions for generating the layout design.

In operation 104 of method 100, an initial gate structure is manufactured based on the layout design, and a portion of the initial gate structure is removed by one or more cut processes. In some embodiments, operation 104 is an embodiment of one or more of operations of methods 1200A-1200B.

In some embodiments, operation 104 comprises removing one or more gate portions from the gate by one or more cut-poly (CPO) processes. In some embodiments, the one or more cut-poly (CPO) processes of operation 104 includes removing a portion 632a of a gate structure 604 thereby forming a gate structure 604a2 and a gate structure 605a1 (FIGS. 6A-6G). In some embodiments, the removed portion 632a of the gate structure 604 corresponds to a poly cut region (e.g., poly cut feature pattern 532a).

In some embodiments, the portion 632a of the gate structure 604 that is removed in operation 104 is identified in layout design 500C-500D by poly cut feature pattern 532a. In some embodiments, the poly cut feature pattern 532a identifies a location of the removed portion 632a of the gate structure 604 of integrated circuit 600.

In some embodiments, the portion of the gate that is removed in operation 104 is identified in one or more of layout designs 500A-500D, 700A-700B, 800A-800B or 900A-900B (FIG. 5A-5D, 7A-7B, 8A-8B or 9A-9B) by one or more cut feature layout patterns 530a, 530b, 530c, 530d, 530e, 705a, 805a, 905a. In some embodiments, operation 104 of method 100 is referred to as a cut-poly (CPO) process. In some embodiments, operation 104 results in the formation of integrated circuit 600 (FIGS. 6A-6G). In some embodiments, the removed gate portion 632a of gate structure 604 is referred to as a cut region.

In some embodiments, operation 104 is performed by a removal process. In some embodiments, the removal process includes one or more etching processes suitable to remove a portion 632a of the gate (e.g., gate 604). In some embodiments, the etching process of operation 104 includes identifying a portion 632a of the gate (e.g., gate 604) that is to be removed, and etching the portion 632a of the gate (e.g., gate 604) that is to be removed. In some embodiments, a mask is used to specify portions of the gate (e.g., gate 604) that are to be cut or removed. In some embodiments, the mask is a hard mask. In some embodiments, the mask is a soft mask. In some embodiments, etching corresponds to plasma etching, reactive ion etching, chemical etching, dry etching, wet etching, other suitable processes, any combination thereof, or the like.

Figure 12A:
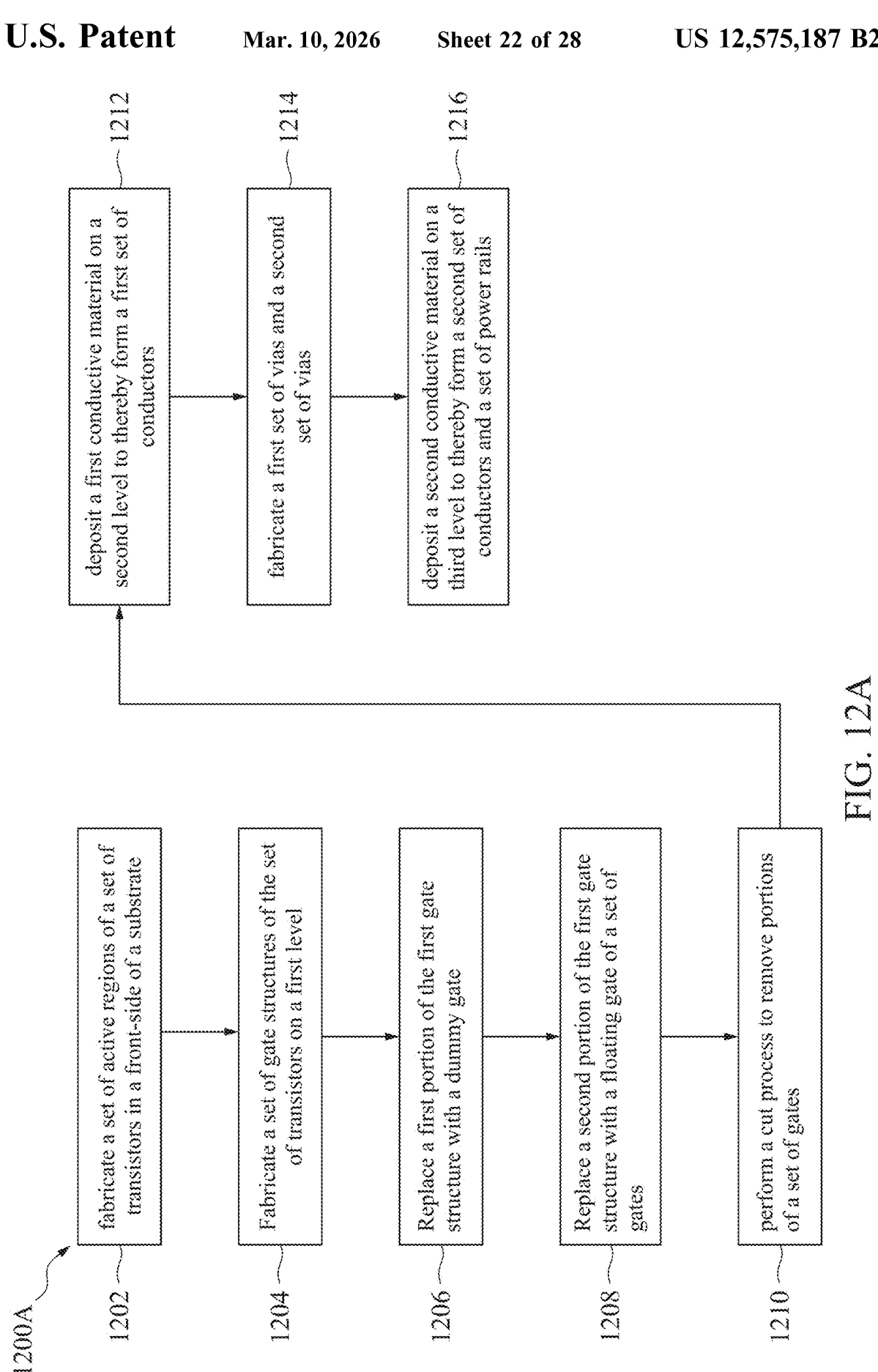
FIG. 12A is a flowchart of a method of forming or manufacturing an integrated circuit in accordance with some embodiments.

In operation 106 of method 100, a whole integrated circuit is manufactured based on at least the layout design. In some embodiments, operation 106 of method 100 comprises manufacturing at least one mask based on the layout design, and manufacturing the integrated circuit based on the at least one mask. In some embodiments, operation 106 is an embodiment of method 1200A-1200B (FIGS. 12A-12B).

In some embodiments, one or more of operations 102, 104 or 106 is not performed.

Figure 2:
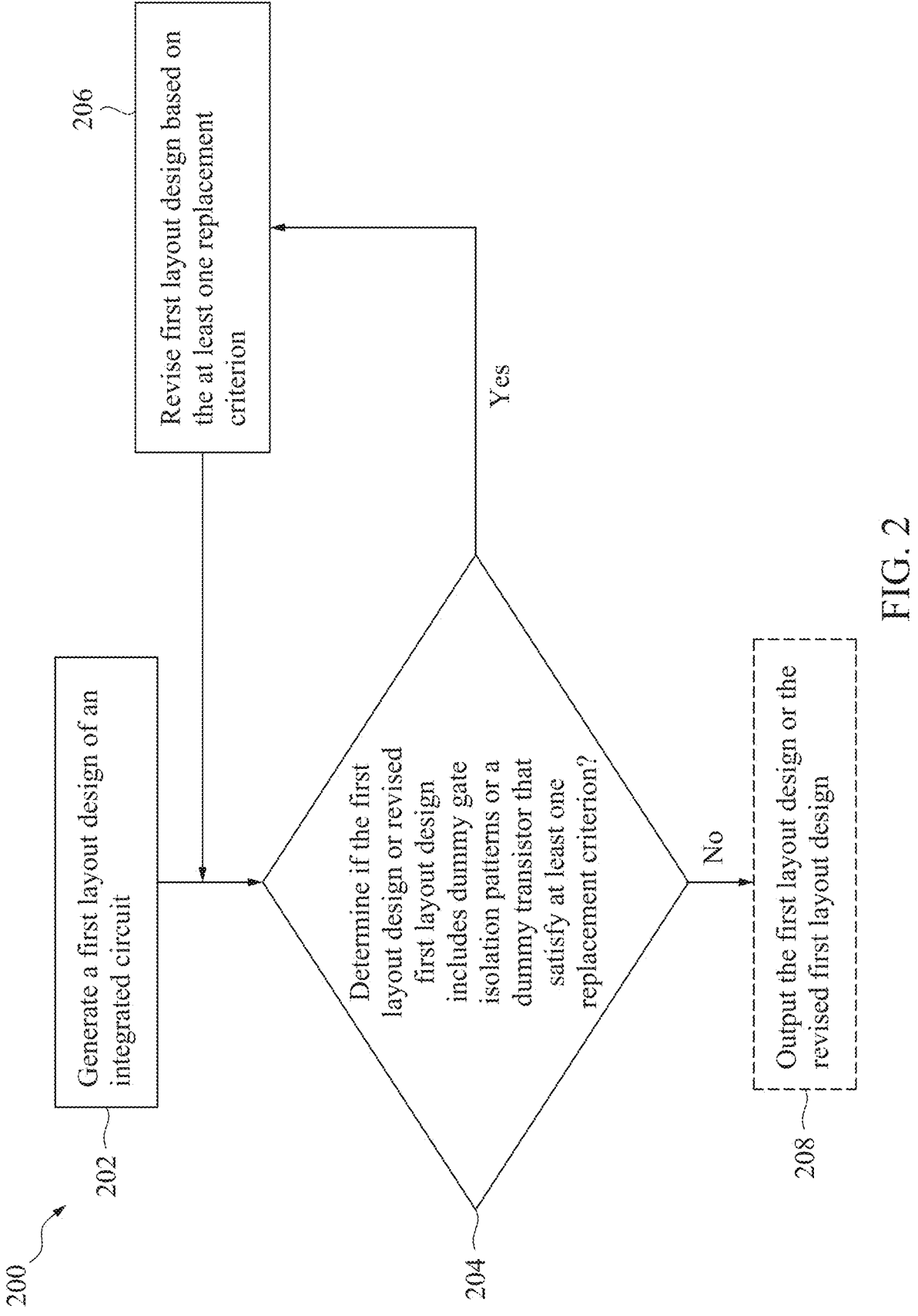
FIG. 2 is a flowchart of a method of generating a layout design of an integrated circuit based on a set of design rules in accordance with some embodiments.

FIG. 2 is a flowchart of a method 200 of generating a layout design of an integrated circuit based on a set of design rules in accordance with some embodiments.

It is understood that additional operations may be performed before, during, and/or after the method 200 depicted in FIG. 2, and that some other processes may only be briefly described herein. In some embodiments, the method 200 is usable to generate one or more layout designs, such as layout design 500A-500D (FIGS. 5A-5D), 700A-700B (FIGS. 7A-7B), 800A-800B (FIGS. 8A-8B), 900A-900B (FIGS. 9A-9B), 1000A-1000B (FIGS. 10A-10B) or 1100A-1100B (FIGS. 11A-11B). In some embodiments, the method 200 is usable to generate one or more layout designs of an integrated circuit, such as integrated circuit 600 (FIGS. 6A-6E). Method 200 is an embodiment of operation 102 of method 100 (FIG. 1).

In operation 202 of method 200, a first layout design of an integrated circuit is generated. In some embodiments, the first layout design of one or more of method 200, 300A or 300B includes one or more patterns of one or more layout designs, such as layout design 500A-500D, 700A-700B, 800A-800B, 900A-900B, 1000A-1000B or 1100A-1100B (FIG. 5A-5D, 7A-7B, 8A-8B, 9A-9B, 10A-10B or 11A-11B).

In operation 204 of method 200, a determination is made whether the first layout design or a revised first layout design includes a dummy gate isolation layout pattern (e.g., continuous poly on oxide diffusion edge (CPODE)) or a dummy transistor that satisfy at least one replacement criterion.

In some embodiments, a CPODE pattern is a dummy gate pattern that overlaps an active region of a semiconductor and is usable to manufacture a dielectric structure as described below in methods 1200A-1200B (FIGS. 12A-12B). In some embodiments, the dielectric structure corresponds to dummy gate structure 604a2 (FIGS. 6B & 6D-6E). Further details of the CPODE pattern are described below in methods 1200A-1200B (FIGS. 12A-12B) and FIGS. 16A-16D.

In some embodiments, each of method 300A and 300B are an embodiment of operations 204 and 206. In some embodiments, method 300A and method 300B are performed sequentially. For example, method 300A is performed first, and then method 300B is performed, in accordance with some embodiments. For example, method 300B is performed first, and then method 300A is performed, in accordance with some embodiments.

In some embodiments, operation 204 comprises determining whether the first layout design or the revised first layout design includes at least one of a dummy gate isolation layout pattern (e.g., CPODE) or a dummy transistor, and determining whether the at least one of the dummy gate isolation layout pattern (e.g., CPODE) or the dummy transistor satisfies at least one replacement criterion.

In some embodiments, the revised first layout design is generated in operation 206. In some embodiments, the revised first layout design of one or more of method 200, 300A or 300B includes one or more patterns or one or more layout designs, such as layout design 500C-500D, 700A-700B, 800B, 900B, 1000B or 1100B (FIG. 5C-5D, 7B, 8B, 9B, 10B or 11B).

In some embodiments, the dummy gate isolation layout pattern of at least method 200 includes at least one of dummy gate isolation layout pattern 504a, 504a2, 504b, 504c, 504d, 504e, 504f, 704a1, 804a, 804a2, 904a or 904a2 (FIG. 5A-5D, 7A-7B, 8A-8B or 9A-9B). In some embodiments, the dummy gate isolation layout pattern of at least method 200 includes at least one or more CPODE patterns.

Figure 6A:
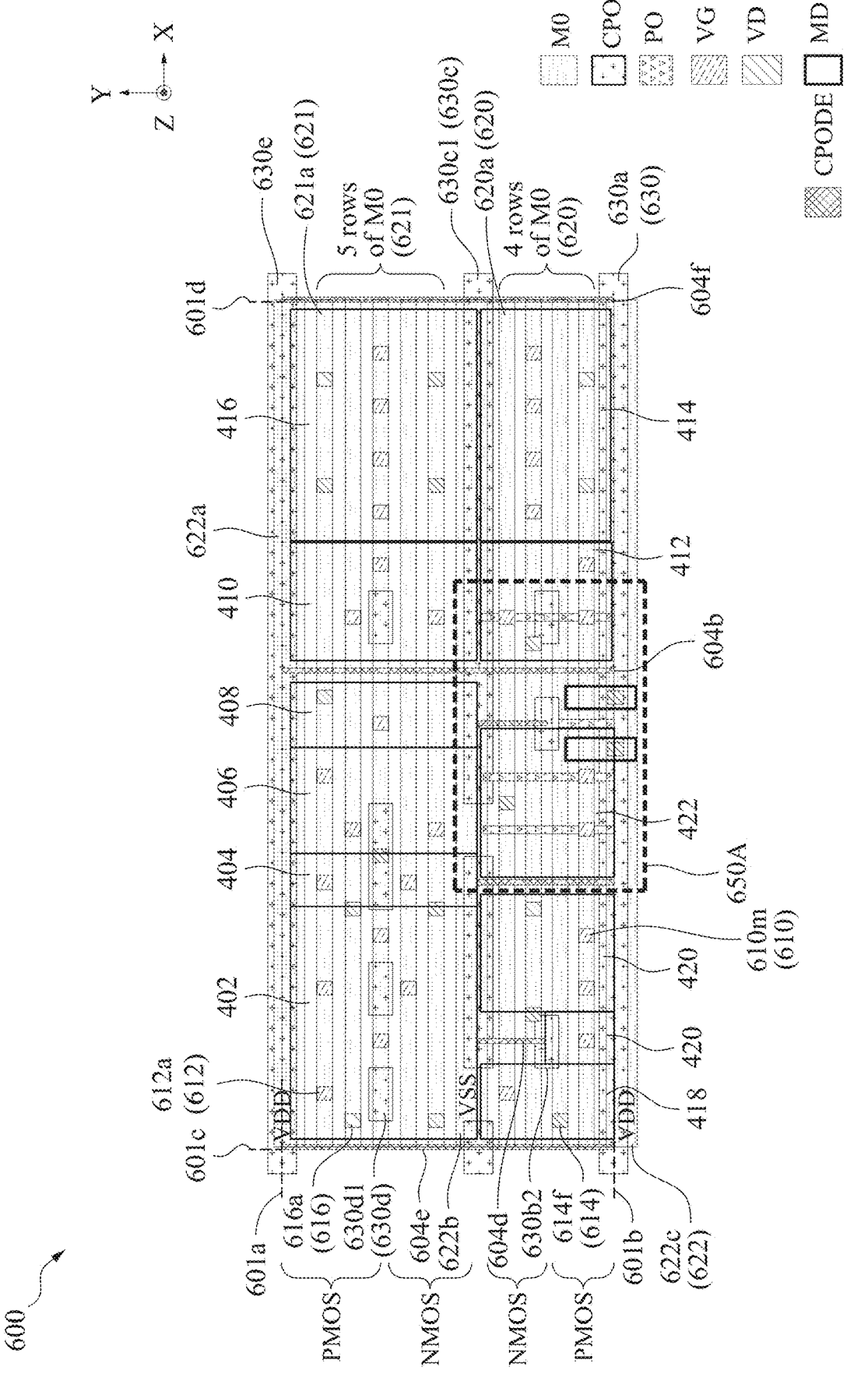
FIGS. 6A-6G are diagrams of an integrated circuit, in accordance with some embodiments.
Figure 6B:
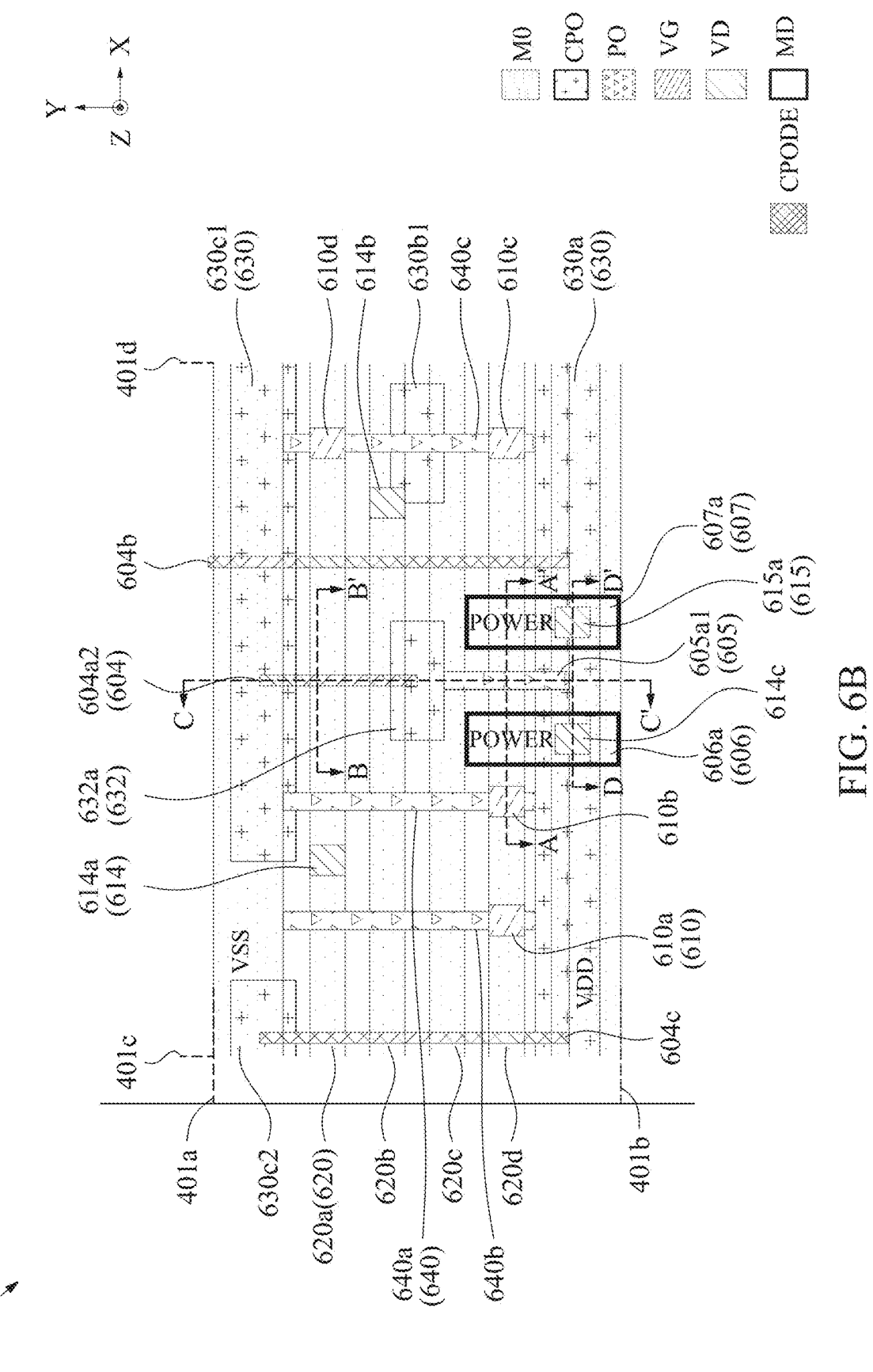
Figures 6C, 6D:
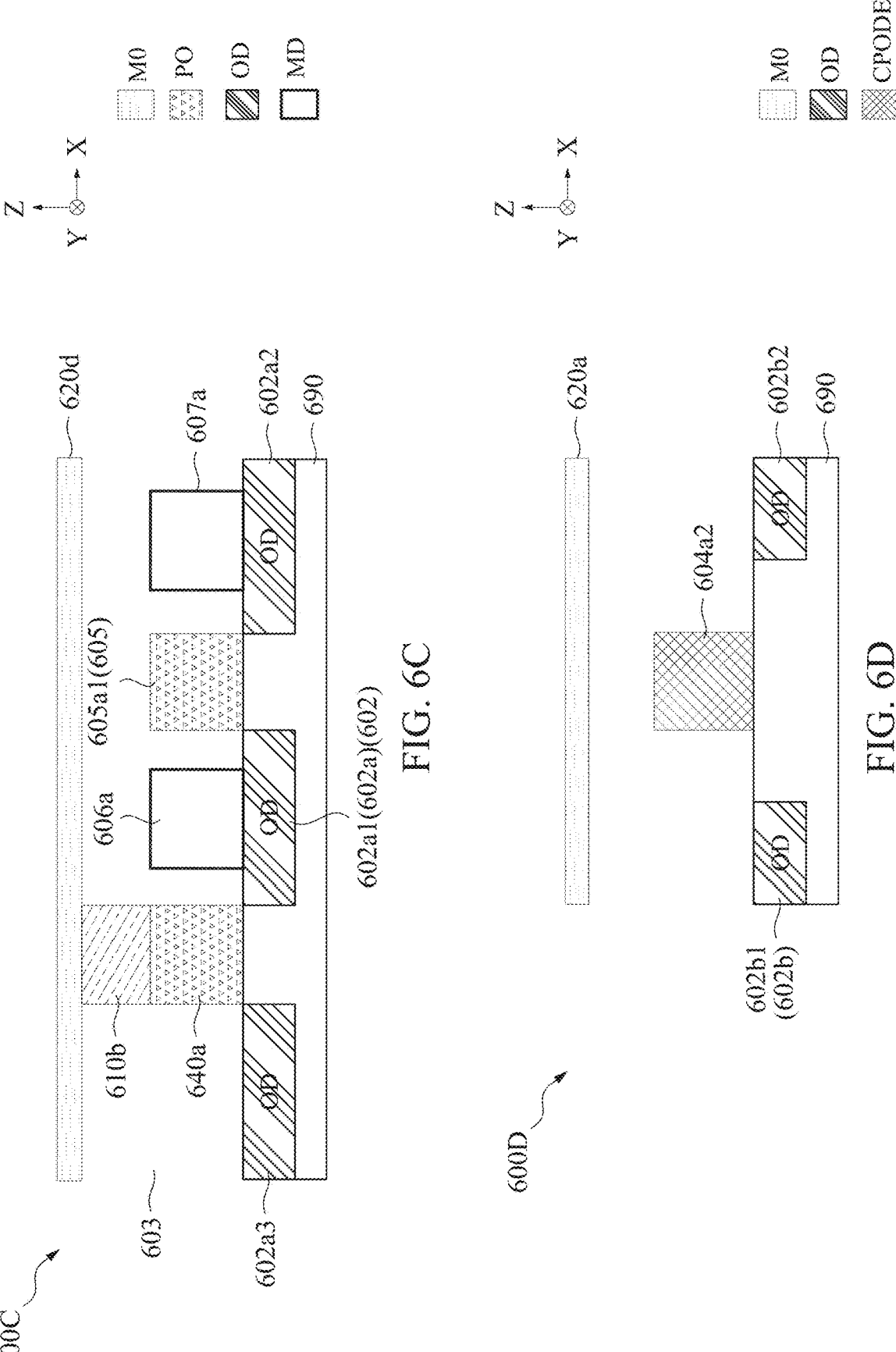
Figure 6E:
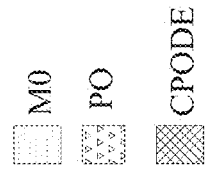
Figure 6E:
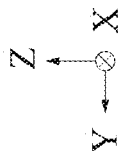
Figure 6E:
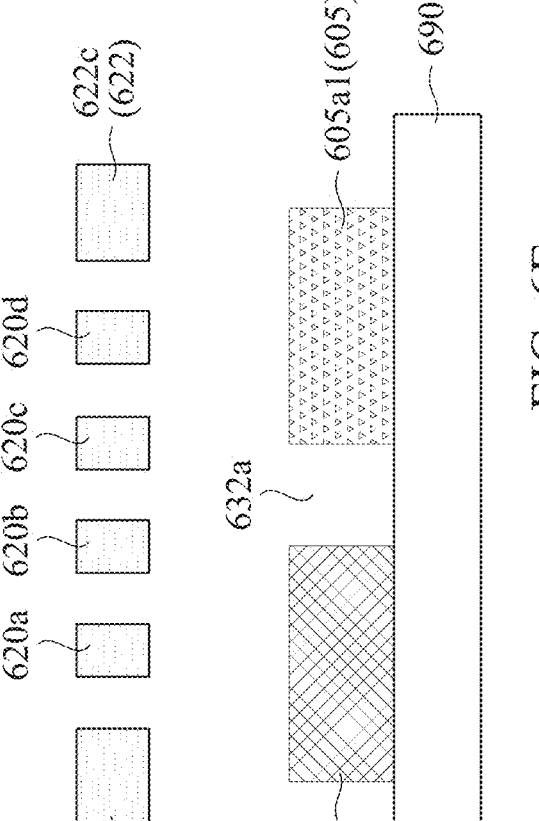
Figure 6F:
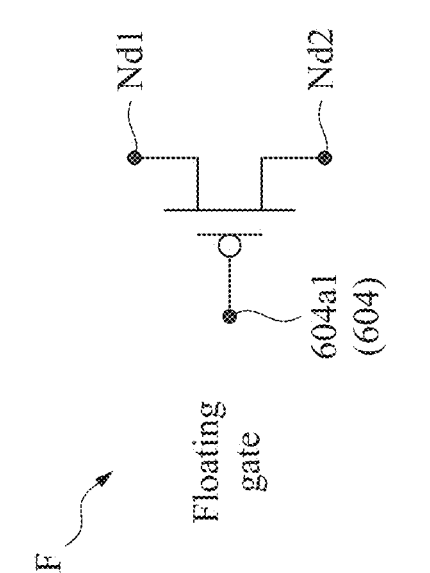

In some embodiments, the dummy transistor of at least method 200 includes at least one of dummy transistor 600F, 1040a, 1140a, 1140b or 1140c (FIG. 6F, 10A or 11A).

In some embodiments, the at least one replacement criterion includes at least determining if two or more CPODE patterns (e.g., dummy gate isolation patterns 504a and 504b) are adjacent to each other (FIGS. 5A-5D). In some embodiments, a first element is adjacent to a second element if the first element and second element are directly next to each other.

Figure 8A:
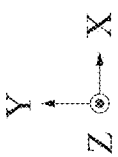
FIGS. 8A-8B are diagrams of a corresponding layout design of an integrated circuit, in accordance with some embodiments.
Figure 8A:
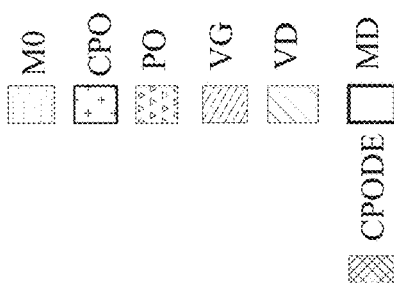
Figure 8A:
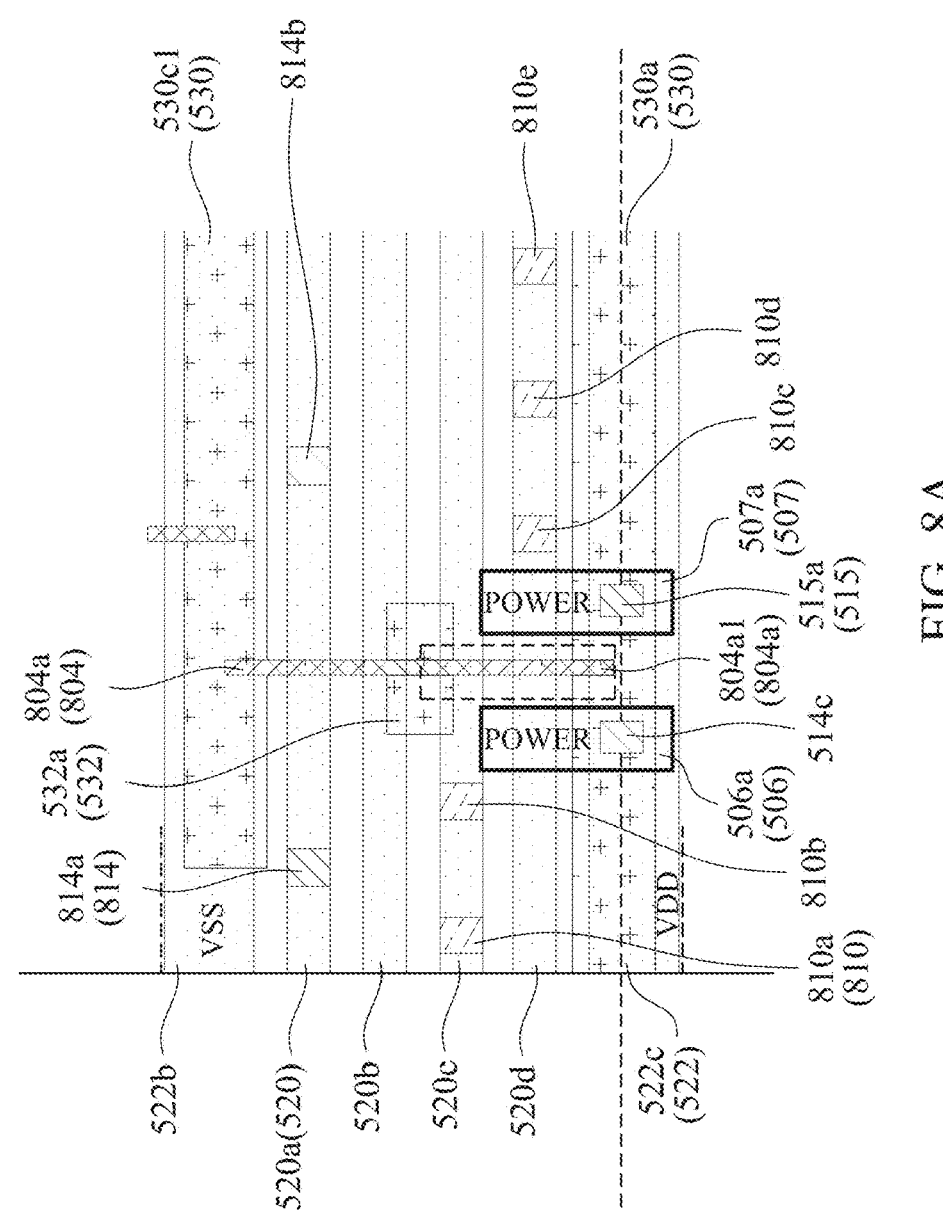
Figure 8B:
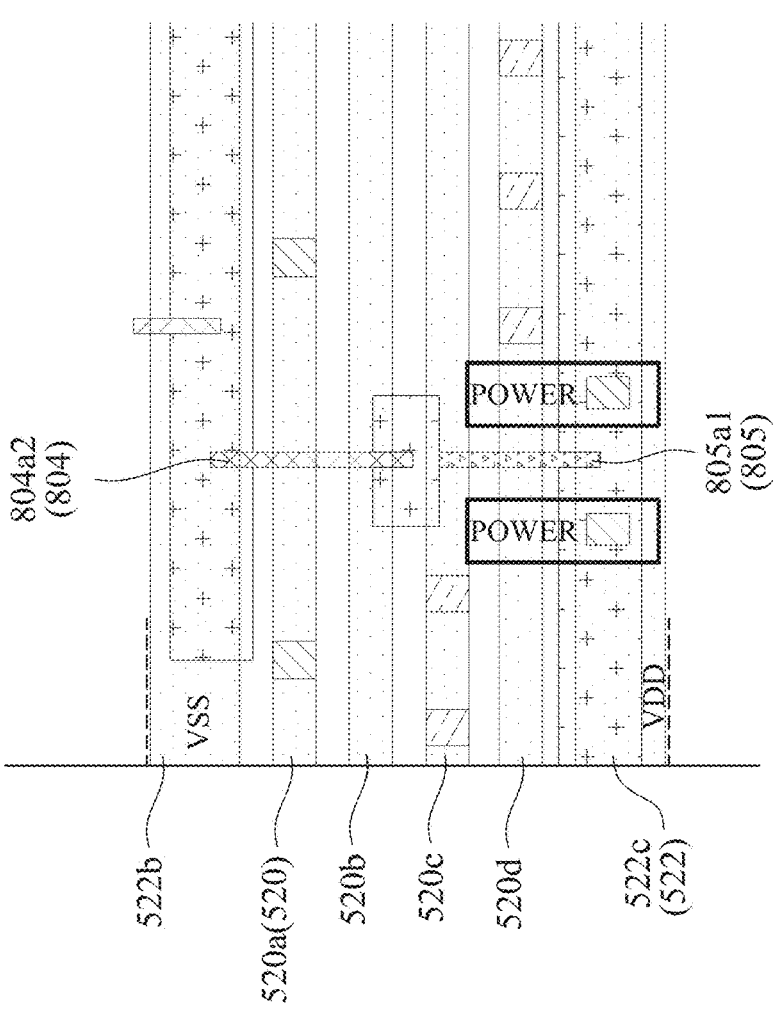

In some embodiments, the at least one replacement criterion includes at least determining if at least a single CPODE pattern (e.g., dummy gate isolation patterns 804a and 904a) is between and adjacent to two conductive feature patterns (e.g., conductive feature patterns 506a and 507a in FIGS. 8A-8B or conductive feature patterns 906a and 907a in 9A-9B) configured to carry a same signal (FIG. 9A-9B) or a same power (FIG. 8A-8B).

In some embodiments, the at least one replacement criterion includes at least determining if at least a gate (e.g., gate layout pattern 1004b) of the dummy transistor 1040a is electrically coupled to at least a conductor (e.g., 1020a).

In some embodiments, the at least one replacement criterion includes at least determining if at least a gate (e.g., gate layout pattern 1104a, 1104b, 1104c) of the corresponding dummy transistor 1140a, 1140b, 1140c is electrically coupled to at least a conductor (e.g., 1120a).

In some embodiments, the at least one replacement criterion includes at least determining if at least a first gate pattern (e.g., gate layout pattern 1004b) of the dummy transistor 1040a overlaps a first active region pattern (e.g., active region layout pattern 502a) and a second active region pattern (e.g., active region layout pattern 502b). In some embodiments, the first active region pattern corresponds to a first active region of the first dummy transistor, and the second active region pattern corresponds to a second active region of a second dummy transistor.

In some embodiments, the at least one replacement criterion includes at least determining if at least a first gate pattern (e.g., gate layout patterns 1104a, 1104b, 1104c) of the corresponding dummy transistor 1140a, 1140b, 1140c overlaps a first active region pattern (e.g., active region layout pattern 1102a) and a second active region pattern (e.g., active region layout pattern 1102b).

\ise, the replacement criteria are specified by a user interface (e.g., user interface 1418 (FIG. 14)).

If the first layout design or the revised first layout design is determined to include at least one of a dummy gate isolation layout pattern or a dummy transistor that satisfies the at least one replacement criterion, then method 200 proceeds to operation 206.

If the first layout design or the revised first layout design is determined to include a dummy gate isolation layout pattern that does not satisfy the at least one replacement criterion, and a dummy transistor that does not satisfy the at least one replacement criterion, then method 200 proceeds to operation 208.

In operation 206 of method 200, the first layout design is revised based on one or more of the replacement criteria. In some embodiments, the revised first layout design of method 200 includes one or more patterns or one or more layout designs, such as layout design 500C-500D, 700A-700B, 800B, 900B, 1000B or 1100B (FIG. 5C-5D, 7B, 8B, 9B, 10B or 11B).

Figure 3A:
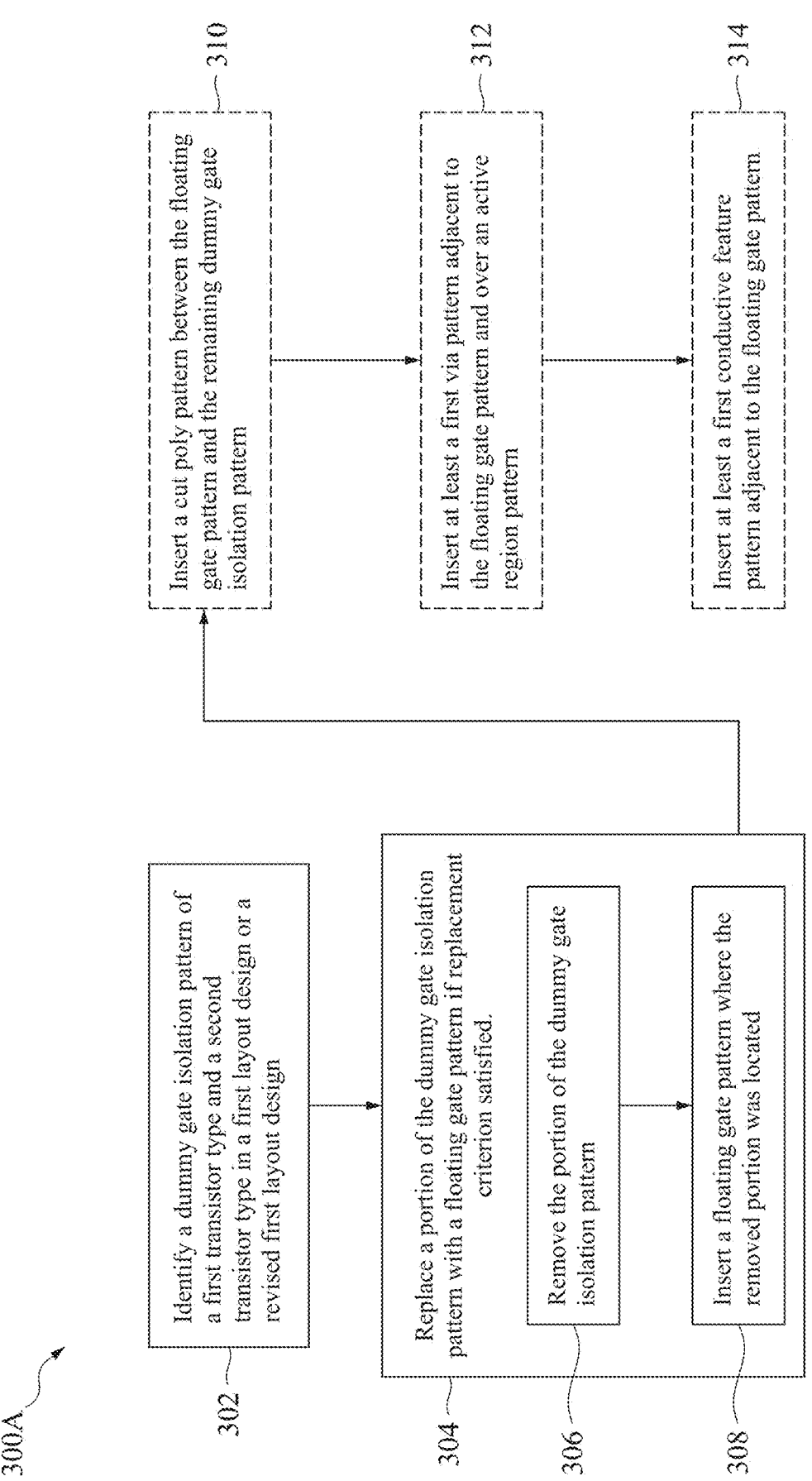
FIG. 3A is a flowchart of a method of generating a layout design of an integrated circuit, in accordance with some embodiments.
Figure 3B:
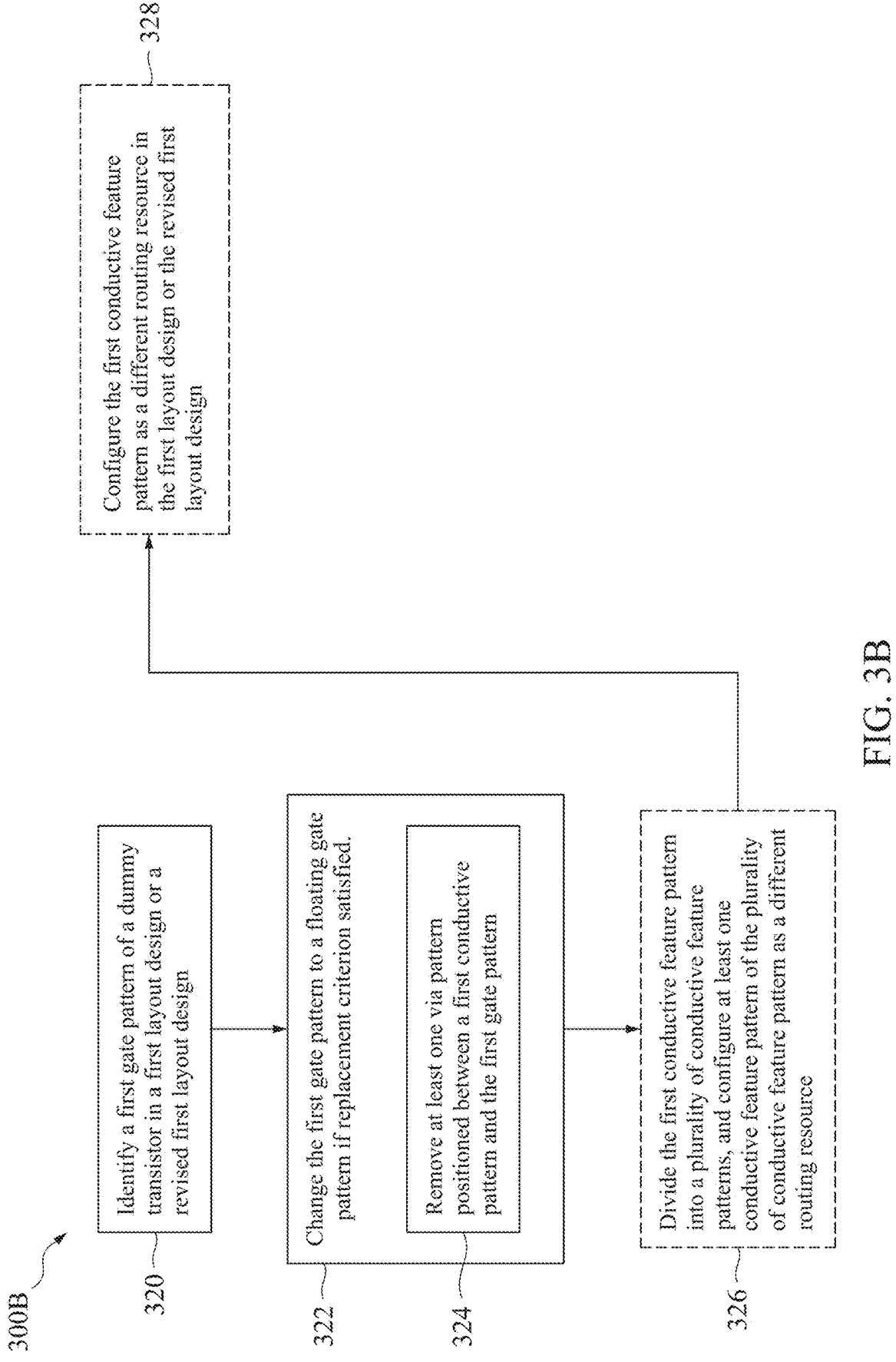
FIG. 3B is a flowchart of a method of generating a layout design of an integrated circuit, in accordance with some embodiments.

In some embodiments, operation 206 comprises generating a revised first layout design based on the first layout design and the replacement criteria. In some embodiments, the replacement criteria is further specified in methods 300A and 300B (FIGS. 3A-3B).

In some embodiments, the replacement criteria includes replacing one or more dummy gate isolation patterns with a floating gate dummy pattern (e.g., floating gate pattern 505a1, 704a2, 704b1, 805a1, 905a1).

In some embodiments, the replacement criteria includes removing one or more via patterns 1010b, 1110a, 1110b or 1110c.

In some embodiments, revising the first layout design during operation 206 comprises generating a second layout design based on the replacement criteria, the second layout design corresponding to the revised first layout design.

Figure 14:
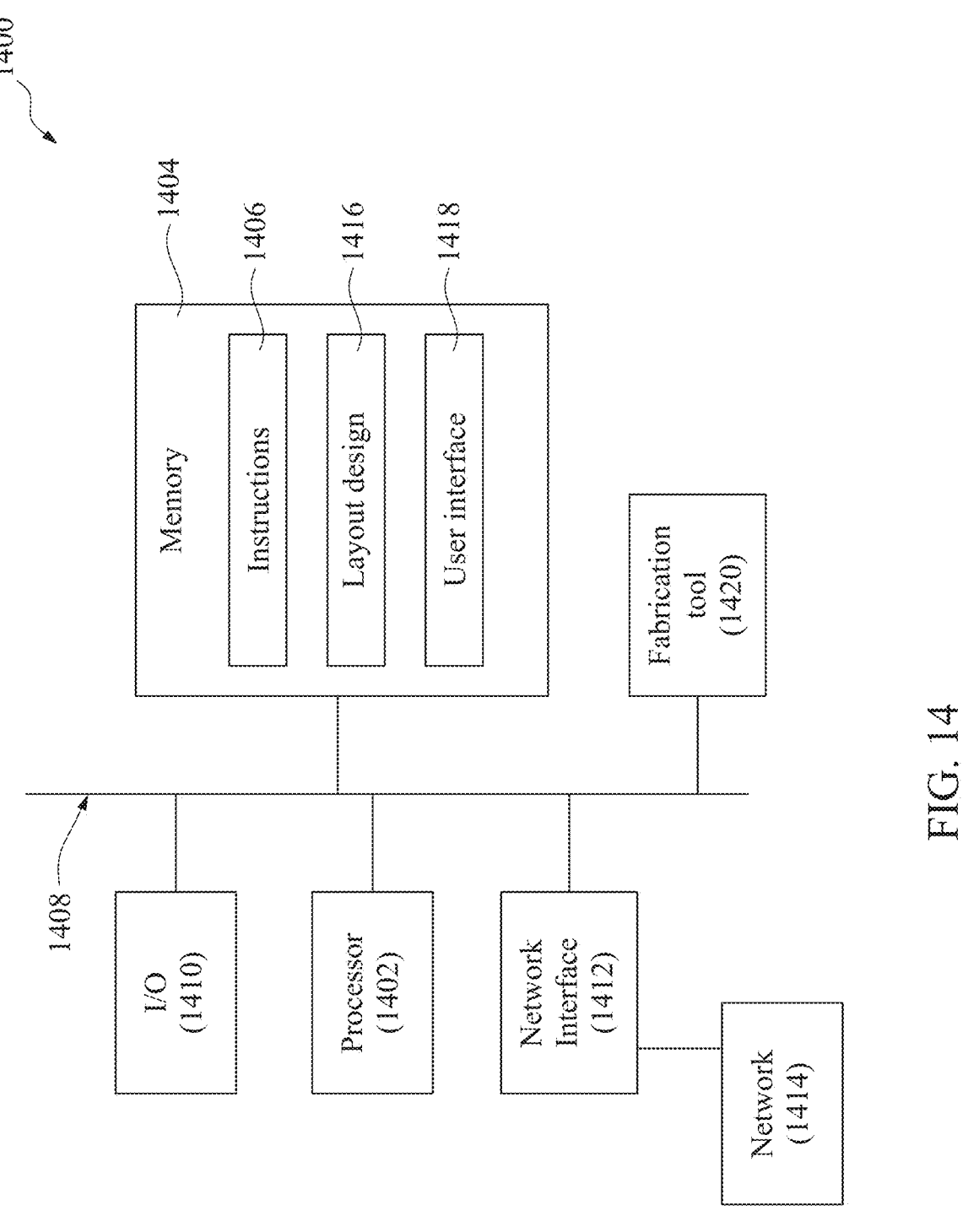
FIG. 14 is a schematic view of a system for designing an IC layout design and manufacturing an IC circuit in accordance with some embodiments.

In operation 208 of method 200, the first layout design or the revised layout design is output by system 1400 (FIG. 14). In some embodiments, operation 208 generates a second layout design. In some embodiments, the second layout design of operation 208 corresponds to the first layout design or the revised first layout design.

In some embodiments, one or more of operations 202, 204, 206 or 208 is not performed. In some embodiments, other order of operations of method 200 is within the scope of the present disclosure. Method 200 includes exemplary operations, but the operations are not necessarily performed in the order shown. Operations may be combined, divided, added, replaced, changed order, and/or eliminated as appropriate, in accordance with the spirit and scope of disclosed embodiments.

In some embodiments, one or more of operations 202-208 of method 200 is performed by a processing device (e.g., processor 1402 (FIG. 14)) configured to execute instructions for generating one or more of layout design 500A-500D, 700A-700B, 800A-800B, 900A-900B, 1000A-1000B or 1100A-1100B (FIG. 5A-5D, 7A-7B, 8A-8B, 9A-9B, 10A-10B or 11A-11B).

In some embodiments, by utilizing method 200 of the present disclosure, one or more dummy gate isolation patterns can be replaced with a floating gate dummy pattern thereby resulting in a layout design usable to manufacture a corresponding integrated circuit that has improved speed compared to other approaches.

In some embodiments, by utilizing method 200 of the present disclosure, one or more via patterns can be removed from the layout design thereby resulting in a layout design having more routing resources and occupying less area than other approaches.

FIG. 3A is a flowchart of a method 300A of generating a layout design of an integrated circuit, in accordance with some embodiments.

It is understood that additional operations may be performed before, during, and/or after the method 300A depicted in FIG. 3A, and that some other processes may only be briefly described herein.

In some embodiments, method 300A is an embodiment of operations 204 and 206 of method 200. In some embodiments, method 300A is a method of determining whether a first layout design or a revised first layout design includes a dummy gate isolation layout pattern that satisfies at least one replacement criterion, and revising the first layout design based on the one or more replacement criterion.

In some embodiments, operation 302 is an embodiment of operation 204 of method 200. In some embodiments, one or more of operations 304, 306, 308, 310, 312 or 314 is an embodiment of operation 206 of method 200.

In some embodiments, method 300A is usable to generate one or more layout patterns of at least layout design 500C-500D, 700A-700B, 800B or 900B (FIG. 5C-5D, 7B, 8B or 9B), or one or more features similar to at least integrated circuit 600 (FIGS. 6A-6E).

In some embodiments, method 300A is usable to generate one or more layout patterns having structural relationships including alignment, lengths and widths, as well as configurations and layers of at least layout design 500C-500D, 700A-700B, 800B or 900B (FIG. 5C-5D, 7B, 8B or 9B), or one or more features similar to at least integrated circuit 600, and similar detailed description will not be described in FIG. 3A, for brevity.

In some embodiments, other order of operations of method 300A is within the scope of the present disclosure. Method 300A includes exemplary operations, but the operations are not necessarily performed in the order shown. Operations may be combined, divided, added, replaced, changed order, and/or eliminated as appropriate, in accordance with the spirit and scope of disclosed embodiments. In some embodiments, one or more of the operations of method 300A is not performed.

In some embodiments, methods 200, 300A and 300B are performed by a processing device (e.g., processor 1402 (FIG. 14)) configured to execute instructions for generating one or more of layout designs.

Embodiments of the present disclosure use the term "layout pattern" which is hereinafter also referred to as "patterns" in the remainder of the present disclosure for brevity.

In operation 302 of method 300A, a dummy gate isolation pattern that continuously extends between a first power rail pattern and a second power rail pattern of a first layout design is identified. In some embodiments, operation 302 is performed by system 1400 (FIG. 14).

In some embodiments, the dummy gate isolation pattern of method 300A includes at least one of dummy gate isolation layout pattern 504a, 504a2, 504b, 504c, 504d, 504e, 504f, 704a1, 804a, 804a2, 904a or 904a2 (FIG. 5A-5D, 7A-7B, 8A-8B or 9A-9B). In some embodiments, the dummy gate isolation layout pattern of at least method 300A includes at least one or more CPODE patterns.

In some embodiments, the first power rail pattern of method 300A includes at least one of power rail pattern 522a, 522b or 522c. In some embodiments, the second power rail pattern of method 300A includes at least one of power rail pattern 522a, 522b or 522c.

In operation 304 of method 300A, a first portion of the dummy gate isolation pattern is replaced with a floating gate pattern in response to determining that the first layout design includes at least the dummy gate isolation pattern, and the dummy gate isolation pattern satisfies at least one replacement criterion.

In some embodiments, the first portion of the dummy gate isolation pattern of method 300A includes at least one of dummy gate isolation pattern 504a1, dummy gate isolation pattern 804a1 or dummy gate isolation pattern 904a1.

In some embodiments, the floating gate pattern of method 300A includes at least one of floating gate pattern 505a1, floating gate pattern 805a1 or floating gate pattern 905a1.

In some embodiments, the at least one replacement criterion of method 300A includes at least replacement criterion 1 or replacement criterion 2.

In some embodiments, replacement criterion 1 includes at least determining if two or more CPODE patterns (e.g., dummy gate isolation patterns 504a and 504b) are adjacent to each other (FIGS. 5A-5D). In some embodiments, replacement criterion 2 includes at least determining if at least a single CPODE pattern (e.g., dummy gate isolation patterns 804a and 904a) is between and adjacent to two conductive feature patterns (e.g., conductive feature patterns 506a and 507a in FIGS. 8A-8B or conductive feature patterns 906a and 907a in FIGS. 9A-9B) configured to carry a same signal (FIG. 9A-9B) or a same power (FIG. 8A-8B).

In some embodiments, if the at least one replacement criterion of method 300A are not satisfied in operation 304, then method 300A remains idle or ends.

In some embodiments, operation 304 includes at least one of operation 306 or 308.

In operation 306 of method 300A, the first portion of the dummy gate isolation pattern is removed. In some embodiments, operation 306 comprises removing the first portion of the dummy gate isolation pattern thereby leaving the remaining portion (e.g., dummy gate isolation pattern 504a2, 804a2 or 904a2) of the dummy gate isolation pattern (e.g., gate isolation pattern 504, 804 or 904).

In operation 308 of method 300A, a floating gate pattern is inserted where the first portion of the dummy gate isolation pattern was located.

In operation 310 of method 300A, a cut feature pattern is inserted between the floating gate pattern and the remaining portion of the dummy gate isolation pattern. In some embodiments, the cut feature pattern is inserted on a POLY (PO) level of the first layout design or the revised first layout design.

In some embodiments, the cut feature pattern of method 300A includes one or more cut feature layout patterns 530a, 530b, 530c, 530d, 530e, 705a, 805a, 905a.

In some embodiments, if a cut feature pattern is already between the floating gate pattern and the remaining dummy gate isolation pattern prior to operation 310, then operation 310 is not performed.

In operation 312 of method 300A, a first via pattern is inserted over the second power rail pattern. In some embodiments, operation 312 includes inserting a first via pattern adjacent to the floating gate pattern and on the second power rail. In some embodiments, operation 312 includes inserting a first via pattern on each side of the floating gate pattern.

In some embodiments, the first via pattern of method 300A includes at least via pattern 515a. In some embodiments, operation 312 of method 300A includes inserting via pattern 515a over the power rail pattern 522c.

In operation 314 of method 300A, at least a first conductive feature pattern is inserted adjacent to the floating gate pattern. In some embodiments, the first conductive feature pattern of method 300A includes conductive feature pattern 507a. In some embodiments, the first conductive feature pattern is inserted to overlap the second power rail pattern and the first via pattern. In some embodiments, operation 314 includes inserting a first conductive feature pattern on each side of the floating gate pattern.

In some embodiments, operations 312 and 314 are not performed if the dummy gate isolation pattern does not satisfy replacement criterion 1, but satisfies replacement criterion 2.

In some embodiments, operations 312 and 314 are performed if the dummy gate isolation pattern satisfies replacement criterion 1, regardless of the dummy gate isolation pattern satisfying replacement criterion 2.

In some embodiments, by utilizing method 300A of the present disclosure, one or more dummy gate isolation patterns can be replaced with a floating gate dummy pattern thereby resulting in a layout design usable to manufacture a corresponding integrated circuit that has improved speed compared to other approaches.

FIG. 3B is a flowchart of a method 300B of generating a layout design of an integrated circuit, in accordance with some embodiments.

It is understood that additional operations may be performed before, during, and/or after the method 300B depicted in FIG. 3B, and that some other processes may only be briefly described herein.

In some embodiments, method 300B is an embodiment of operations 204 and 206 of method 200. In some embodiments, method 300B is a method of determining whether a first layout design or a revised first layout design includes a dummy transistor that satisfies at least one replacement criterion, and revising the first layout design based on the one or more replacement criterion.

In some embodiments, operation 320 is an embodiment of operation 204 of method 200. In some embodiments, one or more of operations 322, 324, 326 or 328 is an embodiment of operation 206 of method 200.

In some embodiments, method 300B is usable to generate one or more layout patterns of at least layout design 1000B or 1100B (FIG. 10B or 11B), or one or more features similar to at least integrated circuit 600 (FIGS. 6A-6E).

In some embodiments, method 300B is usable to generate one or more layout patterns having structural relationships including alignment, lengths and widths, as well as configurations and layers of at least layout design 1000B or 1100B (FIG. 10B or 11B), or one or more features similar to at least integrated circuit 600, and similar detailed description will not be described in FIG. 3B, for brevity.

In some embodiments, other order of operations of method 300B is within the scope of the present disclosure. Method 300B includes exemplary operations, but the operations are not necessarily performed in the order shown. Operations may be combined, divided, added, replaced, changed order, and/or eliminated as appropriate, in accordance with the spirit and scope of disclosed embodiments. In some embodiments, one or more of the operations of method 300B is not performed.

In operation 320 of method 300B, a first gate pattern of a dummy transistor in a first layout design or a revised first layout design is identified.

In some embodiments, the first gate pattern of at least method 300B includes at least one of gate pattern 1004b, gate pattern 1104a, gate pattern 1104b or gate pattern 1104c.

In some embodiments, the dummy transistor of at least method 300B includes at least one of dummy transistor 600F, 1040a, 1140a, 1140b or 1140c.

In some embodiments, operation 320 is performed by system 1400 (FIG. 14).

In operation 322 of method 300B, the first gate pattern is changed to a floating gate pattern in response to determining that the first layout design includes at least the first gate pattern, and the first gate pattern satisfies at least one replacement criterion.

In some embodiments, the floating gate pattern of at least method 300B includes at least one of floating gate pattern 1005b, floating gate pattern 1105a or floating gate pattern 1105c.

In some embodiments, the at least one replacement criterion of method 300B includes at least replacement criterion 3.

In some embodiments, replacement criterion 3 includes at least determining if at least a gate (e.g., gate layout pattern 1004b) of the dummy transistor 1040a is electrically coupled to at least a conductor (e.g., 1020a). In some embodiments, the replacement criterion 3 further includes determining that the gate (e.g., gate layout pattern 1004b) of the dummy transistor 1040a is configured to receive a signal or power from at least the conductor (e.g., 1020a)

In some embodiments, replacement criterion 3 includes at least determining if at least a gate (e.g., gate layout pattern 1104a, 1104b, 1104c) of the corresponding dummy transistor 1140a, 1140b, 1140c is electrically coupled to at least a conductor (e.g., 1120a). In some embodiments, the replacement criterion 3 further includes determining that the gate (e.g., gate layout pattern 1104a, 1104b, 1104c) of the dummy transistor 1140a, 1140b, 1140c is configured to receive a signal or power from at least the conductor (e.g., 1120a).

In some embodiments, if replacement criteria 3 of method 300B is not satisfied in operation 322, then method 300B remains idle or ends.

In some embodiments, operation 322 includes at least operation 324.

In operation 324 of method 300B, at least one via pattern positioned between a first conductive feature pattern and the first gate pattern is removed.

In some embodiments, the at least one via pattern of method 300B includes at least one of via pattern 1010b, 1110a, 1110b or 1110c.

In some embodiments, the first conductive feature pattern of at least method 300B includes at least one of conductive feature pattern 1020a or 1120a.

In operation 326 of method 300B, dividing the first conductive feature pattern into a plurality of conductive feature patterns, configuring at least one conductive feature pattern of the plurality of conductive feature patterns as a different routing resource in the first layout design or the revised first layout design. In some embodiments, the plurality of conductive feature patterns of at least method 300B includes at least one of conductive feature pattern 1021a or 1021b.

In some embodiments, operation 326 comprises changing a length of the first conductive feature pattern, and adding at least a second conductive feature pattern to the first layout design or the revised first layout design. In some embodiments, the second conductive feature pattern of at least method 300B includes at least conductive feature pattern 1021b. In some embodiments, the length of the first conductive feature pattern is in the first direction X. In some embodiments, the second conductive feature pattern of at least method 300B is added to the first layout design or the revised first layout design in a same metal routing track as the first conductive feature pattern or the previous location of the shortened first conductive feature pattern.

In some embodiments, operation 326 of method 300B further includes configuring at least one of the second conductive feature pattern or the shortened first conductive feature pattern as a different routing resource in the first layout design or the revised first layout design.

In some embodiments, operation 326 is not performed. For example, in some embodiments, operation 326 is not performed when operation 328 is performed.

In operation 328 of method 300B, the first conductive feature pattern (e.g., conductive feature pattern 1120a) is configured as a different routing resource in the first layout design or the revised first layout design.

In some embodiments, operation 328 is not performed. For example, in some embodiments, operation 328 is not performed when operation 326 is performed.

In some embodiments, by utilizing method 300B of the present disclosure, one or more via patterns can be removed from the layout design thereby resulting in a layout design having more routing resources and occupying less area than other approaches.

In some embodiments, the layout design of the present disclosure is usable to manufacture a corresponding integrated circuit with more routing resources than other approaches resulting in an integrated circuit with reduced metal coupling compared to other approaches.

Figure 4:
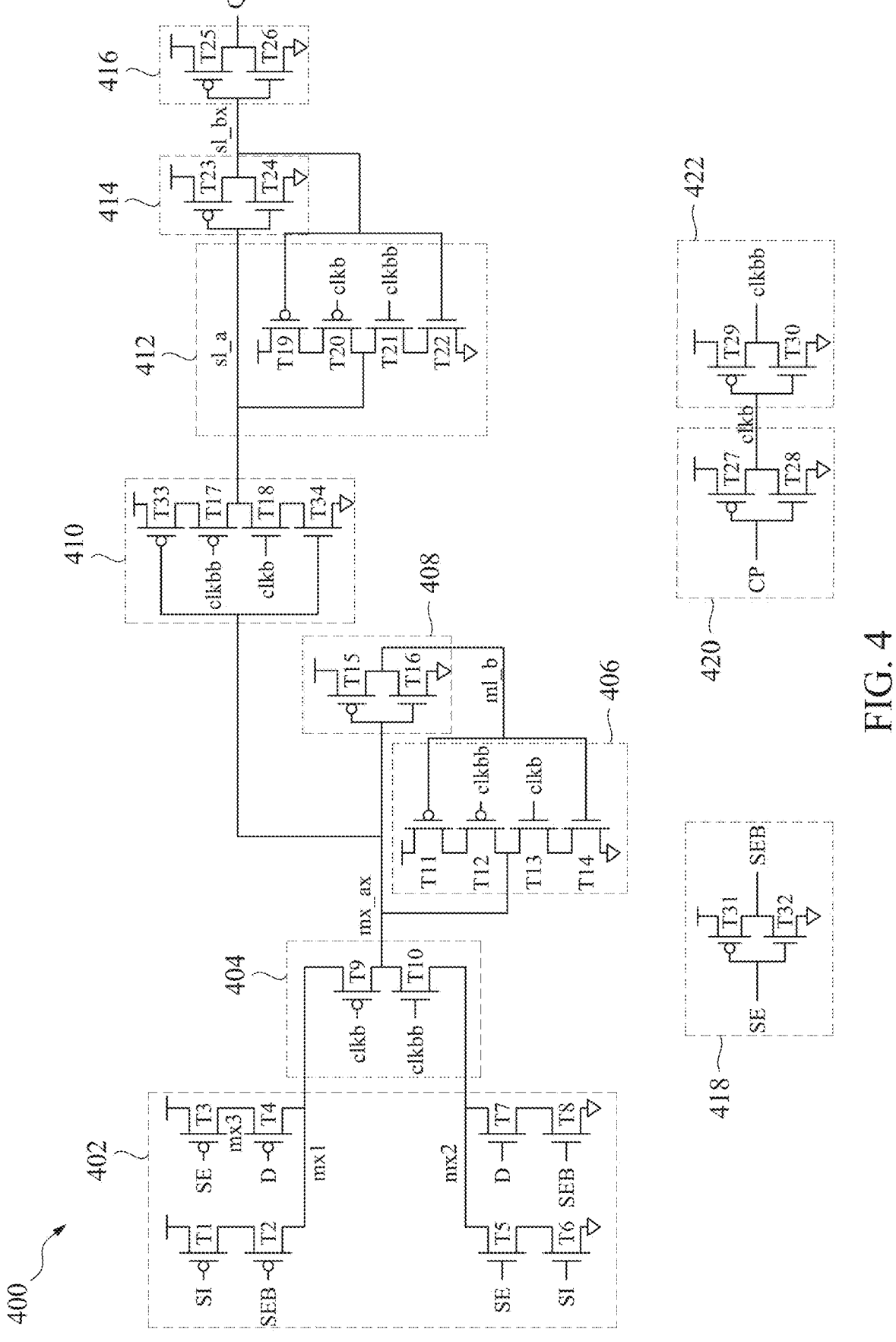
FIG. 4 is a circuit diagram of an integrated circuit, in accordance with some embodiments.

FIG. 4 is a circuit diagram of an integrated circuit 400, in accordance with some embodiments.

In some embodiments, integrated circuit 400 is a flip-flop circuit. In some embodiments, integrated circuit 400 is a multi-bit flip-flop (MBFF) circuit.

Integrated circuit 400 is a flip-flop circuit. Integrated circuit 400 is configured to receive at least a data signal D or a scan in signal SI, and is configured to output an output signal Q. In some embodiments, the data signal D is a data input signal. In some embodiments, the scan in signal SI is a scan input signal. In some embodiments, the output signal Q is a stored state of at least the data signal D or the scan in signal SI. A flip-flop circuit is used for illustration, other types of circuits are within the scope of the present disclosure.

Integrated circuit 400 includes transistors T1-T34. In some embodiments, each of transistors T1, T2, T3, T4, T9, T11, T12, T15, T17, T19, T20, T23, T25, T27, T29, T31 and T33 is a p-type metal oxide semiconductor (PMOS) transistor. In some embodiments, each of transistors T5, T6, T7, T8, T10, T13, T14, T16, T18, T21, T22, T24, T26, T28, T30, T32 and T34 is an n-type metal oxide semiconductor (NMOS) transistor.

A gate terminal of transistor T1 is configured to receive scan in signal SI. A gate terminal of transistor T6 is configured to receive scan in signal SI. In some embodiments, the gate terminal of transistor T1 is coupled to the gate terminal of transistor T6. A source terminal of transistor T1 is coupled to the voltage supply VDD. A drain terminal of transistor T1 is coupled to a source terminal of transistor T2.

A gate terminal of transistor T2 is configured to receive inverted scan enable signal SEB.

Each of a drain terminal of transistor T2, a drain terminal of transistor T4 and a source terminal of transistor T9, are coupled together. Signal mx1 is the signal of at least the source terminal of transistor T9, the drain terminal of transistor T2 or the drain terminal of transistor T4.

A gate terminal of transistor T3 is configured to receive scan enable signal SE. A source terminal of transistor T3 is coupled to the voltage supply VDD. A drain terminal of transistor T3 is coupled to a source terminal of transistor T4.

A gate terminal of transistor T4 is configured to receive data signal D. A gate terminal of transistor T7 is configured to receive data signal D. In some embodiments, the gate terminal of transistor T4 is coupled to the gate terminal of transistor T7.

A source terminal of transistor T6 is coupled to the reference voltage supply VSS. A drain terminal of transistor T6 is coupled to a source terminal of transistor T5. A gate terminal of transistor T5 is configured to receive scan enable signal SE. In some embodiments, the gate terminal of transistor T5 is coupled to the gate terminal of transistor T3.

A source terminal of transistor T8 is coupled to the reference voltage supply VSS. A drain terminal of transistor T8 is coupled to a source terminal of transistor T7. A gate terminal of transistor T8 is configured to receive inverted scan enable signal SEB. In some embodiments, the gate terminal of transistor T8 is coupled to the gate terminal of transistor T2.

Each of a drain terminal of transistor T5, a drain terminal of transistor T7 and a source terminal of transistor T10 are coupled together. Signal mx2 is the signal of at least the source terminal of transistor T10, the drain terminal of transistor T5 or the drain terminal of transistor T7.

Each of transistors T1-T8 are part of a region 402 of integrated circuit 400. In some embodiments, region 402 is a multiplexer.

Each of a source terminal of transistor T9, a drain terminal of transistor T2 and a drain terminal of transistor T4 are coupled together. Signal mx1 is the signal of at least the source terminal of transistor T9, the drain terminal of transistor T2 or the drain terminal of transistor T4.

Each of a source terminal of transistor T10, a drain terminal of transistor T5 and a drain terminal of transistor T7 are coupled together. Signal mx2 is the signal of at least the source terminal of transistor T10, the drain terminal of transistor T5 or the drain terminal of transistor T7.

A gate terminal of transistor T9 is configured to receive clock signal clkb. A gate terminal of transistor T10 is configured to receive clock signal clkbb. In some embodiments, clock signal clkbb is inverted from clock signal clkb, and vice versa. In some embodiments, clock signal clkb is inverted from clock signal CP, and vice versa.

Each of the drain terminal of transistor T9, the drain terminal of transistor T10, a drain terminal of transistor T13, a drain terminal of transistor T12, a gate terminal of transistor T15, a gate terminal of transistor T16, a gate terminal of transistor T33 and a gate terminal of transistor T34 are coupled together. Signal mx_ax is the signal of at least the drain terminal of transistor T9, the drain terminal of transistor T10, the drain terminal of transistor T13, the drain terminal of transistor T12, the gate terminal of transistor T15, the gate terminal of transistor T16, the gate terminal of transistor T33 and the gate terminal of transistor T34.

A gate terminal of transistor T11 and a gate terminal of transistor T14 are coupled together, and are further coupled to a drain terminal of transistor T15 and a drain terminal of transistor T16.

A source terminal of transistor T11 is coupled to the voltage supply VDD. A drain terminal of transistor T11 is coupled to a source terminal of transistor T12.

A gate terminal of transistor T12 is configured to receive clock signal clkbb. In some embodiments, the gate terminal of transistor T12 is coupled to at least an output terminal of an inverter (e.g., region 422).

A gate terminal of transistor T13 is configured to receive clock signal clkb. In some embodiments, the gate terminal of transistor T13 is coupled to at least an output terminal of an inverter (e.g., region 420).

A source terminal of transistor T13 is coupled to a drain terminal of transistor T14. A source terminal of transistor T14 is coupled to the reference voltage supply VSS.

Each of transistors T9-T10 are part of a region 404 of integrated circuit 400. Each of transistors T11-T14 are part of a region 406 of integrated circuit 400. In some embodiments, regions 404 and 406 are a latch.

Transistors T15 and T16 are configured as an inverter (e.g., region 408) configured to receive signal mx_ax, and to generate signal ml_b. The gate terminals of transistors T15 and T16 are configured to receive signal mx_ax. A source terminal of transistor T15 is coupled to the voltage supply VDD. A source terminal of transistor T16 is coupled to the reference voltage supply VSS.

Each of transistors T15-T16 are part of a region 408 of integrated circuit 400. In some embodiments, region 408 is an inverter.

The gate terminal of transistor T33 and the gate terminal of transistor T34 are configured to receive signal mx_ax from the drain terminals of transistors T9 and T10 or the drain terminals of transistors T12 and T13.

A source terminal of transistor T33 is coupled to the voltage supply VDD. A drain terminal of transistor T33 is coupled to a source terminal of transistor T17.

A gate terminal of transistor T17 is configured to receive clock signal clkbb. In some embodiments, the gate terminal of transistor T17 is coupled to at least an output terminal of an inverter (e.g., region 422).

Each of a drain terminal of transistor T17, a drain terminal of transistor T18, a gate terminal of transistor T23, a gate terminal of transistor T24, a drain terminal of transistor T20 and a drain terminal of transistor T21 are coupled together. Signal sl_a is the signal of at least the drain terminal of transistor T17, the drain terminal of transistor T18, the gate terminal of transistor T23, the gate terminal of transistor T24, the drain terminal of transistor T20 or the drain terminal of transistor T21.

A gate terminal of transistor T18 is configured to receive clock signal clkb. In some embodiments, the gate terminal of transistor T18 is coupled to at least an output terminal of an inverter (e.g., region 420).

A source terminal of transistor T18 is coupled to a drain terminal of transistor T34. A source terminal of transistor T34 is coupled to the reference voltage supply VSS.

Each of transistors T17-T18 and T33-T34 is part of a region 410 of integrated circuit 400.

Each of a gate terminal of transistor T19, a gate terminal of transistor T22, a drain terminal of transistor T23, a drain terminal of transistor T24, a gate terminal of transistor T25 and a gate terminal of transistor T26 are coupled together. The gate terminal of transistor T19 and the gate terminal of transistor T22 are configured to receive signal sl_bx from the drain terminal of transistor T23 and the drain terminal of transistor T24.

A source terminal of transistor T19 is coupled to the voltage supply VDD. A drain terminal of transistor T19 is coupled to a source terminal of transistor T20.

A gate terminal of transistor T20 is configured to receive clock signal clkb. In some embodiments, the gate terminal of transistor T20 is coupled to at least an output terminal of an inverter (e.g., region 420).

A gate terminal of transistor T21 is configured to receive clock signal clkbb. In some embodiments, the gate terminal of transistor T21 is coupled to at least an output terminal of an inverter (e.g., region 422).

A source terminal of transistor T21 is coupled to a drain terminal of transistor T22. A source terminal of transistor T22 is coupled to the reference voltage supply VSS.

Each of transistors T19-T22 is part of a region 412 of integrated circuit 400. In some embodiments, regions 408, 410 and 412 are a latch.

Transistors T23 and T24 are configured as an inverter (e.g., region 414) configured to receive signal sl_a, and to generate signal sl_bx. The gate terminals of transistors T23 and T24 are configured to receive signal sl_a. A source terminal of transistor T23 is coupled to the voltage supply VDD. A source terminal of transistor T24 is coupled to the reference voltage supply VSS. The drain terminals of transistors T23 and T24 are configured to output the signal sl_bx.

Each of transistors T23-T24 are part of a region 414 of integrated circuit 400. In some embodiments, region 414 is an inverter.

Transistors T25 and T26 are configured as an inverter (e.g., region 416) configured to receive signal sl_bx, and to generate signal Q. The gate terminals of transistors T25 and T26 are coupled together, and configured to receive signal sl_bx. A source terminal of transistor T25 is coupled to the voltage supply VDD. A source terminal of transistor T26 is coupled to the reference voltage supply VSS. The drain terminals of transistors T25 and T26 are coupled together, and configured to output the signal Q.

Each of transistors T25-T26 are part of a region 416 of integrated circuit 400. In some embodiments, region 416 is an inverter. In some embodiments, regions 414 and 416 is an output circuit of integrated circuit 400.

A gate terminal of transistor T31 and a gate terminal of transistor T32 are configured to receive scan enable signal SE. The gate terminals of transistor T31 and transistor T32 are coupled together. A source terminal of transistor T31 is coupled to the voltage supply VDD. A drain terminal of transistor T31 and a drain terminal of transistor T32 are coupled together, and are configured to output inverted scan enable signal SEB. A source terminal of transistor T32 is coupled to the reference voltage supply VSS.

Each of transistors T31-T32 are part of a region 418 of integrated circuit 400. In some embodiments, region 418 is an inverter.

A gate terminal of transistor T27 and a gate terminal of transistor T28 are configured to receive clock signal CP. The gate terminals of transistor T27 and transistor T28 are coupled together. A source terminal of transistor T27 is coupled to the voltage supply VDD. A drain terminal of transistor T27 and a drain terminal of transistor T28 are coupled together, and are configured to output inverted clock signal clkb. A source terminal of transistor T28 is coupled to the reference voltage supply VSS.

Each of transistors T27-T28 are part of a region 420 of integrated circuit 400. In some embodiments, region 420 is an inverter.

Each of the drain terminal of transistor T27, the drain terminal of transistor T28, a gate terminal of transistor T29 and a gate terminal of transistor T30 are coupled together. The gate terminal of transistor T29 and the gate terminal of transistor T30 are configured to receive clock signal clkb. A source terminal of transistor T29 is coupled to the voltage supply VDD. A drain terminal of transistor T29 and a drain terminal of transistor T30 are coupled together, and are configured to output inverted clock signal clkbb. A source terminal of transistor T30 is coupled to the reference voltage supply VSS.

Each of transistors T29-T30 are part of a region 422 of integrated circuit 400. In some embodiments, region 422 is an inverter.

In some embodiments, one or more NMOS transistors are changed to one or more PMOS transistors, and vice versa. In some embodiments, one or more of the drains or sources are flipped with the other.

Other configurations, arrangements or other circuits in integrated circuit 400 are within the scope of the present disclosure.

FIGS. 5A-5D are diagrams of a corresponding layout design 500A-500D of an integrated circuit, in accordance with some embodiments.

Figure 5A:
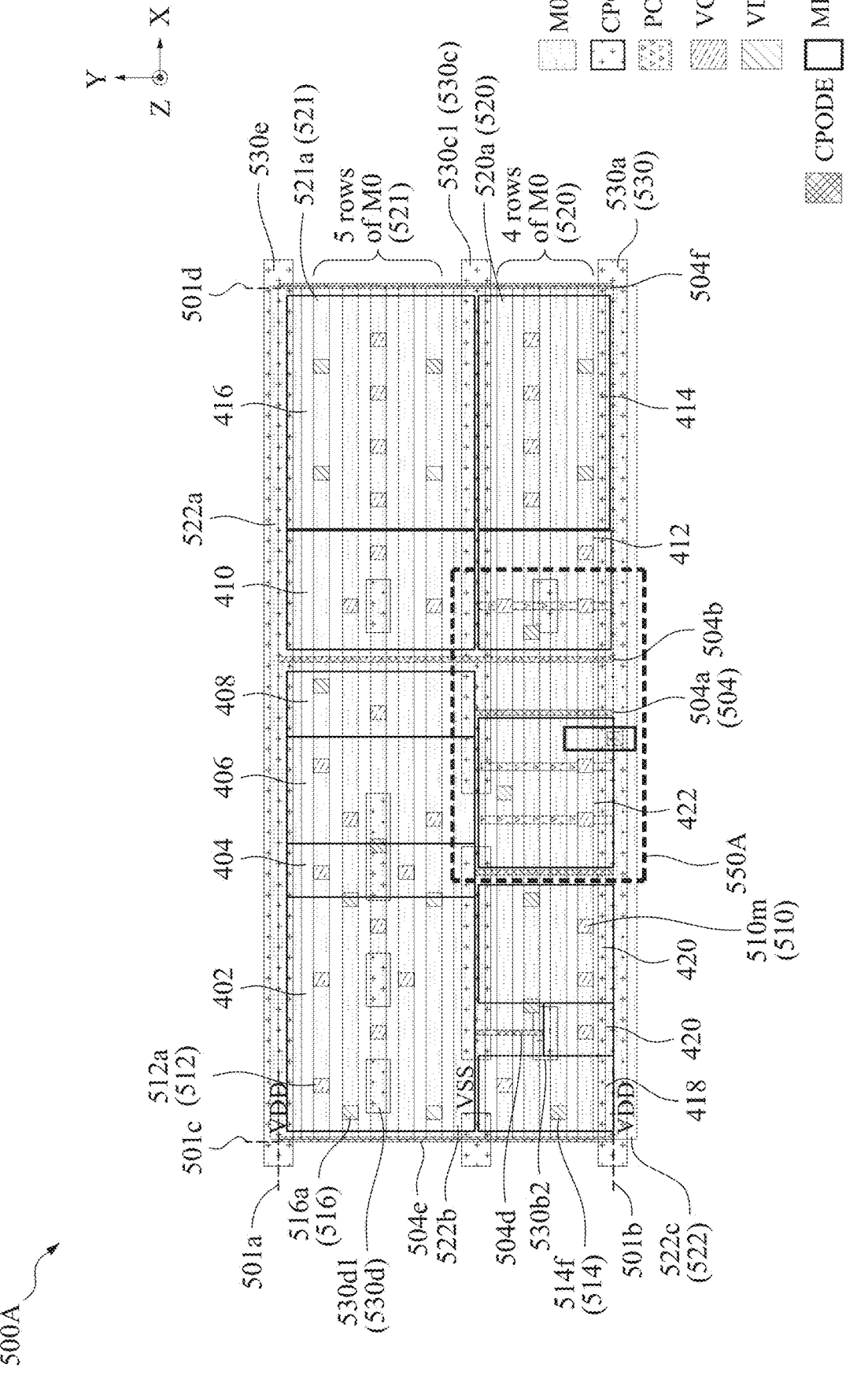
FIGS. 5A-5D are diagrams of a corresponding layout design of an integrated circuit, in accordance with some embodiments.

Layout designs 500A and 500C are divided into the circuit regions of FIG. 4, simplified for ease of illustration. For example, regions 402, 404, 406, 408, 410, 412, 414, 416, 418, 420 and 422 shown in FIG. 4 are also shown in FIGS. 5A and 5C, and identify corresponding circuit region locations. In some embodiments, each region 402, 404, 406, 408, 410, 412, 414, 416, 418, 420 and 422 is referred to as a corresponding cell of layout design 500A-500D. In some embodiments, a cell defines a region in layout designs 500A-500D that includes a different circuit. In some embodiments, each cell is defined in the first direction X by at least one of the end portions of gate patterns (e.g., a set of gate patterns 540) or a set of poly cut feature patterns 530. In some embodiments, each cell is defined in the second direction Y by a set of dummy gate isolation patterns 504.

Layout design 500A and layout design 500C are corresponding layout diagrams of integrated circuit 400 of FIG. 4.

FIG. 5A is a diagram of a layout design 500A, in accordance with some embodiments. In some embodiments, layout designs 500A-500B correspond to the first layout design after operation 202 in method 200 (FIG. 2).

Figure 5B:
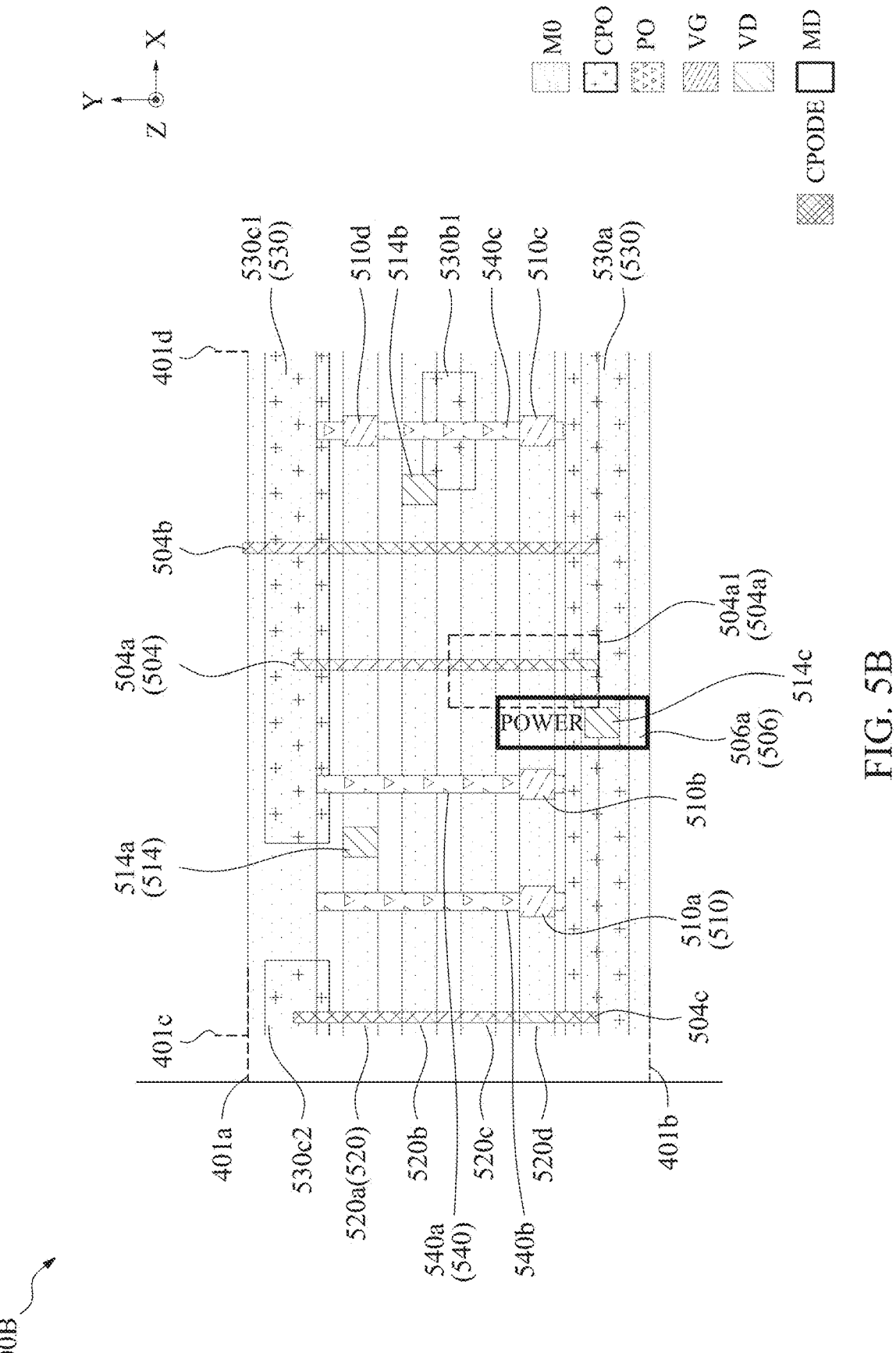
Figure 5C:
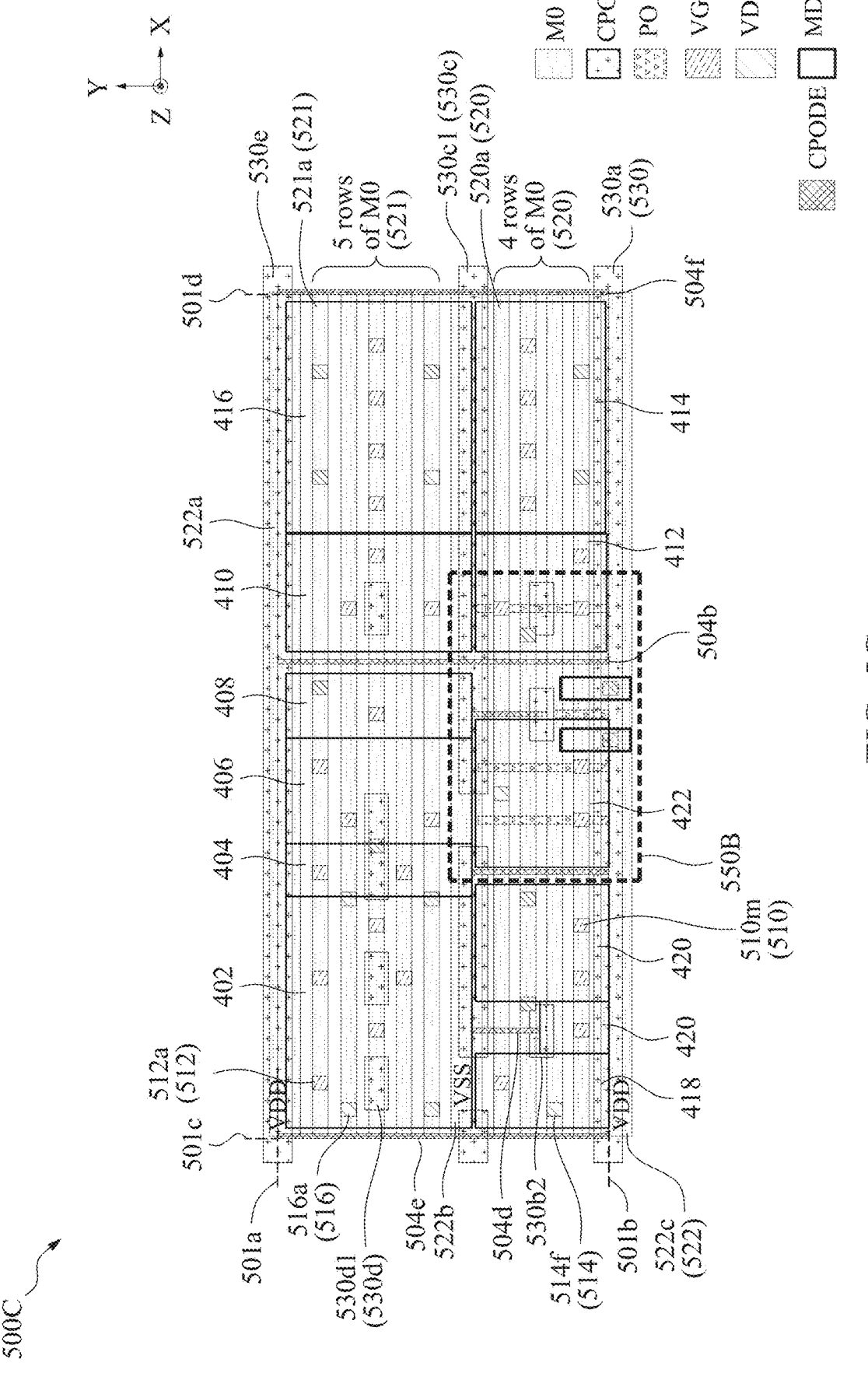

FIG. 5B is a diagram of a layout design 500B, in accordance with some embodiments. In some embodiments, layout design 500B includes a portion 550A of layout design 500A of FIG. 5A simplified for ease of illustration.

FIG. 5C is a diagram of a layout design 500C, in accordance with some embodiments. Layout design 500C is a layout diagram of an integrated circuit 600 of FIGS. 6A-6E.

In some embodiments, layout designs 500C-500D correspond to the revised first layout design after operation 206 in method 200 (FIG. 2).

Figure 5D:
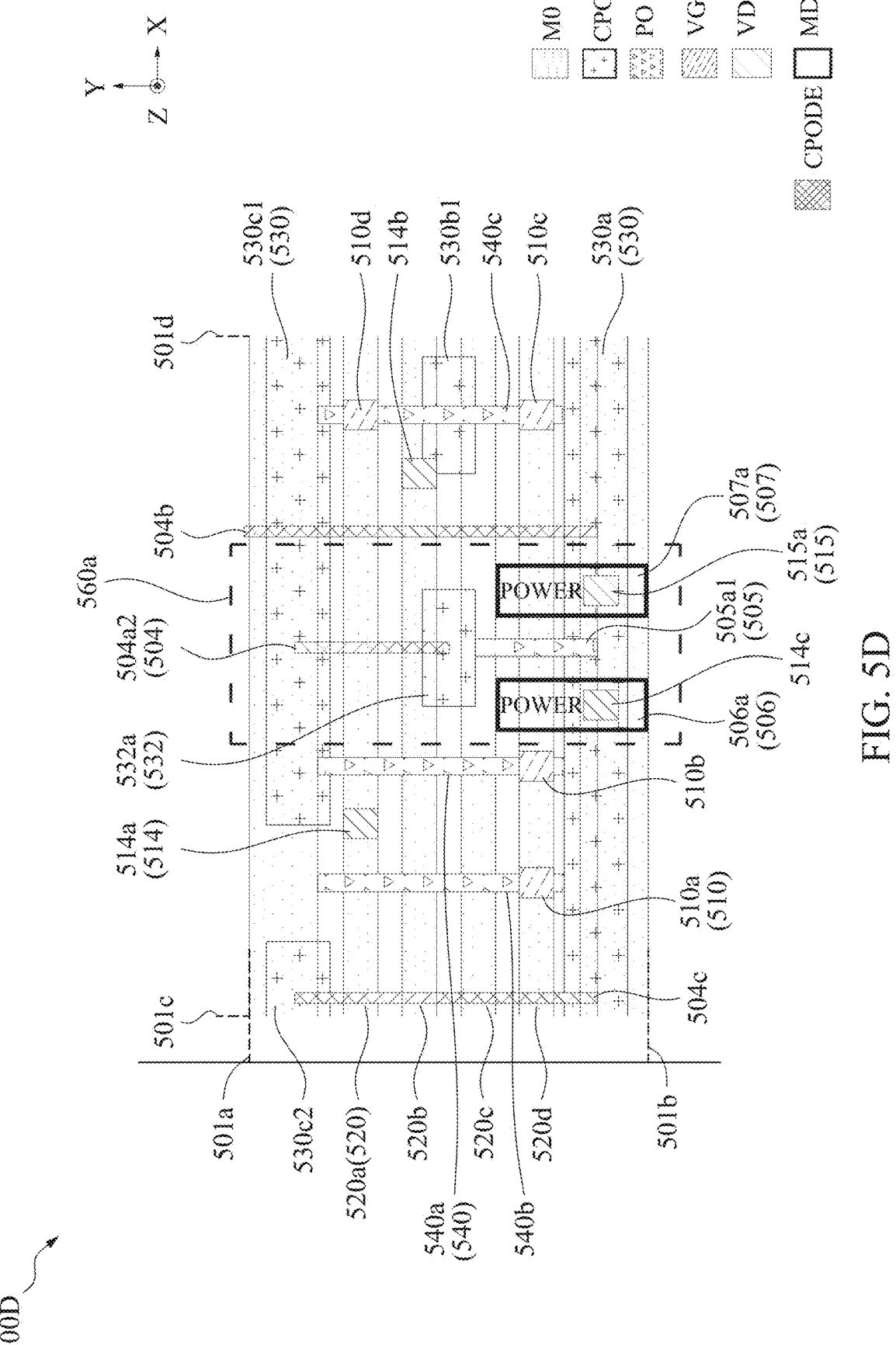

FIG. 5D is a diagram of a layout design 500D, in accordance with some embodiments. In some embodiments, layout design 500D includes a portion 550B of layout design 500C of FIG. 5C simplified for ease of illustration.

Each of layout design 500A, 500B, 500C or 500D includes one or more features of a gate (POLY) level, a cut POLY (CPO) level, a metal over diffusion (MD) level, a via over gate (VG) level, a via over diffusion (VD) level and a metal 0 (M0) level of corresponding layout design 500A-500D.

For ease of illustration, some of the labeled elements of one or more of FIGS. 5A-5D, 6A-6E and 7A-11B are not labelled in one or more of FIGS. 5A-5D, 6A-6E and 7A-11B. In some embodiments, at least one of layout design 500A, 500B, 500C or 500D includes additional elements not shown in FIGS. 5A-5D. For ease of illustration, layout design 500A-500D does not show elements in an oxide diffusion (OD) level. For ease of illustration, layout design 500A-500D shows a limited number of elements in the POLY level and the MD level.

Layout design 500C is usable to manufacture integrated circuit 600 of FIGS. 6A-6E.

In some embodiments, layout designs 500A-500B correspond to the first layout design after operation 202 in method 200 (FIG. 2). In some embodiments, layout designs 500A-500B correspond to the first layout design prior to the execution of method 300A of FIG. 3A.

Layout design 500A includes a cell 501. The cell 501 has cell boundaries 501a and 501b that extend in a first direction X, and cell boundaries 501c and 501d that extend in a second direction Y. In some embodiments, the second direction Y is different from the first direction X. In some embodiments, layout design 500A abuts other cell layout designs along cell boundaries 501c and 501d. In some embodiments, layout design 500A abuts other cell layout designs along cell boundaries 501a and 501b that extend in the first direction X. In some embodiments, layout design 500A is a double height standard cell.

In some embodiments, cell 501 is a standard cell of integrated circuit 400, and layout design 500A corresponds to a layout of a standard cell defined by cell boundaries 501a, 501b, 501c and 501d. In some embodiments, a cell 501 is a predefined portion of layout design 500A including one or more transistors and electrical connections configured to perform one or more circuit functions. In some embodiments, cell 501 is bounded by cell boundaries 501a, 501b, 501c and 501d, and thus corresponds to a region of functional circuit components or devices that are part of a standard cell.

Layout design 500A includes one or more active region layout patterns (not shown in FIGS. 5A-5D for ease of illustration, but shown in FIGS. 10A-10B as active region layout patterns 502a or 502b (collectively referred to as a "set of active region patterns 502") extending in the first direction X.

Active region patterns 502a, 502b of the set of active region patterns 502 are separated from one another in the second direction Y. The set of active region patterns 502 is usable to manufacture a corresponding set of active regions 602 of integrated circuit 600 (FIGS. 6A-6E).

In some embodiments, the set of active regions 602 are located on a front-side (not labelled) of integrated circuit 600. In some embodiments, active region patterns 502a, 502b of the set of active region patterns 502 are usable to manufacture corresponding active regions 602a, 602b of the set of active regions 602 of integrated circuit 600.

In some embodiments, the set of active region patterns 502 is referred to as an oxide diffusion (OD) region which defines the source or drain diffusion regions of at least integrated circuit 600 or layout design 500A-500D, 700A-700B, 800A-800B, 900A-900B, 1000A-1000B or 1100A-1100B (FIG. 5A-5D, 7A-7B, 8A-8B, 9A-9B, 10A-10B or 11A-11B).

In some embodiments, active region pattern 502a of the set of active region patterns 502 is usable to manufacture source and drain regions of n-type metal oxide semiconductor (NMOS) transistors of integrated circuit 600, and active region pattern 502b of the set of active region patterns 502 is usable to manufacture source and drain regions of p-type metal oxide semiconductor (PMOS) transistors of integrated circuit 600.

In some embodiments, active region pattern 502a of the set of active region patterns 502 is usable to manufacture source and drain regions of PMOS transistors of integrated circuit 600, and active region pattern 502b of the set of active region patterns 502 is usable to manufacture source and drain regions of NMOS transistors of integrated circuit 600.

In some embodiments, the set of active region patterns 502 is located on a first layout level. In some embodiments, the first layout level corresponds to an active level or an OD level of one or more of layout designs 500A-500D, 700A-700B, 800A-800B, 900A-900B, 1000A-1000B or 1100A-1100B (FIG. 5A-5D, 7A-7B, 8A-8B, 9A-9B, 10A-10B or 11A-11B) or integrated circuit 600.

In some embodiments, active region pattern 502a is usable to manufacture source and drain regions of one or more n-type finFET transistors, n-type nanosheet transistors or n-type nanowire transistors, and active region layout pattern 502b is usable to manufacture source and drain regions of one or more p-type finFET transistors, p-type nanosheet transistors or p-type nanowire transistors.

In some embodiments, active region pattern 502a is usable to manufacture source and drain regions of one or more p-type finFET transistors, p-type nanosheet transistors or p-type nanowire transistors, and active region layout pattern 502b is usable to manufacture source and drain regions of one or more n-type finFET transistors, n-type nanosheet transistors or n-type nanowire transistors.

Other widths for the set of active region patterns 502 or other numbers of active region patterns in the set of active region patterns 502 are within the scope of the present disclosure.

Other configurations, arrangements on other layout levels or quantities of patterns in the set of active region patterns 502 are within the scope of the present disclosure.

Layout design 500A further includes one or more gate patterns (not shown in FIGS. 5A-5D for ease of illustration, but shown in FIGS. 10A-10B as gate layout patterns 1004a or 1004b (collectively referred to as a "set of gate patterns 1004") extending in the second direction Y. Each of the gate patterns of the set of gate patterns 1004 is separated from an adjacent gate pattern of the set of gate patterns 1004 in the first direction X by a first pitch (not labelled).

The set of gate patterns 1004 is usable to manufacture a corresponding set of gates of an integrated circuit, such as integrated circuit 600 (FIGS. 6A-6E). In some embodiments, gate patterns 1004a or 1004b of the set of gate patterns 1004 is usable to manufacture corresponding gates of the set of gates.

In some embodiments, at least a portion of gate pattern 1004a or 1004b of the set of gate patterns 1004 is usable to manufacture gates of NMOS transistors of an integrated circuit, such as integrated circuit 600, and at least another portion of gate pattern 1004a or 1004b of the set of gate patterns 1004 is usable to manufacture gates of PMOS transistors of an integrated circuit, such as integrated circuit 600.

The set of gate patterns 1004 is above the set of active region patterns 502. The set of gate patterns 1004 is positioned on a second layout level different from the first layout level. In some embodiments, the second layout level is different from the first layout level. In some embodiments, the second layout level corresponds to the POLY level of one or more of layout designs 500A-500D, 700A-700B, 800A-800B, 900A-900B, 1000A-1000B or 1100A-1100B (FIG. 5A-5D, 7A-7B, 8A-8B, 9A-9B, 10A-10B or 11A-11B) or integrated circuit 600.

In some embodiments, the POLY level is above the OD level.

Other configurations, arrangements on other layout levels or quantities of patterns in the set of gate patterns 1004 are within the scope of the present disclosure.

Layout design 500A further includes one or more dummy gate isolation patterns 504a, 504b, 504c, 504d, 504e or 504f (collectively referred to as a "set of dummy gate isolation patterns 504") extending in the second direction Y. Each of the dummy gate isolation patterns of the set of dummy gate isolation patterns 504 is separated from an adjacent dummy gate isolation pattern of the set of dummy gate isolation patterns 504 in at least the first direction X.

In some embodiments, the set of dummy gate isolation patterns 504 is also referred to as "a set of CPODE patterns." In some embodiments, a CPODE pattern is used to form a trench in integrated circuit 600 by removing a dummy material and a portion of a semiconductor body and even a portion of an insulating feature under the dummy material. In at least one example, the term "oxide definition" defines an active region located adjacent to insulating features as shown in FIG. 6D. A dielectric structure is formed by filling the trench with a dielectric material. In some embodiments, an extra mask is not used for the CPODE pattern. In some embodiments, the dielectric structure is formed simultaneously with forming other CPODE structures in other portions of the device. Forming the dielectric structure simultaneously with forming other CPODE structures helps to avoid a need for additional masks and reduces production costs.

In some embodiments, each dummy gate isolation pattern of the set of dummy gate isolation patterns 504 separates a first cell (or a first region) from a second cell (or a second region) in layout design 500A-500D, 700A-700B, 800A-800B, 900A-900B, 1000A-1000B or 1100A-1100B. For example, as shown in FIGS. 5A-5D, region 420 is separated from region 422 by dummy gate isolation pattern 504c. Similarly, region 422 is separated from region 412 by dummy gate isolation patterns 504a and 504b. Region 408 is separated from region 410 by dummy gate isolation pattern 504b. Furthermore, layout design 500A and 500C are separated from adjacent cells along corresponding cell boundary 501c or 501d by corresponding dummy gate isolation pattern 504e and 504f.

In some embodiments, e.g., the embodiments depicted in FIGS. 5A-11B, a given region or cell of layout design 500A-500D, 700A-700B, 800A-800B, 900A-900B, 1000A-1000B or 1100A-1100B have cell boundaries that are overlapped by corresponding dummy gate isolation patterns of the set of dummy gate isolation patterns 504. For example, in some embodiments, cell boundaries 501*c* and 501*d* of cell 501 are identified by corresponding dummy gate isolation patterns 504*e* and 504*f*.

In some embodiments, each dummy gate isolation pattern of the set of dummy gate isolation patterns 504 separates a first portion of the first active region pattern from a second portion of the active region pattern in layout design 500A.

The set of dummy gate isolation patterns 504 is usable to manufacture a corresponding set of gate structures 604 of integrated circuit 600 (FIGS. 6A-6E).

In some embodiments, dummy gate isolation patterns 504*a*, 504*b*, 504*c*, 504*d*, 504*e* or 504*f* of the set of dummy gate isolation patterns 504 is usable to manufacture corresponding gate structures 604*a*, 604*b*, 604*c*, 604*d*, 604*e* or 604*f* of the set of gates 604 of integrated circuit 600 (FIGS. 6A-6E).

The set of dummy gate isolation patterns 504 is positioned on the second layout level.

Other configurations, arrangements on other layout levels or quantities of patterns in the set of dummy gate isolation patterns 504 are within the scope of the present disclosure.

Layout design 500A further includes a set of gate patterns 540. The set of gate patterns 540 include one or more of gate patterns 540*a*, 540*b* or 540*c*. For ease of illustration, the set of gate patterns 540 are shown in region 550A in FIG. 5B, but the set of gate patterns 540 are also included in the remaining regions (e.g., not including region 650A) of layout design 500.

In some embodiments, gate pattern 540*a*, 540*b* or 540*c* of the set of gate patterns 540 is usable to manufacture corresponding gate structures 640*a*, 640*b* or 640*c* of the set of gates 640 of integrated circuit 600.

In some embodiments, the set of gate patterns 540 is similar to the set of gate patterns 1004 or 505 (described below), and similar detailed description is omitted for brevity.

In some embodiments, at least gate pattern 540*a*, 540*b* or 540*c* corresponds to a gate pattern of a functional transistor.

In some embodiments, at least a first portion of gate pattern 540*a*, 540*b* or 540*c* corresponds to regions of NMOS transistors of layout design 500, and at least a second portion of gate pattern 540*a*, 540*b* or 540*c* corresponds to regions of PMOS transistors of layout design 500A.

Other configurations, arrangements on other layout levels or quantities of gate patterns in the set of gate patterns 540 are within the scope of the present disclosure.

Layout design 500A further includes at least a poly cut feature pattern 530*a*, 530*b*, 530*c*, 530*d* or 530*e* (collectively referred to as a "set of poly cut feature patterns 530") extending in the first direction X.

The set of poly cut feature patterns 530 overlaps at least the set of gate patterns or the set of dummy gate isolation patterns 504. Poly cut feature pattern 530*a* overlaps the set of dummy gate isolation patterns 504 along cell boundary 501*b* of layout designs 500A-500D. Poly cut feature pattern 530*e* overlaps the set of dummy gate isolation patterns 504 along cell boundary 501*a* of layout designs 500A-500D.

Poly cut feature pattern 530*b* includes at least poly cut feature pattern 530*b*1 or 530*b*2.

Poly cut feature pattern 530*c* includes at least poly cut feature pattern 530*c*1, 530*c*2 or 530*c*3.

Poly cut feature pattern 530*d* includes at least poly cut feature pattern 530*d*1, 530*d*2, 530*d*3 or 530*d*4.

In some embodiments, each poly cut feature pattern of the set of poly cut feature patterns 530 is separated from another poly cut feature pattern of the set of poly cut feature patterns 530 in at least first direction X or the second direction Y.

In some embodiments, the set of poly cut feature patterns 530 extends continuously through the cell boundaries 501*a* or 501*b* of layout designs 500A-500D to other neighboring cells.

The set of poly cut feature patterns 530 has a gate pattern width (not labelled) in the second direction Y, and a gate pattern length (not labelled) in the first direction X. In some embodiments, poly cut feature pattern 532*a* is usable to identify a corresponding location of a removed portion 632*a* of corresponding gate structure 604*a*2 and 605*a*1 of integrated circuit 600 that is removed during operation 104 of method 100 (FIG. 1).

In some embodiments, the gate pattern width (not labelled) corresponds to the gate cut width (not labelled) of one or more of gate structures 604*a*, 604*b*, 604*c*, 604*d* and 604*e*. In some embodiments, the gate pattern length (not labelled) corresponds to the gate cut length (not labelled) of one or more of gate structures 604*a*, 604*b*, 604*c*, 604*d* and 604*e*. In some embodiments, at least one of the set of dummy gate isolation layout patterns 504, or the set of poly cut feature patterns 530 or 532 is located on the second layout level or the POLY level. Other configurations or quantities of patterns in the poly cut feature pattern 530 are within the scope of the present disclosure.

Layout design 500A further includes one or more conductive feature patterns 506*a* (collectively referred to as a "set of conductive feature patterns 506") extending in the second direction Y. In some embodiments, the set of conductive feature patterns 506 is also referred to as "a set of contact patterns." For ease of illustration, other contact patterns in the set of contact patterns are not shown in FIGS. 5A-5D, but are similar to the set of contact patterns 1106 in FIGS. 11A-11B.

Each of the conductive feature patterns of the set of conductive feature patterns 506 is separated from an adjacent contact pattern of the set of conductive feature patterns 506 in at least the first direction X or the second direction Y.

The set of conductive feature patterns 506 is usable to manufacture a corresponding set of conductors 606 of integrated circuit 600. In some embodiments, conductive feature pattern 506*a* of the set of conductive feature patterns 506 is usable to manufacture a corresponding conductor 606*a* of the set of conductors. In some embodiments, the set of conductive feature patterns 506 is also referred to as a set of metal over diffusion (MD) patterns.

In some embodiments, at least one of contact pattern 506*a* of the set of conductive feature patterns 506 is usable to manufacture source or drain terminals of one of the NMOS or PMOS transistors of integrated circuit 600.

In some embodiments, the set of conductive feature patterns 506 overlap the set of active region patterns. The set of conductive feature patterns is located on a third layout level. In some embodiments, the third layout level corresponds to the contact level or an MD level of one or more of layout design 500A-500D, 700A-700B, 800A-800B, 900A-900B, 1000A-1000B or 1100A-1100B (FIG. 5A-5D, 7A-7B, 8A-8B, 9A-9B, 10A-10B or 11A-11B) or integrated circuit 600. In some embodiments, the set of conductive feature patterns located on the MD level is also referred to as "a set of contact patterns." In some embodiments, the third layout level is the same as the second layout level. In some embodiments, the third layout level is different from the first layout level.

In some embodiments, the third layout level corresponds to a metal-1 (M1) level of one or more of layout design 500A-500D, 700A-700B, 800A-800B, 900A-900B, 1000A-1000B or 1100A-1100B (FIG. 5A-5D, 7A-7B, 8A-8B, 9A-9B, 10A-10B or 11A-11B) or integrated circuit 600.

Other configurations, arrangements on other layout levels or quantities of patterns in the set of conductive feature patterns 506 are within the scope of the present disclosure.

Layout design 500A further includes one or more conductive feature patterns 520a, 520b, 520c or 520d (collectively referred to as a "set of conductive feature patterns 520") and one or more conductive feature patterns 521a, 521b, 521c, 521d or 521e extending in at least the first direction X.

Each of conductive feature patterns 520a, 520b, 520c or 520d of the set of conductive feature patterns 520 are separated from each other in at least the second direction Y.

Each of conductive feature patterns 521a, 521b, 521c, 521d or 521e of the set of conductive feature patterns 521 are separated from each other in at least the second direction Y.

In some embodiments, while each of conductive feature patterns 520a, 520b, 520c or 520d and each of conductive feature patterns 521a, 521b, 521c, 521d or 521e are shown as continuous patterns, one or more of conductive feature patterns 520a, 520b, 520c or 520d or one or more of conductive feature patterns 521a, 521b, 521c, 521d or 521e is separated to form discontinuous patterns.

The set of conductive feature patterns 520 is usable to manufacture a corresponding set of conductors 620 of integrated circuit 600. In some embodiments, conductive feature pattern 520a, 520b, 520c or 520d is usable to manufacture corresponding conductor 620a, 620b, 620c or 620d of the set of conductors 620 of integrated circuit 600.

The set of conductive feature patterns 521 is usable to manufacture a corresponding set of conductors 621 of integrated circuit 600. In some embodiments, conductive feature pattern 521a, 521b, 521c, 521d or 521e is usable to manufacture corresponding conductor 621a, 621b, 621c, 621d or 621e of the set of conductors 620 of integrated circuit 600.

In some embodiments, the set of conductors 620 and 621 are located on the front-side (not labelled) of integrated circuit 600.

The set of conductive feature patterns 520 and 521 overlap the set of gate patterns 504, the set of active region patterns 502 and the set of conductive feature patterns 506. In some embodiments, the set of conductive feature patterns 520 and 521 are on a fourth layout level. In some embodiments, the fourth layout level is different from the first layout level, the second layout level and the third layout level. In some embodiments, the fourth layout level corresponds to the M0 level of one or more of layout design 500A-500D, 700A-700B, 800A-800B, 900A-900B, 1000A-1000B or 1100A-1100B (FIG. 5A-5D, 7A-7B, 8A-8B, 9A-9B, 10A-10B or 11A-11B) or integrated circuit 600. In some embodiments, the M0 level is above the OD level, the POLY level, the MD level, the VG level and the VD level.

Each conductive feature pattern in the set of conductive feature patterns 520 is separated from an adjacent conductive feature pattern in the set of conductive feature patterns 520 in the second direction Y by a M0 pitch (not labelled). Each conductive feature pattern in the set of conductive feature patterns 521 is separated from an adjacent conductive feature pattern in the set of conductive feature patterns 521 in the second direction Y by a M0 pitch (not labelled).

In some embodiments, the set of conductive feature patterns 520 corresponds to 4 M0 routing tracks, and the set of conductive feature patterns 521 corresponds to 5 M0 routing tracks. Other numbers of M0 routing tracks are within the scope of the present disclosure.

Other configurations, arrangements on other layout levels or quantities of patterns in the set of conductive feature patterns 520 and 521 are within the scope of the present disclosure.

Layout design 500A further includes one or more power rail patterns 522a, 522b or 522c (collectively referred to as a "set of power rail patterns 522") extending in at least the first direction X.

Each of power rail patterns 522a, 522b or 522c of the set of power rail patterns 522 are separated from each other in at least the second direction Y.

The set of power rail patterns 522 is usable to manufacture a corresponding set of power rails 622 of integrated circuit 600. In some embodiments, power rail pattern 522a, 522b or 522c is usable to manufacture corresponding power rail 622a, 622b or 622c of the set of power rails 622 of integrated circuit 600.

In some embodiments, the set of power rails 622 are located on the front-side (not labelled) of integrated circuit 600.

The set of power rail patterns 522 overlap the set of dummy gate isolation patterns 504. In some embodiments, the set of power rail patterns 522 is on the fourth layout level. In some embodiments, the set of power rail patterns 522 is on the M0 level.

Each power rail pattern in the set of power rail patterns 522 is separated from an adjacent power rail pattern in the set of power rail patterns 522 in the second direction Y.

Other configurations, arrangements on other layout levels or quantities of patterns in the set of power rail patterns 522 are within the scope of the present disclosure.

Layout design 500A further includes one or more via patterns 510a, 510b, . . . , 510l or 510m (collectively referred to as a "set of via patterns 510") and one or more via patterns 512a, 512b, . . . , 512q or 512r (collectively referred to as a "set of via patterns 512").

The set of via patterns 510 is usable to manufacture a corresponding set of vias 610 of integrated circuit 600. In some embodiments, via patterns 510a, 510b, . . . , 510l or 510m of the set of via patterns 510 are usable to manufacture corresponding vias 610a, 610b, . . . , 610l or 610m of the set of vias 610 of integrated circuit 600.

The set of via patterns 512 is usable to manufacture a corresponding set of vias 612 of integrated circuit 600. In some embodiments, via patterns 512a, 512b, . . . , 512q or 512r of the set of via patterns 512 are usable to manufacture corresponding vias 612a, 612b, . . . , 612q or 612r of the set of vias 612 of integrated circuit 600.

The set of via patterns 510 and 512 are positioned at a via over gate (VG) level. In some embodiments, the VG level of one or more of layout design 500A-500D, 700A-700B, 800A-800B, 900A-900B, 1000A-1000B or 1100A-1100B (FIG. 5A-5D, 7A-7B, 8A-8B, 9A-9B, 10A-10B or 11A-11B) or integrated circuit 600 is between the POLY level and the M0 level. In some embodiments, the VG level is between the POLY level and the M0 level. In some embodiments, the VG level is between the second layout level and the fourth layout level. Other layout levels are within the scope of the present disclosure.

In some embodiments, the set of via patterns 510 and 512 are located where the corresponding set of conductive feature patterns 520 and 521 overlap the set of gate patterns in the second layout level. In some embodiments, the set of via patterns 510 and 512 are located where the corresponding set of conductive feature patterns 520 and 521 overlap the set of dummy gate isolation patterns 504. In some embodiments, the set of via patterns 510 and 512 are located where the corresponding set of conductive feature patterns 520 and 521 overlap the set of gate patterns 1004.

In some embodiments, the set of via patterns 510 and 512 are between the corresponding set of conductive feature patterns 520 and 521 and the set of gate patterns in the second layout level. In some embodiments, the set of via patterns 510 and 512 are between the corresponding set of conductive feature patterns 520 and 521 and the set of dummy gate isolation patterns 504. In some embodiments, the set of via patterns 510 and 512 are between the corresponding set of conductive feature patterns 520 and 521 and the set of gate patterns 1004.

In some embodiments, the size of one or more via patterns in the set of via patterns 510 and 512 can be increased thereby reducing resistance compared to other approaches.

Other configurations, arrangements on other layout levels or quantities of patterns in at least the set of via patterns 510 and 512 are within the scope of the present disclosure.

Layout design 500A further includes one or more via patterns 514a, 514b, . . . , 514g or 514h (collectively referred to as a "set of via patterns 514") and one or more via patterns 516a, 516b, . . . , 516i or 516j (collectively referred to as a "set of via patterns 516").

The set of via patterns 514 is usable to manufacture a corresponding set of vias 614 of integrated circuit 600. In some embodiments, via patterns 514a, 514b, . . . , 514g or 514h of the set of via patterns 514 are usable to manufacture corresponding vias 614a, 614b, . . . , 614g or 614h of the set of vias 614 of integrated circuit 600.

The set of via patterns 516 is usable to manufacture a corresponding set of vias 616 of integrated circuit 600. In some embodiments, via patterns 516a, 516b, . . . , 516i or 516j of the set of via patterns 516 are usable to manufacture corresponding vias 616a, 616b, . . . , 616i or 616j of the set of vias 616 of integrated circuit 600.

The set of via patterns 514 and 516 are positioned at a via over diffusion (VD) level.

In some embodiments, the VD level of one or more of layout design 500A-500D, 700A-700B, 800A-800B, 900A-900B, 1000A-1000B or 1100A-1100B (FIG. 5A-5D, 7A-7B, 8A-8B, 9A-9B, 10A-10B or 11A-11B) or integrated circuit 600 is between the MD and the OD level. In some embodiments, the VD level is above the MD and the OD level. In some embodiments, the VD level is between the MD level and the M0 level. In some embodiments, the VD level is between the third layout level and the fourth layout level. Other layout levels are within the scope of the present disclosure.

In some embodiments, the set of via patterns 514 and 516 are located where the corresponding set of conductive feature patterns 520 and 521 overlap the set of conductive feature patterns in the third layout level. In some embodiments, the set of via patterns 514 and 516 are located where the corresponding set of conductive feature patterns 520 and 521 overlap the set of conductive feature patterns 506.

In some embodiments, the set of via patterns 514 and 516 are between the corresponding set of conductive feature patterns 520 and 521 and the set of conductive feature patterns in the third layout level. In some embodiments, the set of via patterns 514 and 516 are between the corresponding set of conductive feature patterns 520 and 521 and the set of conductive feature patterns 506.

In some embodiments, the size of one or more via patterns in the set of vias patterns 514 or 516 can be increased thereby reducing resistance compared to other approaches.

Other configurations, arrangements on other layout levels or quantities of patterns in at least set of via patterns 514 or 516 are within the scope of the present disclosure.

Layout design 500C is a variation of layout design 500A, and similar detailed description is omitted for brevity. Layout design 500D is a variation of layout design 500B, and similar detailed description is omitted for brevity. For example, in some embodiments, layout designs 500C-500D correspond to the revised first layout design after operation 206 in method 200 (FIG. 2). In some embodiments, layout designs 500C-500D correspond to the first layout design after the execution of method 300A of FIG. 3A.

In comparison with layout design 500A of FIG. 5A, layout design 500C of FIG. 5C further includes a poly cut feature pattern 532, a via pattern 515a and a conductive feature pattern 507a, and similar detailed description is omitted for brevity.

In some embodiments, poly cut feature pattern 532 is similar to one or more poly cut feature patterns in the set of poly cut feature patterns 530, via pattern 515a is similar to one or more via patterns in the set of via patterns 514, and conductive feature pattern 507a is similar to one or more conductive feature patterns in the set of conductive feature patterns 506, and similar detailed description is omitted for brevity.

In comparison with layout design 500A of FIG. 5A, floating gate pattern 505a1 of layout design 500C of FIG. 5C replaces a portion 504a1 of the dummy gate isolation pattern 504 of layout design 500A of FIG. 5A, and similar detailed description is omitted for brevity. In some embodiments, floating gate pattern 505a1 is a part of a set of floating gate patterns 505.

In some embodiments, the set of floating gate patterns 505 is similar to the set of gate patterns 1004, and similar detailed description is omitted for brevity. In some embodiments, floating gate pattern 505a1 is similar to one or more gate patterns in the set of gate patterns 1004, and similar detailed description is omitted for brevity. In some embodiments, floating gate pattern 505a1 is a gate pattern that is configured as a floating gate. In some embodiments, floating gate pattern 505a1 does not correspond to a CPODE pattern.

In some embodiments, floating gate pattern 505a1 corresponds to regions of PMOS transistors of integrated circuit 600, and remaining portion 504a2 of the dummy gate isolation pattern 504 corresponds to regions of NMOS transistors of integrated circuit 600.

In some embodiments, floating gate pattern 505a1 corresponds to regions of NMOS transistors of integrated circuit 600, and remaining portion 504a2 of the dummy gate isolation pattern 504 corresponds to regions of PMOS transistors of integrated circuit 600.

Layout design 500A includes a region 550A. Layout design 500B corresponds to region 550A of layout design 500A. In some embodiments, layout designs 500A-500B correspond to the first layout design after operation 202 in method 200 (FIG. 2). In some embodiments, layout designs 500A-500B correspond to the first layout design prior to operation 302 of method 300A (FIG. 3A).

Layout design 500C includes a region 550B. Layout design 500D corresponds to region 550B of layout design 500C. In some embodiments, layout designs 500C-500D correspond to the revised first layout design after operation 206 in method 200 (FIG. 2). In some embodiments, layout designs 500C-500D correspond to the first layout design after operation 314 of method 300A (FIG. 3A).

As shown in FIGS. 5A-5B, dummy gate isolation patterns 504a and 504b are adjacent to each other. Dummy gate isolation pattern 504a includes dummy gate isolation patterns 504a1 and 504a2. Conductive feature pattern 506a is adjacent to dummy gate isolation pattern 504a. Conductive feature pattern 506a overlaps power rail pattern 522c. Via pattern 514c is between conductive feature pattern 506a and power rail pattern 522c.

During execution of method 300A, each of the dummy gate isolation patterns in the set of dummy gate isolation patterns 504 are identified in operation 302. Afterwards, in operation 304, a portion of a dummy gate isolation pattern in the set of dummy gate isolation patterns 504 is replaced if the dummy gate isolation pattern satisfies at least replacement criterion 1 or replacement criterion 2.

In some embodiments, the set of dummy gate isolation patterns 504 do not satisfy replacement criterion 2.

In some embodiments, dummy gate isolation patterns 504a and 504b are adjacent to each other in layout designs 500A-500B, and therefore satisfy replacement criterion 1, and are modified by at least operation 304 of method 300A in generating layout designs 500C-500D.

Returning to execution of method 300A, in operation 306, portion 504a1 of the dummy gate isolation pattern 504 is removed leaving the remaining portion 504a2 of dummy gate isolation pattern 504a. Afterwards, in operation 308, a floating gate pattern 505a1 is inserted where the portion 504a1 of the dummy gate isolation pattern 504 was located (shown in FIGS. 5C-5D).

In operation 310, a poly cut feature pattern 532a is inserted between the floating gate pattern 505a1 and the remaining portion 504a2 of the dummy gate isolation pattern 504 (shown in FIGS. 5C-5D).

In operation 312, via pattern 515a is inserted over the power rail pattern 522c (shown in FIGS. 5C-5D). Via pattern 515a is adjacent to the floating gate pattern 505al.

In operation 314, conductive feature pattern 507a is inserted adjacent to the floating gate pattern 505al. Conductive feature pattern 507a overlaps the power rail pattern 522c and via pattern 515a.

Other variations of the execution of method 300A are within the scope of the present disclosure. For example, in some embodiments, if layout design 500A-500B, did not include one or more of conductive feature pattern 506a or via pattern 514c, the execution of method 300A would insert one or more conductive feature pattern 506a or via pattern 514c into layout designs 500C-500D similar to the insertion of conductive feature pattern 507a and via pattern 515a, and similar detailed description is omitted for brevity.

In some embodiments, layout designs 500C-500D include at least a floating gate dummy pattern (e.g., dummy gate isolation pattern 505a1) that replaces one or more dummy gate isolation patterns in the set of dummy gate isolation patterns 504 thereby resulting in layout designs 500C-500D that are usable to manufacture a corresponding integrated circuit 600 with improved speed compared to other approaches.

Other configurations, arrangements on other layout levels or quantities of elements in layout design 500A-500D are within the scope of the present disclosure.

FIGS. 6A-6G are diagrams of an integrated circuit 600, in accordance with some embodiments.

FIG. 6A is a top view of integrated circuit 600, in accordance with some embodiments.

Figure 6G:
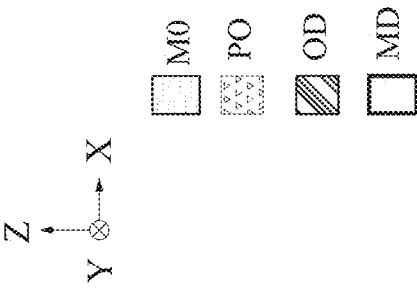
Figure 6G:
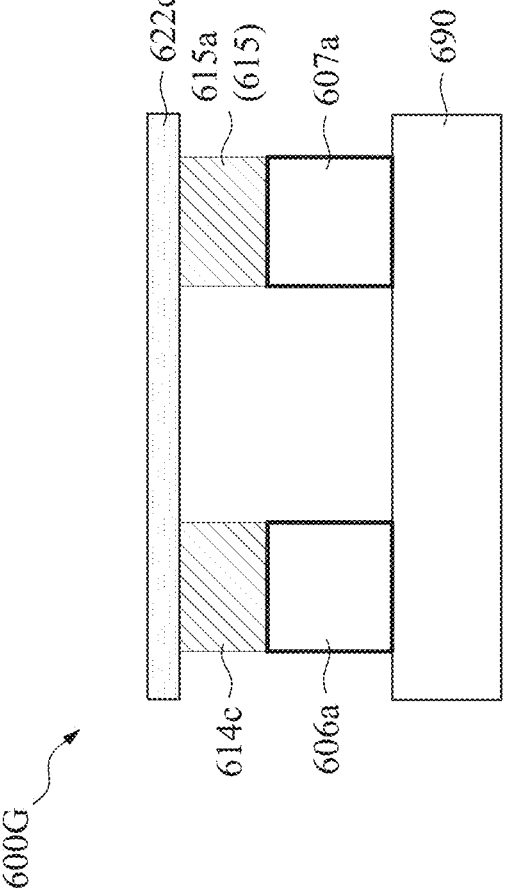

FIG. 6B is a diagram of a corresponding portion 600B of integrated circuit 600 of FIG. 6A, simplified for ease of illustration. FIG. 6C is a diagram of a corresponding portion 600C of integrated circuit 600 of FIG. 6A, simplified for ease of illustration. FIG. 6D is a diagram of a corresponding portion 600D of integrated circuit 600 of FIG. 6A, simplified for ease of illustration. FIG. 6E is a diagram of a corresponding portion 600E of integrated circuit 600 of FIG. 6A, simplified for ease of illustration. FIG. 6F is a circuit diagram of a transistor 600F, simplified for ease of illustration. FIG. 6G is a diagram of a corresponding portion 600G of integrated circuit 600 of FIG. 6A, simplified for ease of illustration.

Integrated circuit 600 includes one or more features of the OD level, the POLY level, the MD level, the VG level, the VD level and the M0 level.

In some embodiments, integrated circuit 600 includes additional elements not shown in FIGS. 6A-6G. For ease of illustration, integrated circuit 600 in FIG. 6A does not show elements in the OD level. For ease of illustration, integrated circuit 600 shows a limited number of elements in the POLY level and the MD level.

FIGS. 6C-6E and 6G are corresponding cross-sectional views of integrated circuit 600, in accordance with some embodiments. FIG. 6C is a cross-sectional view of integrated circuit 600 as intersected by plane A-A', in accordance with some embodiments. FIG. 6D is a cross-sectional view of integrated circuit 600 as intersected by plane B-B', in accordance with some embodiments. FIG. 6E is a cross-sectional view of integrated circuit 600 as intersected by plane C-C', in accordance with some embodiments. FIG. 6G is a cross-sectional view of integrated circuit 600 as intersected by plane D-D', in accordance with some embodiments.

Components that are the same or similar to those in one or more of FIG. 5A-5D, 6A-6G, 7A-7B, 8A-8B, 9A-9B, 10A-10B or 11A-11B are given the same reference numbers, and detailed description thereof is thus omitted.

Integrated circuit 600 is manufactured by layout design 500C. Structural relationships including alignment, lengths and widths, as well as configurations and layers of integrated circuit 600 are similar to the structural relationships and configurations and layers of layout design 500C of FIGS. 5C-5D, and similar detailed description will not be described in at least FIGS. 6A-6G, for brevity.

For example, in some embodiments, at least one or more widths, lengths or pitches of layout design 500C is similar to corresponding widths, lengths or pitches of integrated circuit 600, and similar detailed description is omitted for brevity. For example, in some embodiments, at least cell boundaries 501a, 501b, 101c or 101d or a mid-point (not labelled) of layout design 500C is similar to at least corresponding cell boundaries 601a, 601b, 601c or 601d or a mid-point (not labelled) of integrated circuit 600, and similar detailed description is omitted for brevity.

Integrated circuit 600 includes at least the set of active regions 602, an insulating region 603, the set of gate structures 604, the set of gate structures 605 and 640, the set of conductors 606, the set of vias 610, the set of vias 612, the set of vias 614, the set of vias 616, the set of conductors 620, the set of conductors 621 and the set of power rails 622.

Integrated circuit 600 further includes a region 650A. Integrated circuit 600B corresponds to region 650A of integrated circuit 600.

The set of active regions 602 include one or more of active regions 602a or 602b embedded in a substrate 690. Substrate has a front-side (not labelled) and a back-side (not labelled) opposite from the front-side. In some embodiments, at least the set of active regions 602, the set of gate structures 604, the set of gate structures 605, the set of conductors 606, the set of vias 610, the set of vias 612, the set of vias 614, the set of vias 616, the set of conductors 620, the set of conductors 621 or the set of power rails 622 are formed in the front-side of substrate 690.

In some embodiments, the set of active regions 602 corresponds to fin structures (not shown) of finFETs. Other transistor types are within the scope of the present disclosure. For example, in some embodiments, the set of active regions 602 corresponds to nanowire structures (not shown) of nanowire transistors. In some embodiments, the set of active regions 602 corresponds to planar structures (not shown) of planar transistors. In some embodiments, the set of active regions 602 corresponds to structures (not shown) of complementary FETs (CFETs). In some embodiments, the set of active regions 602 corresponds to nanosheet structures (not labelled) of nanosheet transistors.

In some embodiments, the set of active regions 602 include drain regions and source regions grown by an epitaxial growth process. In some embodiments, the set of active regions 602 include drain regions and source regions that are grown with an epitaxial material at the corresponding drain regions and source regions.

In some embodiments, active region 602a corresponds to source and drain regions of NMOS transistors of integrated circuit 600, and active region 602b corresponds to source and drain regions of PMOS transistors of integrated circuit 600.

In some embodiments, active region 602a corresponds to source and drain regions of PMOS transistors of integrated circuit 600, and active region 602b corresponds to source and drain regions of NMOS transistors of integrated circuit 600.

In some embodiments, at least active region 602a is an N-type doped S/D region, and active region 602b is a P-type doped S/D region embedded in a dielectric material of substrate 690. In some embodiments, at least active region 602a is a P-type doped S/D region, and active region 602b is an N-type doped S/D region embedded in a dielectric material of substrate 690.

Active region 602a includes at least well 602a1, well 602a2 or well 602a3.

Active region 602b includes at least well 602b1 or well 602b2.

Other configurations, arrangements on other layout levels or quantities of structures in the set of active regions 602 are within the scope of the present disclosure.

Insulating region 603 is configured to electrically isolate one or more elements of the set of active regions 602, the set of gate structures 604, the set of gate structures 605, the set of conductors 606, the set of vias 610, the set of vias 612, the set of vias 614, the set of vias 616, the set of conductors 620, the set of conductors 621 or the set of power rails 622 from one another. In some embodiments, insulating region 603 includes multiple insulating regions deposited at different times from each other during methods 1200A-1200B (FIGS. 12A-12B). In some embodiments, insulating region is a dielectric material. In some embodiments, the dielectric material includes silicon dioxide, silicon oxynitride, or the like.

Other configurations, arrangements on other layout levels or other numbers of portions in insulating region 603 are within the scope of the present disclosure.

The set of gate structures 604 include one or more of gate structures 604a2, 604b, 604c, 604d, 604e or 604f.

In some embodiments, at least gate structure 604a2, 604b, 604c, 604d, 604e or 604f corresponds to a dummy gate structure. In some embodiments, a dummy gate structure is a gate structure of a non-functional transistor.

In some embodiments, at least gate structure 604a2 or 604d corresponds to regions of NMOS transistors of integrated circuit 600, and gate structure 605a1 corresponds to regions of PMOS transistors of integrated circuit 600. In some embodiments, at least gate structure 604a2 or 604d corresponds to regions of PMOS transistors of integrated circuit 600, and gate structure 605a1 corresponds to regions of NMOS transistors of integrated circuit 600.

In some embodiments, at least a portion of gate structure 604b, 604c, 604e or 604f corresponds to regions of NMOS transistors of integrated circuit 600, and another portion of gate structure 604b, 604c, 604e or 604f corresponds to regions of PMOS transistors of integrated circuit 600. In some embodiments, at least a portion of gate structure 604b, 604c, 604e or 604f corresponds to regions of PMOS transistors of integrated circuit 600, and another portion of gate structure 604b, 604c, 604e or 604f corresponds to regions of NMOS transistors of integrated circuit 600.

Other configurations, arrangements on other layout levels or quantities of gate structures in the set of gate structures 604 are within the scope of the present disclosure.

The set of gate structures 605 include at least gate structure 605a1.

In some embodiments, at least gate structure 604a2 corresponds to a floating gate structure. In some embodiments, gate structure 604a2 is a floating gate structure of transistor 600F shown in FIG. 6F. In some embodiments, gate structure 604a2 is electrically floating. In some embodiments, gate structure 604a2 is electrically floating, and is not electrically coupled to a voltage.

As shown in FIG. 6F, the gate structure 604a2 of transistor 600F is electrically floating. As shown in FIG. 6F, the source terminals and drain terminals are electrically coupled to corresponding nodes Nd1 and Nd2, and nodes Nd1 and Nd2 receive the same signal.

Gate structure 605a1 is separated from gate structure 604a2 by a removed gate structure portion 632a. In some embodiments, the removed gate structure portion 632a of a set of removed gate structure portions 630 or 632 is removed during operation 104 of FIG. 1. The removed gate structure portions 630 or 632 is also referred to as poly cut feature patterns, such as poly cut feature patterns 630a, 630b1, 630b2, 630c, 630c1, 630c2, 630d, 630d1, 630e or 632a.

In some embodiments, by electrically floating the gate structure 604a2 of transistor 600F, the active region 602a is increased in width in the first direction X thereby improving the speed of integrated circuit 600 compared to other approaches.

Other configurations, arrangements on other layout levels or quantities of gate structures in the set of gate structures 605 are within the scope of the present disclosure.

The set of gate structures 640 include one or more of gate structures 640a, 640b or 640c. For ease of illustration, the set of gate structures 640 are shown in region 650A in FIG. 6B, but the set of gate structures 640 are also included in the remaining regions (e.g., not including region 650A) of integrated circuit 600.

In some embodiments, the set of gate structures 640 is similar to the set of gate structures 605, and similar detailed description is omitted for brevity.

In some embodiments, at least gate structure 640a, 640b or 640c corresponds to a gate structure of a functional transistor.

In some embodiments, at least a first portion of gate structure 640a, 640b or 640c corresponds to regions of NMOS transistors of integrated circuit 600, and at least a second portion of gate structure 640a, 640b or 640c corresponds to regions of PMOS transistors of integrated circuit 600.

Other configurations, arrangements on other layout levels or quantities of gate structures in the set of gate structures 640 are within the scope of the present disclosure.

The set of conductors 606 include at least conductor 606a. The set of conductors 607 include at least conductor 607a.

In some embodiments, the set of conductors 606 and 607 are also referred to as "a set of contacts." For ease of illustration, other conductors 606 and 607 in the set of conductors 606 and 607 are not shown in FIGS. 6A-6E, but are similar to the set of contacts 1106 in FIGS. 11A-11B.

The set of conductors 606 and 607 are located on the front-side of integrated circuit 600. The set of conductors 606 and 607 overlap the set of active regions 602.

Each conductor of the set of conductors 606 corresponds to one or more drain or source terminals of PMOS or NMOS transistors of integrated circuit 600.

Each conductor of the set of conductors 607 corresponds to one or more drain or source terminals of PMOS or NMOS transistors of integrated circuit 600.

Other configurations, arrangements on other layout levels or quantities of conductors in the set of conductors 606 and 607 are within the scope of the present disclosure.

The set of vias 610 include one or more of vias 610a, 610b, . . . , 610l or 610m. The set of vias 612 include one or more of vias 612a, 612b, . . . , 612q or 612r. The set of vias 610 and 612 are embedded in insulating region 603. The set of vias 610 is located where the set of gates are overlapped by the set of conductors 620. The set of vias 610 are between the set of gates and the set of conductors 620. The set of vias 610 are configured to electrically couple the set of gates and the set of conductors 620 together.

As shown in FIG. 6C, via 610b electrically couples conductor 620d and gate structure 640a together.

The set of vias 612 is located where the set of gates are overlapped by the set of conductors 621. The set of vias 612 are between the set of gates and the set of conductors 621. The set of vias 612 are configured to electrically couple the set of gates and the set of conductors 621 together.

Other configurations, arrangements on other layout levels or quantities of vias in the set of vias 610 and 612 are within the scope of the present disclosure.

The set of vias 614 include one or more of vias 614a, 614b, . . . , 614g or 614h. The set of vias 615 include at least via 615a. The set of vias 616 include one or more of vias 616a, 616b, . . . , 616i or 616j. The set of vias 614, 615 and 616 are embedded in insulating region 603.

The set of vias 614 is located where the set of conductors 606 are overlapped by the set of conductors 620. The set of vias 614 are between the set of conductors 606 and the set of conductors 620. The set of vias 614 are configured to electrically couple the set of active regions 602 and the set of conductors 620 together by the set of conductors 606.

The set of vias 615 is located where the set of conductors 607 are overlapped by the set of conductors 620. The set of vias 615 are between the set of conductors 607 and the set of conductors 620. The set of vias 615 are configured to electrically couple the set of active regions 602 and the set of conductors 620 together by the set of conductors 607.

The set of vias 616 is located where the set of conductors 606 are overlapped by the set of conductors 621. The set of vias 616 are between the set of conductors 606 and the set of conductors 621. The set of vias 616 are configured to electrically couple the set of active regions 602 and the set of conductors 621 together by the set of conductors 606.

As shown in FIG. 6G, vias 614c and 615a electrically couple corresponding conductors 606a and 607a to power rail 622c.

Other configurations, arrangements on other layout levels or quantities of vias in the set of vias 614, 615 and 616 are within the scope of the present disclosure.

The set of conductors 620 include one or more of conductors 620a, 620b, 620c or 620d. In some embodiments, the set of conductors 620 corresponds to a set of conductive structures.

The set of conductors 621 include one or more of conductors 621a, 621b, 621c, 621d or 621e. In some embodiments, the set of conductors 621 corresponds to a set of conductive structures. The set of conductors 620 and 621 are embedded in insulating region 603.

Other widths for the set of conductors 620 or 621 are within the scope of the present disclosure.

The set of conductors 620 overlap the set of conductors 606, the set of conductors 607, the set of gate structures 604, the set of gate structures 605, the set of active regions 602, the set of vias 610, the set of vias 614 and the set of vias 615.

The set of conductors 621 overlap the set of conductors, the set of gate structures 604, the set of active regions 602, the set of vias 612 and the set of vias 616.

Other configurations, arrangements on other layout levels or quantities of conductors in the set of conductors 620 or 621 are within the scope of the present disclosure.

The set of power rails 622 include one or more of power rails 622a, 622b or 622c.

The set of power rails 622 overlap the set of gate structures 604.

In some embodiments, at least power rail 622a or 622c is configured to provide a first supply voltage of a voltage supply VDD to integrated circuit 600, and power rail 622b is configured to provide a second supply voltage of a reference voltage supply VSS to integrated circuit 600. In some embodiments, the first supply voltage is different from the second supply voltage.

In some embodiments, at least power rail 622a or 622c is configured to provide the second supply voltage of the reference voltage supply VSS to integrated circuit 600, and power rail 622b is configured to provide the first supply voltage of the voltage supply VDD to integrated circuit 600.

Other configurations, arrangements on other layout levels or quantities of conductors in the set of power rails 622 are within the scope of the present disclosure.

In some embodiments, one or more vias of set of vias 610, 612, 614, 615 or 616 have a square shape, a rectangular shape, a circular shape or a polygonal shape. Other lengths, widths and shapes for one or more vias of set of vias 610, 612, 614, 615 or 616 are in the scope of the present disclosure.

In some embodiments, at least one gate structure region of the set of gate structures 604 or 605 are formed using a doped or non-doped polycrystalline silicon (or polysilicon). In some embodiments, at least one gate structure region of the set of gate structures 604 or 605 include a metal, such as Al, Cu, W, Ti, Ta, TiN, TaN, NiSi, CoSi, other suitable conductive materials, or combinations thereof.

In some embodiments, at least one conductor of the set of conductors 606, at least one conductor of the set of conductors 607, at least one conductor of the set of conductors 620, at least one conductor of the set of conductors 621, at least one power rail of the set of power rails 622, at least one via of the set of vias 610, at least one via of the set of vias 612, at least one via of the set of vias 614, at least one via of the set of vias 615 or at least one via of the set of vias 616 includes one or more layers of a conductive material, a metal, a metal compound or a doped semiconductor. In some embodiments, the conductive material includes Tungsten, Cobalt, Ruthenium, Copper, or the like or combinations thereof. In some embodiments, a metal includes at least Cu (Copper), Co, W, Ru, Al, or the like. In some embodiments, a metal compound includes at least AlCu, W—TiN, TiSix, NiSix, TiN, TaN, or the like. In some embodiments, a doped semiconductor includes at least doped silicon, or the like.

Other materials, configurations, arrangements on other layout levels or quantities of elements in integrated circuit 600 are within the scope of the present disclosure.

Figures 7A, 7B:
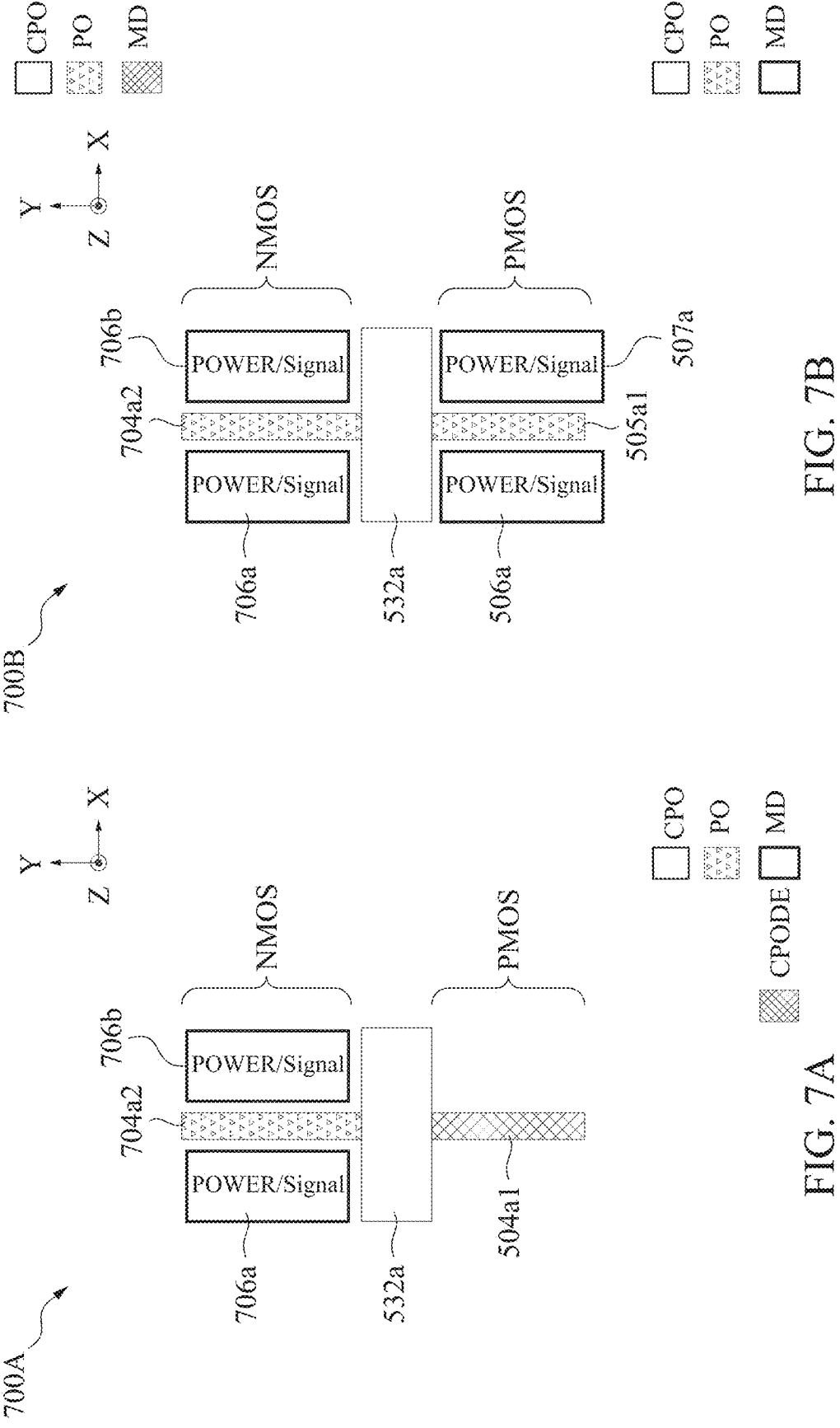
FIGS. 7A-7B are diagrams of a corresponding layout design of an integrated circuit, in accordance with some embodiments.

FIGS. 7A-7B are diagrams of a corresponding layout design 700A-700B of an integrated circuit, in accordance with some embodiments.

Layout designs 700A-700B are useable to manufacture a corresponding integrated circuit similar to integrated circuit 600. For brevity FIGS. 7A-11B are described as a corresponding layout designs 700A-1100B, but in some embodiments, FIGS. 7A-11B also correspond to integrated circuits similar to integrated circuit 600, layout patterns of layout design 700A-1100B also correspond to structural elements, and structural relationships including alignment, lengths and widths, as well as configurations and layers of a corresponding layout pattern of layout design 700A-1100B are similar to the structural relationships and configurations and layers of an integrated circuit, manufactured by layout design 700A-1100B, and similar detailed description will not be described for brevity.

In some embodiments, at least layout designs 700A-1100B are useable to manufacture a corresponding integrated circuit similar to integrated circuit 600, and similar detailed description is therefore omitted.

Structural relationships including alignment, lengths and widths, as well as configurations and layers of at least layout designs 700A-1100B are similar to the structural relationships and configurations and layers of layout designs 700A-1100B, and similar detailed description will not be described in at least FIGS. 7A-11B, for brevity.

Layout design 700A is a variation of layout design 500D, and similar detailed description is omitted for brevity. For example, in some embodiments, layout design 700A includes a floating gate pattern 704a2 that replaces portion 504a2 of the dummy gate isolation pattern 504 of layout design 500D of FIG. 5D.

Layout design 700A corresponds to region 560a of layout design 500D. In some embodiments, layout design 700A is useable as region 560a of layout design 500D.

Layout design 700A includes poly cut feature pattern 532a, conductive feature patterns 706a and 706b, floating gate pattern 704a2 and portion 504a1 of the dummy gate isolation pattern 504 of FIGS. 5A-5D, and similar detailed description is omitted for brevity.

In comparison with layout design 500A of FIG. 5D, conductive feature patterns 706a and 706b are similar to corresponding conductive feature patterns 506a and 507a, floating gate pattern 704a2 is similar to corresponding floating gate pattern 505a1, and similar detailed description is omitted for brevity.

In comparison with layout design 500A of FIG. 5D, floating gate pattern 704a2 of layout design 700A of FIG. 7A replaces portion 504a2 of the dummy gate isolation pattern 504 of layout design 500D of FIG. 5D, and similar detailed description is omitted for brevity.

In some embodiments, floating gate pattern 704a2 is similar to one or more gate patterns in the set of gate patterns 1004, and similar detailed description is omitted for brevity.

In some embodiments, floating gate pattern 704a2 is a gate pattern that is configured as a floating gate. In some embodiments, floating gate pattern 704a2 does not correspond to a CPODE pattern.

In some embodiments, floating gate pattern 704a2 corresponds to regions of NMOS transistors of an integrated circuit, such as integrated circuit 600, and remaining portion 504a1 of the dummy gate isolation pattern 504 corresponds to regions of PMOS transistors of integrated circuit, such as integrated circuit 600.

Other configurations, arrangements on other layout levels or quantities of elements in layout design 700A are within the scope of the present disclosure.

Layout design 700B is a variation of layout designs 500D and 700A, and similar detailed description is omitted for brevity. For example, in some embodiments, layout design 700B includes floating gate pattern 505a1 of layout design 500D, conductive feature patterns 506a and 507a of layout design 500D, floating gate pattern 704a2 of layout design 700A, and conductive feature patterns 706a and 706b of layout design 700A. Stated differently, layout design 700B includes floating gate patterns 505a1 and 704a2 on opposite sides of poly cut feature pattern 532a.

Layout design 700B corresponds to region 560a of layout design 500D. In some embodiments, layout design 700B is useable as region 560a of layout design 500D.

In some embodiments, floating gate pattern 704a2 corresponds to regions of NMOS transistors of an integrated circuit, such as integrated circuit 600, and floating gate pattern 505a1 corresponds to regions of PMOS transistors of integrated circuit, such as integrated circuit 600.

For ease of illustration, layout design 700A-700B does not show via layout patterns 514c and 515a, but each of layout designs 700A-700B also includes via layout patterns that are similar to via layout patterns 514c and 515a, and similar detailed description is omitted for brevity.

Other configurations, arrangements on other layout levels or quantities of elements in layout design 700B are within the scope of the present disclosure.

FIGS. 8A-8B are diagrams of a corresponding layout design 800A-800B of an integrated circuit, in accordance with some embodiments.

Layout design 800A is a variation of layout design 500D, and similar detailed description is omitted for brevity. For example, in some embodiments, layout design 800A includes a dummy gate isolation pattern 804a that replaces floating gate pattern 505a1 of layout design 500D of FIG. 5D.

FIG. 8A is a diagram of a layout design 800A, in accordance with some embodiments. In some embodiments, layout design 800A corresponds to the first layout design after operation 202 in method 200 (FIG. 2). In some embodiments, layout design 800A corresponds to the first layout design prior to operation 302 of method 300A (FIG. 3A).

FIG. 8B is a diagram of a layout design 800B, in accordance with some embodiments. In some embodiments, layout design 800B corresponds to the revised first layout design after operation 206 in method 200 (FIG. 2). In some embodiments, layout design 800B corresponds to the first layout design after operation 314 of method 300A (FIG. 3A).

Layout design 800A includes a dummy gate isolation pattern 804a, poly cut feature patterns 530a, 530c1 and 532, via patterns 514c and 515a, a set of via patterns 814, a set of via patterns 810, conductive feature patterns 506a and 507a, the set of conductive feature patterns 520, and the power rail patterns 522b and 522c.

In comparison with layout design 500D of FIG. 5D, the set of via patterns 810 is similar to the set of via patterns 510, the set of via patterns 814 is similar to the set of via patterns 514, and dummy gate isolation pattern 804a is similar to dummy gate isolation pattern 504a, and similar detailed description is omitted for brevity.

The set of via patterns 814 includes at least one of via patterns 814a or 814b. In some embodiments, at least one of via patterns 814a or 814b is similar to corresponding via pattern 514a or 514b, and similar detailed description is omitted for brevity.

The set of via patterns 810 includes at least one of via patterns 810a, 810b, . . . , 810d or 810e. In some embodiments, at least one of via patterns 810a, 810b, . . . , 810d or 810e is similar to corresponding via pattern 510a, 510b, . . . , 510d or 510e, and similar detailed description is omitted for brevity.

Layout design 800B includes a portion 804a2 of dummy gate isolation pattern 804a, a floating gate pattern 805a1, poly cut feature patterns 530a, 530c1 and 532, via patterns 514c and 515a, the set of via patterns 814, the set of via patterns 810, conductive feature patterns 506a and 507a, the set of conductive feature patterns 520, and the power rail patterns 522b and 522c.

In comparison with layout design 500D, floating gate pattern 805a1 is similar to floating gate pattern 505a1, the portion 804a2 of dummy gate isolation pattern 804a is similar to the portion 504a2 of dummy gate isolation pattern 504a, and similar detailed description is omitted for brevity.

In comparison with layout design 800A of FIG. 8A, floating gate pattern 805a1 of layout design 800B of FIG. 8B replaces a portion 804a1 of the dummy gate isolation pattern 804 of layout design 800A of FIG. 8A, and similar detailed description is omitted for brevity. In some embodiments, floating gate pattern 805a1 is a part of a set of floating gate patterns 805.

In some embodiments, floating gate pattern 805a1 is a gate pattern that is configured as a floating gate. In some embodiments, floating gate pattern 805a1 does not correspond to a CPODE pattern.

In some embodiments, floating gate pattern 805a1 corresponds to regions of PMOS transistors of an integrated circuit, and remaining portion 804a2 of the dummy gate isolation pattern 804 corresponds to regions of NMOS transistors of the integrated circuit.

In some embodiments, floating gate pattern 805a1 corresponds to regions of NMOS transistors of an integrated circuit, and remaining portion 804a2 of the dummy gate isolation pattern 804 corresponds to regions of PMOS transistors of the integrated circuit.

As shown in FIGS. 8A-8B, dummy gate isolation pattern 804a is positioned between conductive feature patterns 506a and 507a. Dummy gate isolation pattern 804a is adjacent to conductive feature patterns 506a and 507a. Dummy gate isolation pattern 804a includes dummy gate isolation patterns 804a1 and 804a2. Conductive feature pattern 506a overlaps power rail pattern 522c. Via pattern 514c is between conductive feature pattern 506a and power rail pattern 522c. Conductive feature pattern 507a overlaps power rail pattern 522c. Via pattern 515a is between conductive feature pattern 507a and power rail pattern 522c. Conductive feature patterns 506a and 507a are configured to carry a same power (e.g., VDD) as each other. Stated differently, conductive feature patterns 506a and 507a are both coupled the power rail pattern 522c, and therefore are configured to carry a same power (e.g., VDD) as each other.

During execution of method 300A, each of the dummy gate isolation patterns in the set of dummy gate isolation patterns 504 and 804 are identified in operation 302. Afterwards, in operation 304, a portion of a dummy gate isolation pattern in the set of dummy gate isolation patterns 804 is replaced if the dummy gate isolation pattern satisfies at least replacement criterion 1 or replacement criterion 2.

In some embodiments, the set of dummy gate isolation patterns 804 do not satisfy replacement criterion 1.

In some embodiments, dummy gate isolation pattern 804a is between and adjacent to conductive feature patterns 506a and 507a, and conductive feature patterns 506a and 507a are configured to carry the same power as each other, and therefore satisfy replacement criterion 2, and are modified by at least operation 304 of method 300A in generating layout designs 800B.

Returning to execution of method 300A, in operation 306, portion 804a1 of the dummy gate isolation pattern 804 is removed leaving the remaining portion 804a2 of dummy gate isolation pattern 804a. Afterwards, in operation 308, a floating gate pattern 805a1 is inserted where the portion 804a1 of the dummy gate isolation pattern 804 was located.

Afterwards, operation 310 is not performed since the poly cut feature pattern 532a is already positioned between floating gate pattern 805a1 and the remaining portion 804a2 of the dummy gate isolation pattern 804.

Afterwards, operation 312 is not performed since via pattern 515a is already positioned between the power rail pattern 522c and conductive feature pattern 507a.

Afterwards, operation 312 is not performed since conductive feature pattern 507a is already adjacent to the floating gate pattern 805a1.

Other variations of the execution of method 300A are within the scope of the present disclosure.

In some embodiments, layout designs 800A-800B achieves one or more of the benefits discussed above.

Other configurations, arrangements on other layout levels or quantities of elements in layout design 800A-800B are within the scope of the present disclosure.

Figure 9B:
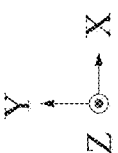
Figure 9B:
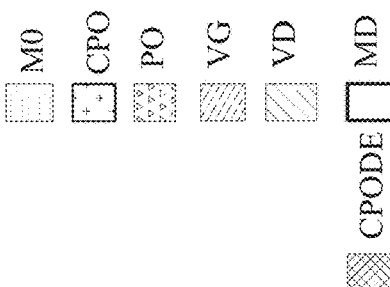
Figure 9B:
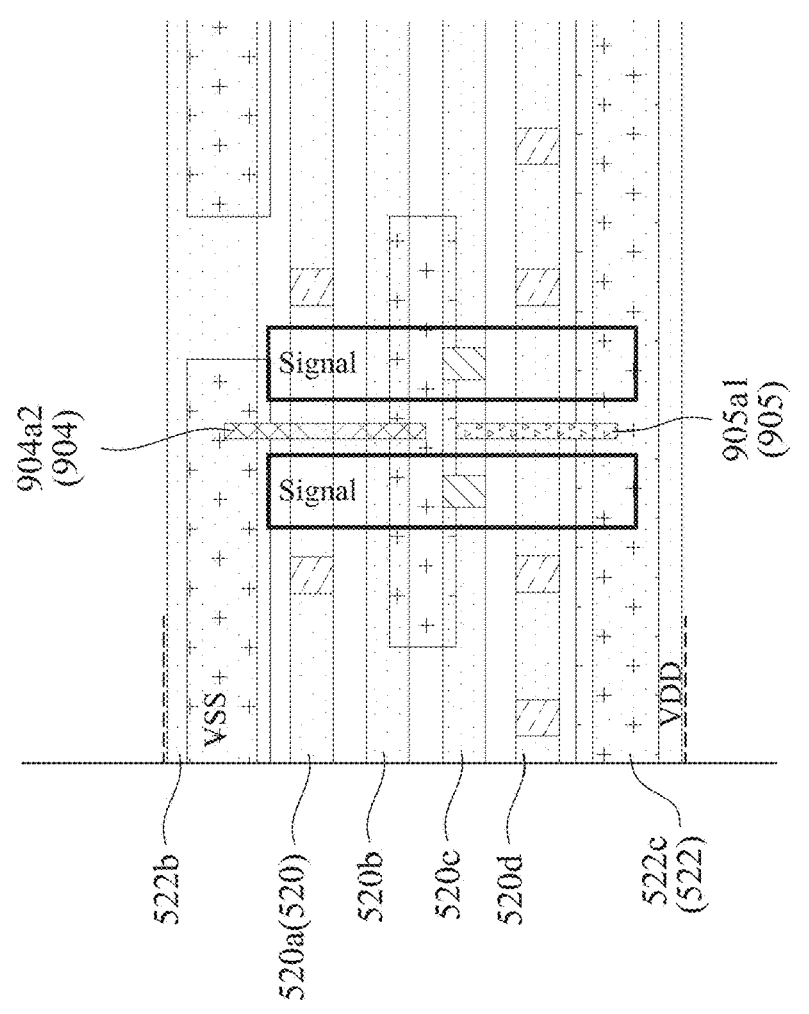

FIGS. 9A-9B are diagrams of a corresponding layout design 900A-900B of an integrated circuit, in accordance with some embodiments.

Layout design 900A is a variation of layout design 500D, and similar detailed description is omitted for brevity. For example, in some embodiments, layout design 900A includes a dummy gate isolation pattern 904a that replaces floating gate pattern 505a1 of layout design 500D of FIG. 5D.

FIG. 9A is a diagram of a layout design 900A, in accordance with some embodiments. In some embodiments, layout design 900A corresponds to the first layout design after operation 202 in method 200 (FIG. 2). In some embodiments, layout design 900A corresponds to the first layout design prior to operation 302 of method 300A (FIG. 3A).

FIG. 9B is a diagram of a layout design 900B, in accordance with some embodiments. In some embodiments, layout design 900B corresponds to the revised first layout design after operation 206 in method 200 (FIG. 2). In some embodiments, layout design 900B corresponds to the first layout design after operation 314 of method 300A (FIG. 3A).

Layout design 900A includes a dummy gate isolation pattern 904a, poly cut feature patterns 530a, 530c1, 530c2 and 932, via patterns 914a and 915a, a set of via patterns 910, conductive feature patterns 906a and 907a, the set of conductive feature patterns 520, and the power rail patterns 522b and 522c.

In comparison with layout design 500D of FIG. 5D, via patterns 914*a* and 915*a* are similar to corresponding via patterns 514*c* and 515*a*, conductive feature patterns 906*a* and 907*a* are similar to corresponding conductive feature patterns 506*a* and 507*a*, poly cut feature pattern 932*a* is similar to the poly cut feature pattern 532*a*, the set of via patterns 910 is similar to the set of via patterns 510, and dummy gate isolation pattern 904*a* is similar to dummy gate isolation pattern 504*a*, and similar detailed description is omitted for brevity.

The set of via patterns 910 includes at least one of via patterns 910*a*, 910*b*, . . . , 910*e* or 910*f*. In some embodiments, at least one of via patterns 910*a*, 910*b*, . . . , 910*e* or 910*f* is similar to corresponding via pattern 510*a*, 510*b*, . . . , 510*e* or 510*f*, and similar detailed description is omitted for brevity.

Layout design 900B includes a portion 904*a*2 of dummy gate isolation pattern 904*a*, a floating gate pattern 905*a*1, poly cut feature patterns 530*a*, 530*c*1, 530*c*2 and 932, via patterns 914*a* and 915*a*, a set of via patterns 910, conductive feature patterns 906*a* and 907*a*, the set of conductive feature patterns 520, and the power rail patterns 522*b* and 522*c*.

In comparison with layout design 500D, floating gate pattern 905*a*1 is similar to floating gate pattern 505*a*1, the portion 904*a*2 of dummy gate isolation pattern 904*a* is similar to the portion 504*a*2 of dummy gate isolation pattern 504*a*, and similar detailed description is omitted for brevity.

In comparison with layout design 900A of FIG. 9A, floating gate pattern 905*a*1 of layout design 900B of FIG. 9B replaces a portion 904*a*1 of the dummy gate isolation pattern 904 of layout design 900A of FIG. 9A, and similar detailed description is omitted for brevity. In some embodiments, floating gate pattern 905*a*1 is a part of a set of floating gate patterns 905.

In some embodiments, floating gate pattern 905*a*1 is a gate pattern that is configured as a floating gate. In some embodiments, floating gate pattern 905*a*1 does not correspond to a CPODE pattern.

In some embodiments, floating gate pattern 905*a*1 corresponds to regions of PMOS transistors of an integrated circuit, and remaining portion 904*a*2 of the dummy gate isolation pattern 904 corresponds to regions of NMOS transistors of the integrated circuit.

In some embodiments, floating gate pattern 905*a*1 corresponds to regions of NMOS transistors of an integrated circuit, and remaining portion 904*a*2 of the dummy gate isolation pattern 904 corresponds to regions of PMOS transistors of the integrated circuit.

As shown in FIGS. 9A-9B, dummy gate isolation pattern 904*a* is positioned between conductive feature patterns 906*a* and 907*a*. Dummy gate isolation pattern 904*a* is adjacent to conductive feature patterns 906*a* and 907*a*. Dummy gate isolation pattern 904*a* includes dummy gate isolation patterns 904*a*1 and 904*a*2. Conductive feature pattern 906*a* overlaps conductive feature pattern 520*c*. Via pattern 914*a* is between conductive feature pattern 906*a* and conductive feature pattern 520*c*. Conductive feature pattern 907*a* overlaps conductive feature pattern 520*c*. Via pattern 915*a* is between conductive feature pattern 907*a* and conductive feature pattern 520*c*. Conductive feature patterns 906*a* and 907*a* are configured to carry a same signal as each other. Stated differently, conductive feature patterns 906*a* and 907*a* are both coupled the conductive feature pattern 520*c*, and therefore are configured to carry a same signal as each other.

During execution of method 300A, each of the dummy gate isolation patterns in the set of dummy gate isolation patterns 504 and 904 are identified in operation 302. Afterwards, in operation 304, a portion of a dummy gate isolation pattern in the set of dummy gate isolation patterns 904 is replaced if the dummy gate isolation pattern satisfies at least replacement criterion 1 or replacement criterion 2.

In some embodiments, the set of dummy gate isolation patterns 904 do not satisfy replacement criterion 1.

In some embodiments, dummy gate isolation pattern 904*a* is between and adjacent to conductive feature patterns 906*a* and 907*a*, and conductive feature patterns 906*a* and 907*a* are configured to carry the same signal as each other, and therefore satisfy replacement criterion 2, and are modified by at least operation 304 of method 300A in generating layout designs 900B.

Returning to execution of method 300A, in operation 306, portion 904*a*1 of the dummy gate isolation pattern 904 is removed leaving the remaining portion 904*a*2 of dummy gate isolation pattern 904*a*. Afterwards, in operation 308, a floating gate pattern 905*a*1 is inserted where the portion 904*a*1 of the dummy gate isolation pattern 904 was located.

Afterwards, operation 310 is not performed since the poly cut feature pattern 932*a* is already positioned between floating gate pattern 905*a*1 and the remaining portion 904*a*2 of the dummy gate isolation pattern 904.

Afterwards, operation 312 is not performed since via pattern 915*a* is already positioned between the conductive feature pattern 520*c* and conductive feature pattern 907*a*.

Afterwards, operation 312 is not performed since conductive feature pattern 907*a* is already adjacent to the floating gate pattern 905*a*1.

Other variations of the execution of method 300A are within the scope of the present disclosure.

In some embodiments, layout designs 900A-900B achieves one or more of the benefits discussed above.

Other configurations, arrangements on other layout levels or quantities of elements in layout design 900A-900B are within the scope of the present disclosure.

FIGS. 10A-10B are diagrams of a corresponding layout design 1000A-1000B of an integrated circuit, in accordance with some embodiments.

FIG. 10A is a diagram of a layout design 1000A, in accordance with some embodiments. In some embodiments, layout design 1000A corresponds to the first layout design after operation 202 in method 200 (FIG. 2). In some embodiments, layout design 1000A corresponds to the first layout design prior to operation 320 of method 300B (FIG. 3B).

FIG. 10B is a diagram of a layout design 1000B, in accordance with some embodiments. In some embodiments, layout design 1000B corresponds to the revised first layout design after operation 206 in method 200 (FIG. 2). In some embodiments, layout design 1000B corresponds to the first layout design after operation 328 of method 300B (FIG. 3B).

Layout designs 1000A-1000B are a variation of layout design 500D, and similar detailed description is omitted for brevity. Layout designs 1000A-1000B correspond to layout designs of a pad cell.

Layout design 1000A includes the set of active region patterns 502, a set of gate patterns 1004, a set of conductive feature patterns 1020, a set of via patterns 1014 and a set of via patterns 1010.

In comparison with layout design 500D of FIG. 5D, the set of gate patterns 1004 are similar to the dummy gate isolation pattern 504 or 505, the set of via patterns 1014 are similar to the set of via patterns 514, the set of via patterns 1010 are similar to the set of via patterns 510, and the set of conductive feature patterns 1020 are similar to the set of conductive feature patterns 520, and similar detailed description is omitted for brevity.

The set of active region patterns 502 includes at least one of active region pattern 502*a* or 502*b*.

The set of gate patterns 1004 includes at least one of gate pattern 1004*a* or 1004*b*. In some embodiments, at least one of gate pattern 1004*a* or 1004*b* is similar to corresponding dummy gate isolation pattern 504*a* or 504*b*, and similar detailed description is omitted for brevity.

The set of via patterns 1010 includes at least one of via patterns 1010*a* or 1010*b*. In some embodiments, at least one of via patterns 1010*a* or 1010*b* is similar to corresponding via pattern 510*a* or 510*b*, and similar detailed description is omitted for brevity.

The set of via patterns 1014 includes at least via pattern 1014*a*. In some embodiments, at least via pattern 1014*a* is similar to via pattern 514*a*, and similar detailed description is omitted for brevity.

The set of conductive feature patterns 1020 includes at least one of conductive feature patterns 1020*a*, 1020*b* or 1020*c*. In some embodiments, at least one of conductive feature patterns 1020*a*, 1020*b* or 1020*c* is similar to corresponding conductive feature pattern 520*a* or 520*b*, and similar detailed description is omitted for brevity.

Layout design 1000B includes the set of active region patterns 502, gate pattern 1004*a*, a gate pattern 1005*b*, conductive feature pattern 1020*b*, conductive feature patterns 1021*a*-1021*b*, the set of via patterns 1014 and via pattern 1010*a*.

In comparison with layout design 500D, floating gate pattern 1005*b* is similar to gate pattern 505*a*1, and similar detailed description is omitted for brevity.

In comparison with layout design 1000A, floating gate pattern 1005*b* is similar to gate pattern 1004*b*, and conductive feature patterns 1021*a*-1021*b* are similar to conductive feature pattern 1020*a*, and similar detailed description is omitted for brevity.

In comparison with layout design 100A, layout design 100B does not include via pattern 1010*b*.

In comparison with layout design 1000A of FIG. 10A, floating gate pattern 1005*b* of layout design 1000B of FIG. 10B replaces the gate pattern 1004*b* of layout design 1000A of FIG. 10A, conductive feature patterns 1021*a*-1021*b* replace conductive feature pattern 1020*a*, and similar detailed description is omitted for brevity.

In some embodiments, floating gate pattern 1005*b* is a part of a set of floating gate patterns 1005. In some embodiments, conductive feature patterns 1021*a*-1021*b* are part of a set of conductive feature pattern.

In some embodiments, floating gate pattern 1005*b* is a gate pattern that is configured as a floating gate. In some embodiments, floating gate pattern 1005*b* does not correspond to a CPODE pattern.

In some embodiments, a first portion of gate pattern 1004*a* and a first portion of gate pattern 1004*b*/floating gate pattern 1005*b* corresponds to regions of PMOS transistors of an integrated circuit, and a second portion of gate pattern 1004*a* and a second portion of gate pattern 1004*b*/floating gate pattern 1005*b* corresponds to regions of NMOS transistors of the integrated circuit.

In some embodiments, a first portion of gate pattern 1004*a* and a first portion of gate pattern 1004*b*/floating gate pattern 1005*b* corresponds to regions of NMOS transistors of an integrated circuit, and a second portion of gate pattern 1004*a* and a second portion of gate pattern 1004*b*/floating gate pattern 1005*b* corresponds to regions of PMOS transistors of the integrated circuit.

In some embodiments, the first portion of gate pattern 1004*b* corresponds to a dummy transistor 1040*a* that has a drain and source region coupled to VDD.

In some embodiments, the second portion of gate pattern 1004*b* corresponds to a dummy transistor 1050*c* that has a drain and source region coupled to VSS.

In some embodiments, a first portion of gate pattern 1004*a* corresponds to a transistor 1050*b* that has a drain or source region coupled to VSS.

In some embodiments, a second portion of gate pattern 1004*a* corresponds to a transistor 1050*a* that has a drain or source region coupled to VDD.

In some embodiments, the first portion of floating gate pattern 1005*b* corresponds to a dummy transistor 1040*b* has a floating gate that has a drain and source region coupled to VDD.

As shown in FIG. 10A, gate pattern 1004*b* is not electrically coupled to conductive feature pattern 1020*c*.

As shown in FIG. 10B, gate pattern 1005*b* is not electrically coupled to conductive feature pattern 1020*c*. Conductive feature pattern 1020*c* is configured as a different routing resource from conductive feature pattern 1020*b*.

As shown in FIG. 10A, gate pattern 1004*b* of the dummy transistor 1040*a* is electrically coupled to at least conductive feature pattern 1020*a* by via pattern 1010*b*. Gate pattern 1004*b* of the dummy transistor 1040*a* overlaps active region pattern 502*a* and active region pattern 502*b*. Conductive feature pattern 1020*a* overlaps gate pattern 1004*b*. Via pattern 1010*b* is between conductive feature pattern 1020*a* and gate pattern 1004*b*.

As shown in FIG. 10B, floating gate pattern 1005*b* of the dummy transistor 1040*b* is not electrically coupled to conductive feature patterns 1021*a*-1021*b*. Floating gate pattern 1005*b* of the dummy transistor 1040*b* overlaps active region pattern 502*a* and active region pattern 502*b*. Conductive feature pattern 1021*a* does not overlap floating gate pattern 1005*b*. Conductive feature pattern 1021*b* overlaps floating gate pattern 1005*b*.

During execution of method 300B, each of the gate patterns in the set of gate patterns 1004 that correspond to dummy transistors are identified in operation 320. For example, gate pattern 1004*b* corresponds to dummy transistor 1040*a*, and is thus identified in operation 320. However, gate pattern 1004*a* does not correspond to a dummy transistor.

Afterwards, in operation 322, gate pattern 1004*b* is changed to floating gate pattern 1005*b* if the gate pattern 1004*b* satisfies replacement criterion 3. In some embodiments, gate pattern 1004*b* of the dummy transistor 1040*a* is electrically coupled to at least conductive feature pattern 1020*a* by via pattern 1010*b*, and therefore satisfies replacement criterion 3, and is modified by at least operation 322 of method 300B in generating layout design 1000B.

Returning to execution of method 300B, in operation 324, via pattern 1010*b* is removed thereby electrically decoupling gate pattern 1004*b* from conductive feature pattern 1020*a*. Thus, after operation 324, gate pattern 1005*a* is changed to floating gate pattern 1005*b*.

Afterwards, in operation 326, conductive feature pattern 1020*a* is divided into a plurality of conductive feature patterns 1021*a* and 1021*b*, and conductive feature pattern 1021*b* is configured as a different routing resource from conductive feature pattern 1021*a*.

Afterwards, operation 328 is not performed since conductive feature pattern 1021*b* is already configured as a different routing resource.

Other variations of the execution of method 300B are within the scope of the present disclosure.

In some embodiments, layout designs 1000A-1000B achieves one or more of the benefits discussed above.

Other configurations, arrangements on other layout levels or quantities of elements in layout design 1000A-1000B are within the scope of the present disclosure.

FIGS. 11A-11B are diagrams of a corresponding layout design 1100A-1100B of an integrated circuit, in accordance with some embodiments.

FIG. 11A is a diagram of a layout design 1100A, in accordance with some embodiments. In some embodiments, layout design 1100A corresponds to the first layout design after operation 202 in method 200 (FIG. 2). In some embodiments, layout design 1100A corresponds to the first layout design prior to operation 320 of method 300B (FIG. 3B).

FIG. 11B is a diagram of a layout design 1100B, in accordance with some embodiments. In some embodiments, layout design 1100B corresponds to the revised first layout design after operation 206 in method 200 (FIG. 2). In some embodiments, layout design 1100B corresponds to the first layout design after operation 328 of method 300B (FIG. 3B).

Layout designs 1100A-1100B are a variation of layout design 500D, and similar detailed description is omitted for brevity. Layout designs 1100A-1100B correspond to layout designs of a decoupling cell.

Layout design 1100A includes the set of active region patterns 1102, a set of gate patterns 1104, a set of conductive feature patterns 1106 and 1120, a set of via patterns 1114 and a set of via patterns 1110.

In comparison with layout design 500D of FIG. 5D, the set of gate patterns 1104 are similar to the dummy gate isolation pattern 504 or 505, the set of via patterns 1114 are similar to the set of via patterns 514, the set of via patterns 1110 are similar to the set of via patterns 510, and the set of conductive feature patterns 1120 are similar to the set of conductive feature patterns 520, and the set of conductive feature patterns 1106 are similar to the set of conductive feature patterns 506 or 507, and similar detailed description is omitted for brevity.

The set of active region patterns 1102 includes at least one of active region pattern 1102a or 1102b. In some embodiments, at least one of active region pattern 1102a or 1102b is similar to corresponding active region pattern 502a or 502b, and similar detailed description is omitted for brevity.

The set of gate patterns 1104 includes at least one of gate pattern 1104a, 1104b or 1104c. In some embodiments, at least one of gate pattern 1104a, 1104b or 1104c is similar to corresponding dummy gate isolation pattern 504a, 504b or 504c, and similar detailed description is omitted for brevity.

The set of conductive feature patterns 1106 includes the set of conductive feature patterns 1106a, 1106b, ..., 1106g or 1106h. In some embodiments, at least one of conductive feature patterns 1106a, 1106b, ..., 1106g or 1106h is similar to one of conductive feature patterns 506a or 507a, and similar detailed description is omitted for brevity.

The set of via patterns 1110 includes at least one of via patterns 1110a, 1110b, 1110c or 1110d. In some embodiments, at least one of via patterns 1110a, 1110b, 1110c or 1110d is similar to one or more of via pattern 510a or 510b, and similar detailed description is omitted for brevity.

The set of via patterns 1114 includes at least via pattern 1114a or 1114b. In some embodiments, at least one via pattern 1114a or 1114b is similar to corresponding via pattern 514a or 514b, and similar detailed description is omitted for brevity.

The set of conductive feature patterns 1120 includes at least one of conductive feature patterns 1120a or 1120b. In some embodiments, at least one of conductive feature patterns 1120a or 1120b is similar to corresponding conductive feature pattern 520a or 520b, and similar detailed description is omitted for brevity.

Layout design 1100B includes the set of active region patterns 1102, gate pattern 1104b, floating gate patterns 1105a and 1105c, conductive feature pattern 1120b, conductive feature patterns 1120a, the set of via patterns 1114 and via pattern 1104b.

In comparison with layout design 500D, floating gate patterns 1105a and 1105c are similar to gate pattern 505a1, and similar detailed description is omitted for brevity.

In comparison with layout design 1100A, floating gate patterns 1105a and 1105c are similar to corresponding gate patterns 1104a and 1104c, and similar detailed description is omitted for brevity.

In comparison with layout design 1100A, layout design 1100B does not include via patterns 1110a, 1110b and 1110c.

In comparison with layout design 1100A of FIG. 11A, floating gate patterns 1105a and 1105c of layout design 1100B of FIG. 11B replaces the gate patterns 1104a and 1104c of layout design 1100A of FIG. 11A, and similar detailed description is omitted for brevity.

In some embodiments, floating gate patterns 1105a and 1105c are part of a set of floating gate patterns 1105.

In some embodiments, floating gate patterns 1105a and 1105c are gate patterns that is are configured as floating gates. In some embodiments, floating gate patterns 1105a and 1105c do not correspond to CPODE patterns.

In some embodiments, a first portion of gate pattern 1104a/floating gate pattern 1105a, a first portion of gate pattern 1104b and a first portion of gate pattern 1104c/floating gate pattern 1105c corresponds to regions of PMOS transistors of an integrated circuit, and a second portion of gate pattern 1104a/floating gate pattern 1105a, a second portion of gate pattern 1104b and a second portion of gate pattern 1104c/floating gate pattern 1105c corresponds to regions of NMOS transistors of an integrated circuit.

In some embodiments, a first portion of gate pattern 1104a/floating gate pattern 1105a, a first portion of gate pattern 1104b and a first portion of gate pattern 1104c/floating gate pattern 1105c corresponds to regions of NMOS transistors of an integrated circuit, and a second portion of gate pattern 1104a/floating gate pattern 1105a, a second portion of gate pattern 1104b and a second portion of gate pattern 1104c/floating gate pattern 1105c corresponds to regions of PMOS transistors of an integrated circuit.

In some embodiments, the first portion of gate pattern 1104a corresponds to a dummy transistor 1140a that has a drain and source region coupled to VDD.

In some embodiments, the second portion of gate pattern 1104a corresponds to a transistor 1140d that has a drain or source region coupled to VSS.

In some embodiments, the first portion of gate pattern 1104c corresponds to a dummy transistor 1140c that has a drain and source region coupled to VDD.

In some embodiments, the second portion of gate pattern 1104c corresponds to a transistor 1140f that has a drain or source region coupled to VSS.

In some embodiments, the first portion of floating gate pattern 1105a corresponds to a dummy transistor 1140a has a floating gate that has a drain and source region coupled to VDD.

In some embodiments, the second portion of floating gate pattern 1105a corresponds to a dummy transistor 1140d has a floating gate that has a drain or source region coupled to VSS.

In some embodiments, the first portion of floating gate pattern 1105c corresponds to a dummy transistor 1140c has a floating gate that has a drain and source region coupled to VDD.

In some embodiments, the second portion of floating gate pattern 1105c corresponds to a dummy transistor 1140c has a floating gate that has a drain or source region coupled to VSS.

As shown in FIG. 11A, gate patterns 1104a, 1104b, 1104c of the corresponding dummy transistors 1140a, 1140b, 1140c are electrically coupled to at least conductive feature pattern 1120a by corresponding via patterns 1110a, 1110b, 1110c. Conductive feature pattern 1120a overlaps gate patterns 1104a, 1104b, 1104c. Via patterns 1110a, 1110b, 1110c are between conductive feature pattern 1120a and corresponding gate patterns 1104a, 1104b, 1104c.

As shown in FIG. 11B, floating gate patterns 1105a and 1105c of corresponding dummy transistors 1140a and 1140c are not electrically coupled to conductive feature pattern 1020a, and gate pattern 1104b1 is not electrically coupled to conductive feature pattern 1020a.

Conductive feature pattern 1120a overlaps floating gate patterns 1105a and 1105c and gate pattern 1104b1.

During execution of method 300B, each of the gate patterns in the set of gate patterns 1104 that correspond to dummy transistors are identified in operation 320. For example, gate pattern 1104a corresponds to dummy transistor 1140a, gate pattern 1104b1 corresponds to dummy transistor 1140b, gate pattern 1104c corresponds to dummy transistor 1140c, and are thus identified in operation 320. However, the second portion 1104b2 of gate pattern 1104b does not correspond to a dummy transistor.

Afterwards, in operation 322, gate pattern 1104a is changed to floating gate pattern 1105a if the gate pattern 1104a satisfies replacement criterion 3. In some embodiments, gate pattern 1104a of the dummy transistor 1140a is electrically coupled to at least conductive feature pattern 1120a by via pattern 1110a, and therefore satisfies replacement criterion 3, and is modified by at least operation 322 of method 300B in generating layout design 1100B.

Afterwards, in operation 322, gate pattern 1104c is changed to floating gate pattern 1105c if the gate pattern 1104c satisfies replacement criterion 3. In some embodiments, gate pattern 1104c of the dummy transistor 1140c is electrically coupled to at least conductive feature pattern 1120c by via pattern 1110c, and therefore satisfies replacement criterion 3, and is modified by at least operation 322 of method 300B in generating layout design 1100B.

Returning to execution of method 300B, in operation 324, via pattern 1110a is removed thereby electrically decoupling gate pattern 1104a from conductive feature pattern 1120a, and via pattern 1110c is removed thereby electrically decoupling gate pattern 1104c from conductive feature pattern 1120a. Thus, after operation 324, gate pattern 1104a is changed to floating gate pattern 1105a, and gate pattern 1104c is changed to floating gate pattern 1105c. Similarly, via pattern 1110b is removed thereby electrically decoupling gate pattern 1104b from conductive feature pattern 1120a. As shown in FIG. 11B, a poly cut feature pattern 1132a is added to layout design 1100B to divide gate pattern 1104b into gate pattern 1104b1 and gate pattern 1104b2. In some embodiments, the poly cut feature pattern 1132a is added to layout design 1100B after execution of operation 324. In some embodiments, the operation of adding the poly cut feature pattern 1132a (1132) to layout design 1100B is similar to operation 310 of method 300A, and similar description is omitted. In some embodiments, poly cut feature pattern 1132a is not included in layout design 1100B, and gate pattern 1104b is not divided into different portions.

Afterwards, operation 326 is not performed since conductive feature pattern 1020a is not divided into a plurality of conductive feature patterns that are configured as a different routing resource. Stated differently, operation 326 is not performed since operation 328 is performed.

Afterwards, in operation 328, conductive feature pattern 1120a is configured as a different routing resource as a single conductive feature pattern.

Other variations of the execution of method 300B are within the scope of the present disclosure.

In some embodiments, layout designs 1100A-1100B achieves one or more of the benefits discussed above.

Other configurations, arrangements on other layout levels or quantities of elements in layout design 1100A-1100B are within the scope of the present disclosure.

FIGS. 12A-12B are a flowchart of a method of manufacturing an IC device, in accordance with some embodiments. It is understood that additional operations may be performed before, during, and/or after the methods 1200A-1200B depicted in FIGS. 12A-12B, and that some other processes may only be briefly described herein.

In some embodiments, other order of operations of methods 1200A-1200B is within the scope of the present disclosure. Methods 1200A-1200B include exemplary operations, but the operations are not necessarily performed in the order shown. Operations may be combined, divided, added, replaced, changed order, and/or eliminated as appropriate, in accordance with the spirit and scope of disclosed embodiments. In some embodiments, one or more of the operations of at least method 1200A-1200B, 1300 is not performed.

In some embodiments, method 1200A is an embodiment of operations 104 and 106 of method 100. In some embodiments, the method 1200A is usable to manufacture or fabricate at least integrated circuit 600 or 1600, or an integrated circuit with similar features as at least layout design 500A-500D, 700A-700B, 800A-800B, 1200A-1200B, 1000A-1000B or 1100A-1100B.

In operation 1202 of method 1200A, a set of active regions 602 or 1606 of a set of transistors is formed in a front-side of a substrate 690 or 1602. In some embodiments, the set of transistors of method 1200A-1200B includes one or more transistors in the set of active regions 602 or 1606. In some embodiments, the set of transistors of method 1200A includes one or more transistors described herein.

In some embodiments, the set of active regions of method 1200A-1200B includes at least one or more active regions similar to at least the set of active region patterns 502 or 1102.

In some embodiments, operation 1202 further includes at least operation 1202a. In some embodiments, operation 1202a (not shown) includes fabricating source and drain regions of the set of transistors in a first well. In some embodiments, the first well comprises p-type dopants. In some embodiments, the p-type dopants include boron, aluminum or other suitable p-type dopants. In some embodiments, the first well comprises an epi-layer grown over a substrate. In some embodiments, the epi-layer is doped by adding dopants during the epitaxial process. In some embodiments, the epi-layer is doped by ion implantation after the epi-layer is formed. In some embodiments, the first well is formed by doping the substrate. In some embodiments, the doping is performed by ion implantation. In some embodiments, the first well has a dopant concentration ranging from $1 \times 10^{12}$ atoms/cm$^3$ to $1 \times 10^{14}$ atoms/cm$^3$. Other dopant concentrations are in the scope of the present disclosure.

In some embodiments, the first well comprises n-type dopants. In some embodiments, the n-type dopants include phosphorus, arsenic or other suitable n-type dopants. In some embodiments, the n-type dopant concentration ranges from about $1 \times 10^{12}$ atoms/cm$^3$ to about $1 \times 10^{14}$ atoms/cm$^3$. Other dopant concentrations are in the scope of the present disclosure.

In some embodiments, the formation of the source/drain features includes, a portion of the substrate is removed to form recesses at an edge of spacers, and a filling process is then performed by filling the recesses in the substrate. In some embodiments, the recesses are etched, for example, a wet etching or a dry etching, after removal of a pad oxide layer or a sacrificial oxide layer. In some embodiments, the etch process is performed to remove a top surface portion of the active region adjacent to an isolation region, such as an STI region. In some embodiments, the filling process is performed by an epitaxy or epitaxial (epi) process. In some embodiments, the recesses are filled using a growth process which is concurrent with an etch process where a growth rate of the growth process is greater than an etch rate of the etch process. In some embodiments, the recesses are filled using a combination of growth process and etch process. For example, a layer of material is grown in the recess and then the grown material is subjected to an etch process to remove a portion of the material. Then a subsequent growth process is performed on the etched material until a desired thickness of the material in the recess is achieved. In some embodiments, the growth process continues until a top surface of the material is above the top surface of the substrate. In some embodiments, the growth process is continued until the top surface of the material is co-planar with the top surface of the substrate. In some embodiments, a portion of the first well is removed by an isotropic or an anisotropic etch process. The etch process selectively etches the first well without etching a gate structure and any spacers. In some embodiments, the etch process is performed using a reactive ion etch (RIE), wet etching, or other suitable techniques. In some embodiments, a semiconductor material is deposited in the recesses to form the source/drain features. In some embodiments, an epi process is performed to deposit the semiconductor material in the recesses. In some embodiments, the epi process includes a selective epitaxy growth (SEG) process, CVD process, molecular beam epitaxy (MBE), other suitable processes, and/or combination thereof. The epi process uses gaseous and/or liquid precursors, which interacts with a composition of substrate. In some embodiments, the source/drain features include epitaxially grown silicon (epi Si), silicon carbide, or silicon germanium. Source/drain features of the IC device associated with the gate structure are in-situ doped or undoped during the epi process in some instances. When source/drain features are undoped during the epi process, source/drain features are doped during a subsequent process in some instances. The subsequent doping process is achieved by an ion implantation, plasma immersion ion implantation, gas and/or solid source diffusion, other suitable processes, and/ or combination thereof. In some embodiments, source/drain features are further exposed to annealing processes after forming source/drain features and/or after the subsequent doping process.

In operation 1204 of method 1200A, a set of gate structures of the set of transistors is formed on a first level. In some embodiments, the set of gate structures of method 1200A includes gate regions that include the set of gate structures 604, 605 or 640.

In some embodiments, method 1200A is a gate-last process, and the set of gate structures of operation 1204 corresponds to a set of dummy gate structures.

In some embodiments, method 1200A is a gate-first process, and the set of gate structures operation 1204 corresponds to a set of gates, and operation 1204 is performed before at least portions of operation 1202.

In some embodiments, the set of gates of method 1200A includes one or more gate regions that are similar to the set of dummy gate isolation patterns 504, 804 or 904, the set of gate patterns 505, 540, 704, 805, 905, 1004 or 1104 or at least portions of one or more of floating gate pattern 1005b, floating gate pattern 1105a or floating gate pattern 1105c. In some embodiments, the first level of method 1200A-1200B includes the POLY level.

In some embodiments, the gate region is between the drain region and the source region. In some embodiments, the gate region is over the first well and the substrate. In some embodiments, fabricating the gate regions of operation 1206 includes performing one or more deposition processes to form one or more dielectric material layers. In some embodiments, a deposition process includes a chemical vapor deposition (CVD), a plasma enhanced CVD (PECVD), an atomic layer deposition (ALD), or other process suitable for depositing one or more material layers. In some embodiments, fabricating the gate regions includes performing one or more deposition processes to form one or more conductive material layers. In some embodiments, fabricating the gate regions includes forming gate electrodes or dummy gate electrodes. In some embodiments, fabricating the gate regions includes depositing or growing at least one dielectric layer, e.g., gate dielectric. In some embodiments, gate regions are formed using a doped or non-doped polycrystalline silicon (or polysilicon). In some embodiments, the gate regions include a metal, such as Al, Cu, W, Ti, Ta, TiN, TaN, NiSi, CoSi, other suitable conductive materials, or combinations thereof.

In operation 1206 of method 1200A, a first portion of a first gate structure of the set of gate structures is replaced with a dummy gate. In some embodiments, the dummy gate of method 1200A includes dummy gate 1624 of FIG. 16D or gate structure 604a2 in FIG. 6B. In some embodiments, method 1200B is an embodiment of operations 1206 and 1208.

In some embodiments, the first portion of the first gate structure of the set of gate structures of method 1200A includes portions of the set of gate structures 604 or dummy structure 1612.

In some embodiments, the first portion of the first gate structure of the set of gate structures of method 1200A includes gate structure 604a1.

In some embodiments, the dummy gate of method 1200A includes one or more gate regions that are similar to the set of dummy gate isolation patterns 504, 804 or 904, the set of gate patterns 505, 540, 704, 805, 905, 1004 or 1104 or at least portions of one or more of floating gate pattern 1005b, floating gate pattern 1105a or floating gate pattern 1105c.

In some embodiments, the first portion of the first gate structure of the set of gate structures of method 1200A includes one or more gate regions that are similar to the set of dummy gate isolation patterns 504, 804 or 904, the set of gate patterns 505, 540, 704, 805, 905, 1004 or 1104 or at least portions of one or more of floating gate pattern 1005*b*, floating gate pattern 1105*a* or floating gate pattern 1105*c*.

In operation 1208 of method 1200A, a second portion of the first gate structure of the set of gate structures is replaced with a floating gate of a set of gates. In some embodiments, the floating gate corresponds to a floating dummy gate of a floating gate transistor. In some embodiments, the floating gate and the dummy gate are separated from each other in the second direction Y.

In some embodiments, the floating gate of a set of gates of method 1200A includes gate structure 605*a*1 in FIG. 6B. In some embodiments, the set of gates of method 1200A includes the set of gates 605 or 640.

In some embodiments, the set of gates of method 1200A includes one or more gate regions that are similar to the set of gate patterns 540, 505, 704, 805 or 905, the set of gate patterns 1004 or 1104 or at least portions of one or more of floating gate pattern 1005*b*, floating gate pattern 1105*a* or floating gate pattern 1105*c*.

In some embodiments, the second portion of the first gate structure of the set of gate structures of method 1200A includes one or more gate regions that are similar to at least one of dummy gate isolation pattern 504*a*1, dummy gate isolation pattern 804*a*1 or dummy gate isolation pattern 904*a*1.

In some embodiments, method 1200A is a gate-last process, and each of the gate structures in the set of gates is replaced in operation 1208. In some embodiments, method 1200A is a gate-first process, and operation 1208 is not performed. In some embodiments, when method 1200A is a gate-first process, and operation 1208 is not performed, then the remaining portion (e.g., second portion) of the first gate structure in operation 1206 corresponds to the floating gate of method 1200A.

In operation 1210 of method 1200A, a cut process is performed to remove portions of the set of gates. In some embodiments, the removed portions of the set of gates of method 1200A includes features similar to at least the removed gate portions 630 or 632 of gate structure. In some embodiments, the removed portions of the set of gates of method 1200A includes features in the POLY level.

In some embodiments, the removed portions of the set of gates of method 1200A includes one or more features similar to at least the set of poly cut feature patterns 530, 532 or 932.

In operation 1212 of method 1200A, a first conductive material is deposited over source/drain regions of the set of transistors on a first level thereby forming a first set of conductors of the set of transistors. In some embodiments, the first level of method 1200A includes the MD level or the POLY level.

In some embodiments, the source/drain regions of the set of transistors of method 1200A-1200B includes the source/drain regions of one or more transistors in the set of active regions 602 or 1606. In some embodiments, the first set of conductors of method 1200A include at least the set of conductors 606 or 607. In some embodiments, the first set of conductors of method 1200A includes features in the MD level.

In some embodiments, the first set of conductors of method 1200A includes at least one or more conductors similar to at least the set of conductive feature patterns 506, 507, 706, 906, 907 or 1106.

In operation 1214 of method 1200A, a first set of vias and a second set of vias are formed.

In some embodiments, the first set of vias of method 1200A are in the VD level. In some embodiments, the first set of vias of method 1200A includes at least the set of vias 614, 615, 616.

In some embodiments, the first set of vias of method 1200A includes one or more features similar to at least the set of via patterns 514, 515, 516, 814, 914, 915, 1014 or 1114.

In some embodiments, the second set of vias of method 1200 are in the VG level. In some embodiments, the second set of vias of method 1200A includes at least the set of vias 610 or 612.

In some embodiments, the second set of vias of method 1200A includes one or more features similar to at least the set of via patterns 510, 512, 810, 910, 1010 or 1110.

In some embodiments, the first set of vias are formed over the first set of contacts. In some embodiments, the second set of vias are formed over the set of gates.

In some embodiments, operation 1214 includes forming a first and second set of self-aligned contacts (SACs) in the insulating layer over the front-side of the wafer. In some embodiments, the first and second set of vias are electrically coupled to at least the set of transistors.

In operation 1216 of method 1200A, a second conductive material is deposited on a third level thereby forming a second set of conductors and a set of power rails. In some embodiments, the third level of method 1200A includes the M0 layer. In some embodiments, operation 1216 includes at least depositing a set of conductive regions over the front-side of the integrated circuit.

In some embodiments, the second set of conductors of method 1200A includes one or more portions of at least the set of conductors 620 or 621. In some embodiments, the second set of conductors of method 1200A includes at least one or more conductors similar to at least the set of conductive feature patterns 520 or 521.

In some embodiments, the set of power rails of method 1200A includes one or more portions of at least the set of power rails 622. In some embodiments, the second set of power rails of method 1200 includes at least one or more power rails similar to at least the set of power rails patterns 522.

In some embodiments, one or more of operations 1204, 1206, 1208, 1210, 1212, 1214 or 1216 of method 1200A include using a combination of photolithography and material removal processes to form openings in an insulating layer (not shown) over the substrate. In some embodiments, the photolithography process includes patterning a photoresist, such as a positive photoresist or a negative photoresist. In some embodiments, the photolithography process includes forming a hard mask, an antireflective structure, or another suitable photolithography structure. In some embodiments, the material removal process includes a wet etching process, a dry etching process, an RIE process, laser drilling or another suitable etching process. The openings are then filled with conductive material, e.g., copper, aluminum, titanium, nickel, tungsten, or other suitable conductive material. In some embodiments, the openings are filled using CVD, PVD, sputtering, ALD or other suitable formation process.

In some embodiments, the set of conductors 606 or 607 are positioned in an upper metal layer (e.g., metal-1, metal-3, etc.), and therefore via 614*c* and the set of via 615 are positioned between other metal layers, and method 1200A further includes one or more additional operations similar to at least one of operations 1214 or 1216, and similar detailed description is omitted.

FIG. 12B is a flowchart of a method 1200B of manufacturing an IC device 1600, in accordance with some embodiments.

In some embodiments, method 1200B is an embodiment of at least one of operation 1206 or 1208 of method 1200A.

In some embodiments, the method 1200B is usable to manufacture or fabricate at least integrated circuit 1600. FIGS. 16A-16D are corresponding cross-sectional views of a semiconductor device 1600, in accordance with some embodiments.

Figures 16A, 16B:
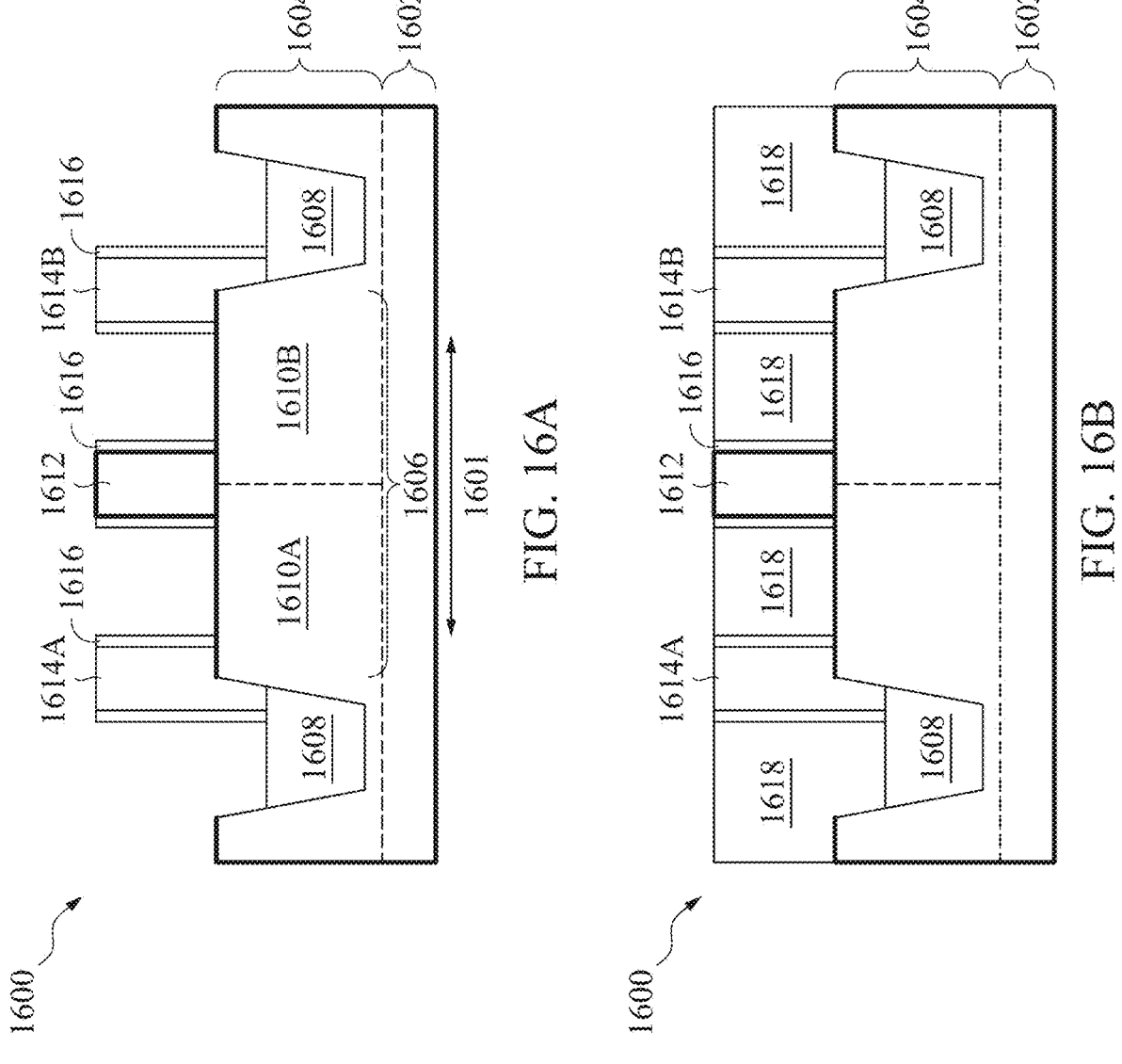
FIGS. 16A-16D are corresponding cross-sectional views of a semiconductor device, in accordance with some embodiments.

FIG. 16A is a cross-sectional view of semiconductor device 1600 before operation 1220 in accordance with one or more embodiments.

In some embodiments, FIGS. 16A-16D are corresponding cross-sectional views of an intermediary version of the corresponding portion 600D of integrated circuit 600 as intersected by plane B-B'. Stated differently, semiconductor device 1600 corresponds to a version of corresponding portion 600D of integrated circuit 600 at various stages of fabrication in accordance with one or more embodiments.

Semiconductor device 1600 includes a region 1601. In some embodiments, region 1601 corresponds to portion 600D of integrated circuit 600.

Semiconductor device 1600 includes a substrate 1602. In some embodiments, semiconductor device 1600 further includes a semiconductor strip 1604. Semiconductor strip 1604 extends from substrate 1602. In some embodiments, substrate 1602 is free of semiconductor strip 1604 and therefore has a planar top surface. In at least one embodiment, substrate 1602 is a silicon substrate. In some embodiments, substrate 1602 is a silicon on insulator layer (SOI) substrate, or a silicon on sapphire (SOS) substrate. Substrate 1602 includes a suitable elemental semiconductor, such as germanium or diamond; a suitable compound semiconductor, such as silicon carbide, gallium nitride, gallium arsenide, or indium phosphide; or a suitable alloy semiconductor, such as silicon germanium, silicon tin, aluminum gallium arsenide, or gallium arsenide phosphide. In some embodiments, substrate 1602 and semiconductor strip 1604 are made of a same material. In some embodiments, substrate 1602 and semiconductor strip 1604 are made of different materials.

Substrate 1602 includes an active region 1606 and insulating features 1608. In some embodiments, insulating features 1608 are called isolation features or inactive regions. The insulating features are shallow trench isolation (STI), field oxide (FOX), or other suitable electrically insulating structures. Insulating features 1608 electrically isolate active region 1606 from other areas of semiconductor strip 1604. In at least one example, the formation of insulating features 1608 includes a photolithography process, an etch process to form trenches in semiconductor strip 1604 or substrate 1602, and a deposition process to fill the trenches with one or more dielectric materials. In some embodiments, the formation of insulating features 1608 includes another STI procedure or local oxidation of silicon (LOCOS).

In some embodiments, substrate 1602 does not include insulating features 1608. In some embodiments, the insulating features 1608 are not located directly below the dummy gates 1614A and 1614B. In some embodiments, the insulating features 1608 are shifted towards the dummy gate 1612, and dummy gates 1614A and 1614B correspond to functional transistors (e.g., one or more functional transistors in integrated circuit 600 or similar to transistor 1050a, 1050b, 1050c, 1040b or 1140a-11400.

Active region 1606 is between insulating features 1608 in the first direction X. Semiconductor strip 1604 is between insulating features 1608 in the second direction Y perpendicular to a plane including the first direction. An upper portion of semiconductor strip 1604 protrudes above insulating features 1608. In some embodiments, when substrate 1602 is free of semiconductor strip 1604, insulating features 1608 is in substrate 1602 and a top surface of insulating features 1608 is substantially coplanar with a top surface of substrate 1602. In some embodiments, active region 1606 includes a first well region 1610A and a second well region 1610B disposed in semiconductor strip 1604 or substrate 1602 and adjacent to insulating features 1608. The formation of the well regions 1610A and 1610B includes an implantation process. In some embodiments, active region 1606 includes a single well region. In some embodiments, active region 1606 is free of any well region.

Dummy structures 1612, 1614A and 1614B are on a top surface of semiconductor strip 1604. In some embodiments, dummy structure 1612 corresponds to gate 604a2 of integrated circuit 600.

In some instances, dummy structures 1612, 1614A and 1614B are on the top surface of substrate 1602 when substrate 1602 is free of semiconductor strip 1604. Dummy structures 1612, 1614A and 1614B are also called dummy gate structures, in some instances. Dummy structures 1612, 1614A and 1614B are at least partially on active region 1606. Dummy structure 1612 is completely on active region 1606. Dummy structures 1614A and 1614B are partially on active region 1606 and partially on insulating features 1608. In some embodiments, dummy structures 1614A and 1614B are completely on insulating features 1608. In some embodiments, dummy structures 1614A and 1614B are completely on active region 1606. When active region 1606 includes the first well region 1610A and the second well region 1610B, dummy structure 1612 substantially aligns with a middle line at an interface of the first well region 1610A and the second well region 1610B. Spacers 1616 are along sidewalls of each of dummy structures 1612, 1614A and 1614B.

In some embodiments, dummy structures 1614A and 1614B do not function as a gate electrode, but are used to protect an edge of a transistor. Because dummy structures 1614A and 1614B are formed on an edge of active region 1606 or an edge of a cell, dummy structures 1614A and 1614B correspond to a poly-on-diffusion-edge (PODE) pattern. Because dummy structure 1612 is formed on a connected edge of two well regions or a common edge of two cells, dummy structure 1612 corresponds to a continuous poly-on-diffusion-edge (CPODE) pattern. For example, dummy structure 1612 is on first well region 1610A and second well region 1610B and aligned with a middle line of the two abutted well regions. In some embodiments, dummy structure 1612 is offset from the middle line of first well region 1610A and second well region 1610B. In an integrated circuit (IC) layout, the PODE pattern is schematically indicated using a label "PODE" and the CPODE pattern is schematically indicated using a label "CPODE." In some embodiments, PODE and CPODE patterns are formed of a same material, by using a same photomask, such as poly (polysilicon) patterns. In such embodiments, the poly patterns, the PODE patterns, and the CPODE patterns, are formed in a same layer. In some embodiments, the PODE patterns and the CPODE patterns are formed in a same layer, but are formed in a different layer from the poly patterns. In some embodiments, PODE patterns and poly patterns are formed in a same layer, but are formed in a different layer from CPODE patterns. In some embodiments, PODE and CPODE patterns are merged with one or more transistors in a standard cell layout to achieve a higher density and smaller corner variations such as mobility variations caused by process variations for cells placed at different locations on a same chip for chips placed at different locations on a same wafer. Corner variations are the result of non-uniformities in a manufacturing process which result in devices having variations in performance characteristics.

In some embodiments, dummy structures 1612, 1614A and 1614B are formed simultaneously. In a gate-last or "replacement gate" methodology, dummy structures 1612, 1614A and 1614B, also called sacrificial gate structures, are initially formed, various processes associated with semiconductor device 1600 are performed, and the dummy materials of dummy structures 1612, 1614A and 1614B are subsequently removed and replaced with one or more materials. In some embodiments, dummy structures 1612, 1614A and 1614B include a gate dielectric and/or a gate electrode.

For example, the gate dielectric is silicon dioxide. The silicon dioxide is a thermally grown oxide, in some instances. In some embodiments, the gate dielectric is a high dielectric constant (high-k; HK) material. A high-k dielectric material has a dielectric constant higher than that of silicon dioxide. In some embodiments, the gate electrode includes polycrystalline-silicon (poly-Si), polycrystalline silicon-germanium (poly-SiGe), metallic nitride, metallic silicide, metallic oxide, metal, and/or other suitable layers. The formation of the gate electrode includes a deposition process and a subsequent etch process. In some embodiments, dummy structures 1612, 1614A and 1614B further include a hard mask layer over the gate electrode. In some embodiments, dummy structures 1612, 1614A and 1614B are formed in a gate-first methodology or a hybrid process of gate-last and gate-first methodologies.

Spacers 1616 are along sidewalls of dummy structures 1612, 1614A and 1614B. Spacers 1616 include a dielectric material such as silicon oxide, silicon nitride, silicon oxynitride, silicon carbide, or combinations thereof. The formation of spacers 1616 includes a procedure including deposition and etch back processes, in some instances. In various embodiments, spacers 1616 are patterned by performing an isotropic or an anisotropic etch process to form D-shaped, I-shaped, or L-shaped spacers.

In operation 1220, an inter-layer dielectric (ILD) 1618 is deposited over at least the set of active regions 1602 or active region 1606. In some embodiments, operation 1220 includes the ILD being deposited over the dummy structures 1612, 1614A, 1614B and the spacers 1616.

In some embodiments, an etch stop layer, such as a contact etch stop layer (CESL), is deposited over the dummy structures and the spacers prior to depositing the ILD. The etch stop layer includes silicon oxide, silicon nitride, silicon oxynitride, silicon carbide, silicon oxycarbide, or another suitable material. In some embodiments, the formation of the etch stop layer includes a deposition process and then an etch back process. The etch stop layer is deposited by CVD, high density plasma CVD (HDP-CVD), spin-on coating, physical vapor deposition (PVD), atomic layer deposition (ALD), and/or other suitable method. Afterward, for example, the ILD is deposited by CVD, PVD, high density plasma (HDP), spin-on-dielectric (SOD) process, other suitable processes, and/or combination thereof. In some embodiments, the deposition process is followed by a planarization process, such as a chemical mechanical polishing (CMP) process, an etch process, or another suitable process.

FIG. 16B is a cross-sectional view of semiconductor device 1600 following operation 1220 in accordance with one or more embodiments.

After an etch stop layer (not shown) is formed over dummy structures 1612, 1614A and 1614B, and spacers 1616, an inter-layer dielectric (ILD) 1618 is deposited over the etch stop layer. In some embodiments, ILD 1618 includes an insulating material such as silicon oxide, silicon nitride, undoped silicate glass (USG), Boro-Silicate Glass (BSG), a low-k dielectric material, TEOS, other suitable materials, and/or combination thereof. In some embodiments, ILD 1618 is planarized to be coplanar with a top surface of dummy gate structures 1612, 1614A and 1614B. For example, ILD 1618 is planarized by using a chemical mechanical planarization (CMP) to remove portions of ILD 1618 over dummy structures 1612, 1614A and 1614B as well as other dummy gate structures in circuit region 1601. In some embodiments, the CMP is applied to remove the etch stop layer above the dummy structures 1612, 1614A and 1614B to expose the gate electrode or a hard mask layer over the gate electrode. In some embodiments, the CMP is used to remove hard mask layer on the gate electrode. In various embodiments, other planarization techniques are used, such as an etch process.

Returning to FIG. 12B, method 1200B continues with operation 1222 in which a dummy material of the first portion of the first gate structure is removed. In some embodiments, by removing material of the first portion of the first gate structure a first opening (e.g., 1622A) is formed in the ILD.

In some embodiments, the dummy material is a dummy polysilicon between a first active region and a second active region. The dummy material of the dummy structure is removed using a photolithography process and an etch process. During the photolithography process, the dummy structure corresponding to the CPODE pattern is exposed while the other dummy structures or gate structures are protected by a mask layer. In some instances, the dummy structures corresponding to the PODE pattern are exposed at the same time with the CPODE pattern. The etch process is performed to remove the gate dielectric and gate electrode to expose the top surface of the semiconductor strip or substrate. In some embodiments, the removal process is conducted using the same process as removing the active gate electrodes in circuit region 1601. In some embodiments, removing the dummy material comprises replacing dummy structures, other than the dummy structures corresponding to CPODE or PODE patterns, with active gate structures in a gate-last methodology.

A gate replacement process (e.g., operation 1208 in FIG. 12A) is then performed with a same process as with active gate electrodes in circuit region 1601. In some embodiments, the openings are filled with one or more layers. For example, a first dielectric layer is formed by using a thermal oxidation process. The first dielectric layer is formed by a deposition process, in some instances. In some embodiments, a second dielectric layer is formed on the first dielectric layer. The second dielectric layer includes a high-k dielectric material, in some instances. In some embodiments, the second dielectric layer has a U-shape or a rectangular shape. In some embodiments, a conductive layer is located within a cavity defined by the second dielectric layer. The conductive layer is disposed directly on the first dielectric layer, in some instances. In at least one embodiment, the conductive layer is tungsten. In some embodiments, the conductive layer includes different materials such as titanium, nickel, or tantalum, and has a work function suitable for a p-type device or an n-type device. After the gate replacement process, dummy structures 1614A and 1614B are formed as active gate structures 1620A and 1620B (e.g., operation 1208 in FIG. 12A). In some embodiments, the active gate structures 1620A and 1620B correspond to one or more gates of the set of gates 640 or 605.

In some embodiments, the active gate structures 1620A and 1620B correspond to one or more gates similar to the set of gate patterns 540, 505, 704, 805 or 905, the set of gate patterns 1004 or 1104 or at least portions of one or more of floating gate pattern 1005*b*, floating gate pattern 1105*a* or floating gate pattern 1105*c*.

Method 1200B continues with operation 1224 in which a portion of the first active region defined by the first opening is removed to form a first trench (e.g., trench 1622).

In some embodiments, operation 1224 includes removing a portion of the semiconductor strip under the dummy structure to form a trench 1622. In some embodiments, a trench is formed by removing a portion of the substrate under the dummy structure when the substrate is free of the semiconductor strip, i.e., the substrate has a planar top surface. The dummy structure and the portion of the semiconductor strip underneath are removed using one or multiple etch processes. In some embodiments, a removal process used to remove the dummy structure in operation 1222 and a removal process used to remove a portion of the semiconductor strip in operation 1224 is a continuous removal process. In some embodiments, the removal process used to remove the dummy structure in operation 1222 and the removal process used to remove the portion of the semiconductor strip in operation 1224 are separate removal processes. The trench corresponds to the CPODE pattern. In some embodiments, the trench separates the two abutted active regions. In some embodiments, the trench is between two abutted standard cells. The trench extends through at least the abutted two well regions of the two abutted active regions, i.e., a bottom surface of the trench is below a bottom surface of the abutted two well regions. The formation of the trench includes an etch process. During the etch process, at least a portion of the substrate is removed to define a trench between the neighboring active regions. In some embodiments, such etch process is called over-etching.

Figures 16C, 16D:
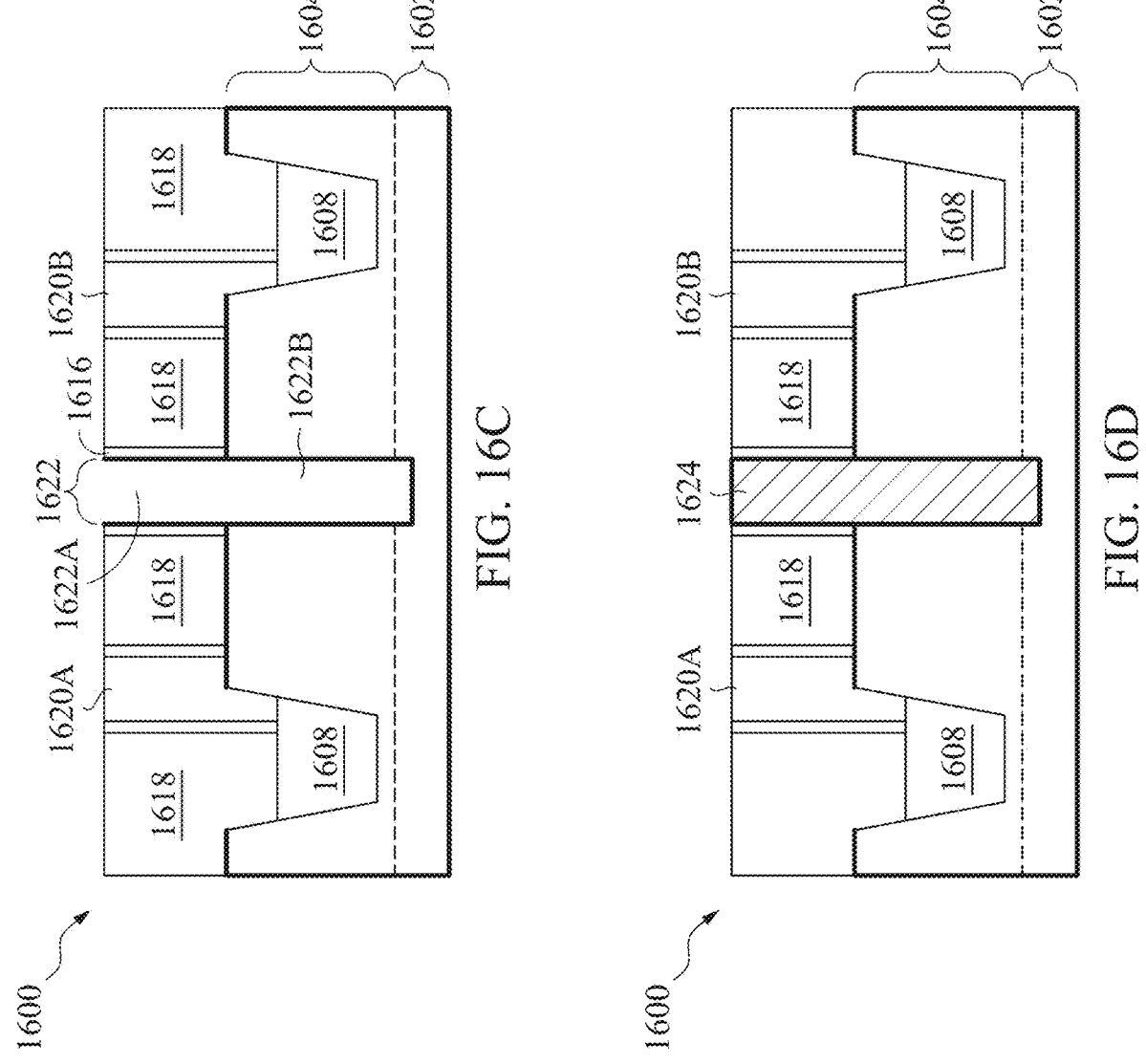

FIG. 16C is a cross-sectional view of semiconductor device 1600 following operation 1224 in accordance with one or more embodiments.

In some embodiments, FIG. 16C is a cross-sectional view during a gate-last process in which dummy structures 1614A and 1614B are removed to be replaced by active gate structures 1620A and 1620B (e.g., operation 1208 in FIG. 12A). The gate electrode and gate dielectric are removed from dummy structures 1614A and 1614B, resulting in openings (not shown) in ILD 1618. The openings are between spacers 1616. Removal of the gate electrode and gate dielectrics from dummy structures 1614A and 1614B includes a photolithography process and an etch process. The etch process includes a wet etching by using a solution such as $NH_4OH$, dilute HF, and/or other suitable etchant, or a dry etching by using a gas such as fluorine-based and/or chlorine-based etchants. In some embodiments, the gate dielectric remains in the openings and only the gate electrode is removed. For example, the gate dielectric is a high-k dielectric material such as $HfO_2$, $TiO_2$, HfZrO, $Ta_2O_3$, $HfSiO_4$, $ZrO_2$, $ZrSiO_2$, and/or other suitable materials. In at least one embodiment, the gate dielectric is subsequently removed from the openings by using a buffered oxide etchant (BOE) after the removal of the gate electrode.

A trench 1622 includes an upper portion 1622A and a lower portion 1622B. Upper portion 1622A is above the top surface of semiconductor strip 1604 and lower portion 1622B is below the top surface of semiconductor strip 1604.

Upper portion 1622A is similar to the openings formed by removing dummy structures 1614A and 1614B. In some embodiments, upper portion 1622A is formed simultaneously with the formation of the openings formed by removing dummy structures 1614A and 1614B. In some embodiments, dummy structures 1614A and 1614B are not removed. In some embodiments, upper portion 1622A is formed sequentially with the formation of the openings formed by removing dummy structures 1614A and 1614B. Lower portion 1622B is aligned with upper portion 1622A. In some embodiments, upper portion 1622A and lower portion 1622B are formed by a single etch process. In some embodiments, upper portion 1622A and lower portion 1622B are formed by multiple etch processes. For example, upper portion 1622A is removed by the same procedure as the openings formed by dummy structures 1614A and 1614B and lower portion 1622B is removed by a subsequent dry etching with a plasma source and an etchant gas. In some embodiments, the plasma source is an inductively coupled plasma (ICP), a transformer coupled plasma (TCP), an electron cyclotron resonance (ECR), a reactive ion etch (RIE), and/or other suitable techniques. In at least one embodiment, trench 1622 separates one active region into two active regions. To reduce or prevent a leakage current between two active regions, trench 1622 extends to a depth equal to or greater than a depth of well regions.

Returning again to FIG. 12B, method 1200B continues with operation 1226 in which the first trench is filled with a dielectric material to form a dielectric structure. In some embodiments, the dielectric structure corresponds to dummy gate structure 604*a*2.

In some embodiments, operation 1226 further includes filling the first opening with the dielectric material to form the dielectric structure. In some embodiments, the trench is filled with more than one dielectric material. The dielectric structure has a width substantially equal to a gate length of other non-functioning edge dummy structures or functioning gate electrodes. The formation of the dielectric structure includes a deposition process. In some embodiments, a planarization or etching process is used to remove excess material deposited during the formation of the dielectric material.

FIG. 16D is a cross-sectional view of semiconductor device 1600 following operation 1226 in accordance with one or more embodiments.

Trench 1622 is filled with a dielectric material to form a dielectric structure 1624. In some embodiments, the dielectric material is silicon nitride. In some embodiments, the dielectric material is silicon carbide. In some embodiments, the dielectric material is a high-k dielectric material.

In some embodiments, dielectric structure 1624 includes multiple structures. For example, dielectric structure 1624 includes an oxide-nitride-oxide structure (ONO). In some embodiments, upper portion 1622A of trench 1622 is filled with one dielectric material, and lower portion 1622B of trench 1622 is filled with a different dielectric material. Dielectric structure 1624 is formed by using a deposition process such as CVD, PVD, ALD, other suitable processes, or combinations thereof. In some embodiments, a first formation process is used to fill upper portion 1622A and a different formation process is used to fill lower portion 1622B. In some embodiments, one or more dielectric structures are formed between edge dummy structures 1620A and 1620B. In some embodiments, dummy structures 1614A and 1614B are able to be replaced after the formation of the dielectric structure 1624.

Figure 15:
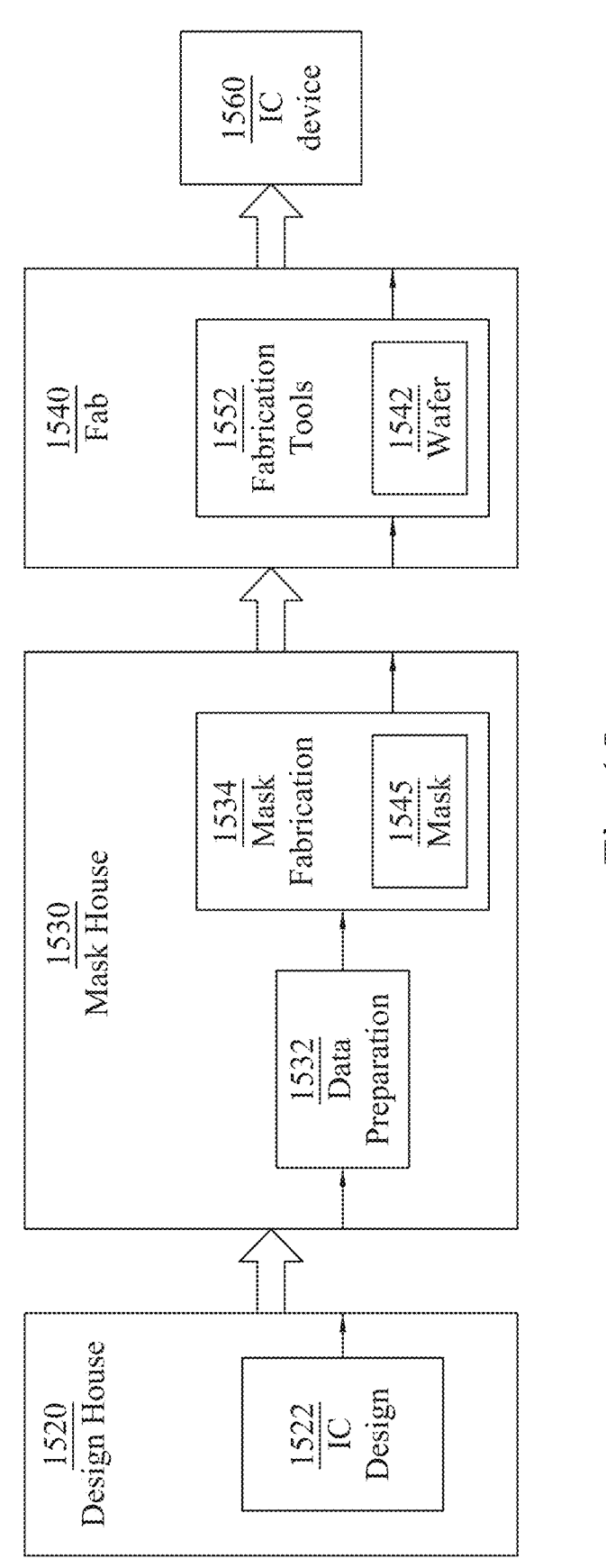
FIG. 15 is a block diagram of an IC manufacturing system, and an IC manufacturing flow associated therewith, in accordance with at least one embodiment of the present disclosure.

In some embodiments, at least one or more operations of method 1200A-1200B is performed by system 1500 of FIG. 15. In some embodiments, at least one method(s), such as method 1200A-1200B discussed above, is performed in whole or in part by at least one manufacturing system, including system 1500. One or more of the operations of method 1200A-1200B is performed by IC fab 1540 (FIG. 15) to fabricate IC device 1560. In some embodiments, one or more of the operations of method 1200A-1200B is performed by fabrication tools 1552 to fabricate wafer 1542.

In some embodiments, the conductive material includes copper, aluminum, titanium, nickel, tungsten, or other suitable conductive material. In some embodiments, the openings and trench are filled using CVD, PVD, sputtering, ALD or other suitable formation process. In some embodiments, after conductive material is deposited in one or more of operations 1204, 1206, 1208, 1210, 1212, 1214, 1216, 1220, 1222, 1224 or 1226, the conductive material is planarized to provide a level surface for subsequent steps.

In some embodiments, one or more of the operations of at least method 100, 200, 300A, 300B, 1200A-1200B or 1300 is not performed.

One or more of the operations of methods 100, 200, 300A, 300B or 1300 is performed by a processing device configured to execute instructions for manufacturing an integrated circuit, such as at least integrated circuit 600. In some embodiments, one or more operations of methods 100, 200, 300A, 300B or 1300 is performed using a same processing device as that used in a different one or more operations of methods 100, 200, 300A, 300B or 1300. In some embodiments, a different processing device is used to perform one or more operations of methods 100, 200, 300A, 300B or 1300 from that used to perform a different one or more operations of methods 100, 200, 300A, 300B or 1300. In some embodiments, other order of operations of method 1200, 1000 or 1100 is within the scope of the present disclosure. Method 100, 200, 300A, 300B, 1200A-1200B or 1300 includes exemplary operations, but the operations are not necessarily performed in the order shown. Operations in method 100, 200, 300A, 300B, 1200A-1200B or 1300 may be added, replaced, changed order, and/or eliminated as appropriate, in accordance with the spirit and scope of disclosed embodiments.

Figure 13:
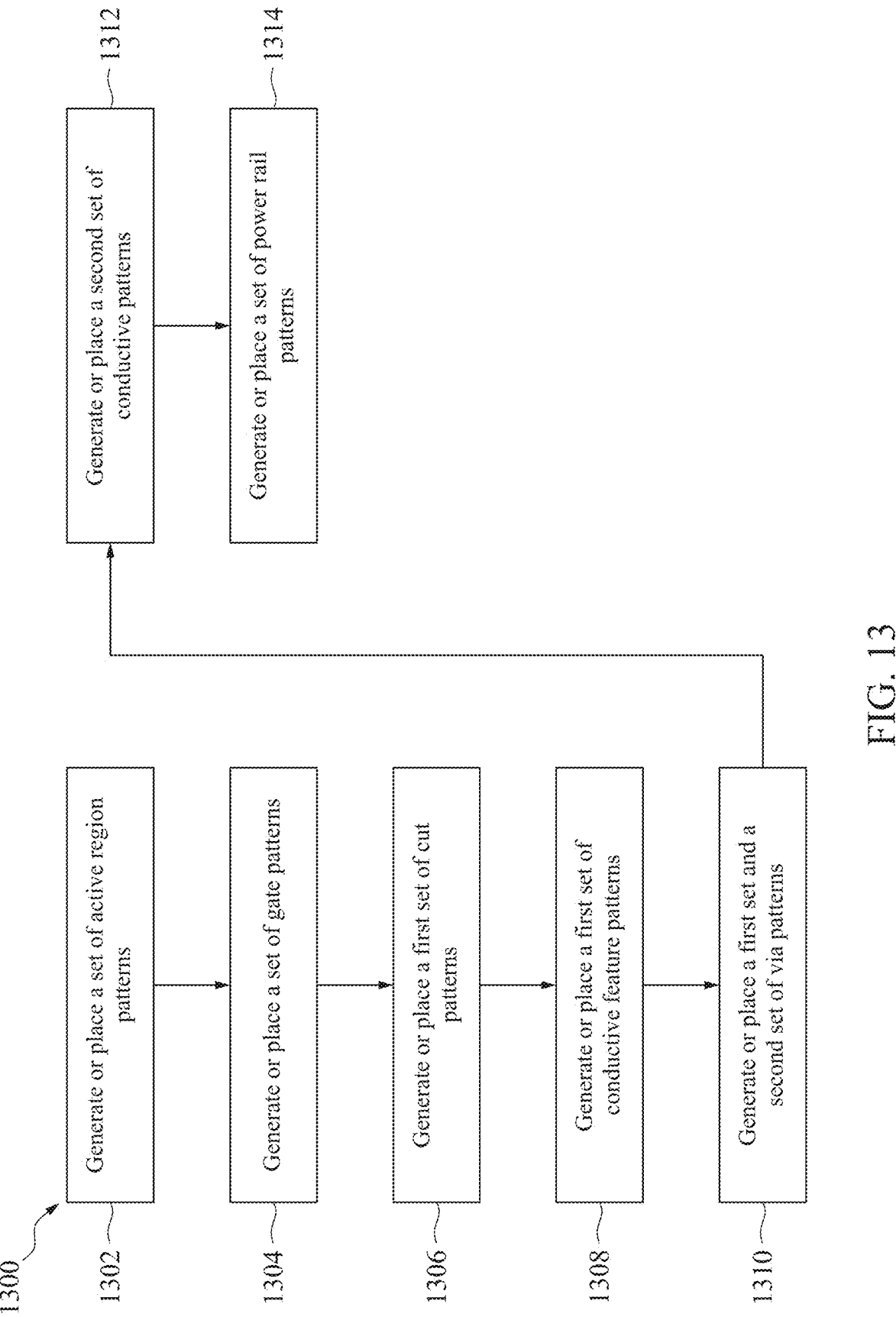
FIG. 13 is a flowchart of a method of generating a layout design of an integrated circuit in accordance with some embodiments.

FIG. 13 is a flowchart of a method 1300 of generating a layout design of an integrated circuit, in accordance with some embodiments. It is understood that additional operations may be performed before, during, and/or after the method 1300 depicted in FIG. 13, and that some other processes may only be briefly described herein.

In some embodiments, method 1300 is an embodiment of operation 202 of method 200. In some embodiments, method 1300 is usable to generate one or more layout patterns of at least layout design 500A-500D, 700A-700B, 800A-800B, 900A-900B, 1000A-1000B or 1100A-1100B, or one or more features similar to at least integrated circuit 600.

In some embodiments, method 1300 is usable to generate one or more layout patterns having structural relationships including alignment, lengths and widths, as well as configurations and layers of at least layout design 500A-500D, 700A-700B, 800A-800B, 900A-900B, 1000A-1000B or 1100A-1100B, or one or more features similar to at least integrated circuit 600, and similar detailed description will not be described in FIG. 13, for brevity.

In operation 1302 of method 1300, a set of active region patterns is generated or placed on the layout design. In some embodiments, the set of active region patterns of method

1300 includes at least portions of one or more patterns of the set of active region patterns 502 or 1102. In some embodiments, the set of active region patterns of method 1300 includes one or more regions similar to the set of active regions 602.

In operation 1304 of method 1300, a set of gate patterns is generated or placed on the layout design. In some embodiments, the set of gate patterns of method 1300 includes at least portions of one or more gate patterns of the set of gate patterns 1004 or 1104. In some embodiments, the set of gate patterns of method 1300 includes at least portions of one or more of floating gate pattern 1005*b*, floating gate pattern 1105*a* or floating gate pattern 1105*c*.

In some embodiments, the set of gate patterns of method 1300 includes at least portions of one or more dummy gate isolation patterns of the set of dummy gate isolation patterns 504, 505, 704, 804, 805, 904 or 905. In some embodiments, the set of gate patterns of method 1300 includes one or more gate patterns similar to at least the set of gate structures 604 or 605.

In operation 1306 of method 1300, a first set of cut patterns is generated or placed on the layout design. In some embodiments, the first set of cut patterns of method 1300 includes at least portions of one or more cut patterns of the set of poly cut feature patterns 530, 532 or 932.

In some embodiments, the first set of cut patterns of method 1300 includes one or more cut patterns similar to at least gate portions of gate structure 630 or 632 that are removed during operation 104 of method 100 (FIG. 1).

In operation 1308 of method 1300, a first set of conductive feature patterns is generated or placed on the layout design. In some embodiments, the first set of conductive feature patterns of method 1300 includes at least portions of one or more patterns of at least the set of conductive feature patterns 506, 507, 706, 906, 907 or 1106.

In some embodiments, the first set of conductive feature patterns of method 1300 includes one or more conductive feature patterns similar to at least the set of conductors 606 or 607.

In operation 1310 of method 1300, a first set of via patterns and a second set of via patterns are generated or placed on the layout design. In some embodiments, the first set of via patterns of method 1300 includes at least portions of one or more via patterns of set of via patterns 514, 515, 516, 814, 914, 915, 1014 or 1114. In some embodiments, the first set of via patterns of method 1300 includes one or more via patterns similar to at least the set of vias 614, 615, 616. In some embodiments, the first set of via patterns of method 1300 includes one or more vias similar to at least vias in the VD layer.

In some embodiments, the second set of via patterns of method 1300 includes at least portions of one or more via patterns of set of via patterns 510, 512, 810, 910, 1010 or 1110. In some embodiments, the second set of via patterns of method 1300 includes one or more via patterns similar to at least the set of vias 610 or 612. In some embodiments, the second set of via patterns of method 1300 includes one or more vias similar to at least vias in the VG layer.

In operation 1312 of method 1300, a second set of conductive feature patterns is generated or placed on the layout design. In some embodiments, the second set of conductive feature patterns of method 1300 includes at least portions of one or more conductive feature patterns of at least the set of conductive feature patterns 520 or 521.

In some embodiments, the second set of conductive feature patterns of method 1300 includes one or more conductive feature patterns similar to at least the set of conductors 620 or 621. In some embodiments, the second set of conductive feature patterns of method 1300 includes one or more conductors similar to at least conductors in the M0 layer.

In operation 1314 of method 1300, a set of power rail patterns is generated or placed on the layout design. In some embodiments, the set of power rail patterns of method 1300 includes at least portions of one or more power rail patterns of at least the set of power rail patterns 522.

In some embodiments, the set of power rail patterns of method 1300 includes one or more power rail patterns similar to at least the set of power rails 622. In some embodiments, the set of power rail patterns of method 1300 includes one or more power rails similar to at least power rails in the M0 layer.

FIG. 14 is a schematic view of a system 1400 for designing an IC layout design and manufacturing an IC circuit in accordance with some embodiments.

In some embodiments, system 1400 generates or places one or more IC layout designs described herein. System 1400 includes a hardware processor 1402 and a non-transitory, computer readable storage medium 1404 (e.g., memory 1404) encoded with, i.e., storing, the computer program code 1406, i.e., a set of executable instructions 1406. Computer readable storage medium 1404 is configured for interfacing with manufacturing machines for producing the integrated circuit. The processor 1402 is electrically coupled to the computer readable storage medium 1404 via a bus 1408. The processor 1402 is also electrically coupled to an I/O interface 1410 by bus 1408. A network interface 1412 is also electrically connected to the processor 1402 via bus 1408. Network interface 1412 is connected to a network 1414, so that processor 1402 and computer readable storage medium 1404 are capable of connecting to external elements via network 1414. The processor 1402 is configured to execute the computer program code 1406 encoded in the computer readable storage medium 1404 in order to cause system 1400 to be usable for performing a portion or all of the operations as described in methods 100-300B and 1300.

In some embodiments, the processor 1402 is a central processing unit (CPU), a multi-processor, a distributed processing system, an application specific integrated circuit (ASIC), and/or a suitable processing unit.

In some embodiments, the computer readable storage medium 1404 is an electronic, magnetic, optical, electro-magnetic, infrared, and/or a semiconductor system (or apparatus or device). For example, the computer readable storage medium 1404 includes a semiconductor or solid-state memory, a magnetic tape, a removable computer diskette, a random access memory (RAM), a read-only memory (ROM), a rigid magnetic disk, and/or an optical disk. In some embodiments using optical disks, the computer readable storage medium 1404 includes a compact disk-read only memory (CD-ROM), a compact disk-read/write (CD-R/W), and/or a digital video disc (DVD).

In some embodiments, the storage medium 1404 stores the computer program code 1406 configured to cause system 1400 to perform methods 100-300B and 1300. In some embodiments, the storage medium 1404 also stores information needed for performing methods 100-300B and 1300 as well as information generated during performing methods 100-300B and 1300, such as layout design 1416, user interface 1418 and fabrication tool 1420, and/or a set of executable instructions to perform the operation of methods 100-300B and 1300. In some embodiments, layout design 1416 comprises one or more of layout patterns of at least layout design 500A-500D, 700A-700B, 800A-800B, 900A-

900B, 1000A-1000B or 1100A-1100B, or features similar to at least integrated circuit 600.

In some embodiments, the storage medium 1404 stores instructions (e.g., computer program code 1406) for interfacing with manufacturing machines. The instructions (e.g., computer program code 1406) enable processor 1402 to generate manufacturing instructions readable by the manufacturing machines to effectively implement methods 100-300B and 1300 during a manufacturing process.

System 1400 includes I/O interface 1410. I/O interface 1410 is coupled to external circuitry. In some embodiments, I/O interface 1410 includes a keyboard, keypad, mouse, trackball, trackpad, and/or cursor direction keys for communicating information and commands to processor 1402.

System 1400 also includes network interface 1412 coupled to the processor 1402. Network interface 1412 allows system 1400 to communicate with network 1414, to which one or more other computer systems are connected. Network interface 1412 includes wireless network interfaces such as BLUETOOTH, WIFI, WIMAX, GPRS, or WCDMA; or wired network interface such as ETHERNET, USB, or IEEE-2094. In some embodiments, methods 100-300B and 1300 is implemented in two or more systems 1400, and information such as layout design, and user interface are exchanged between different systems 1400 by network 1414.

System 1400 is configured to receive information related to a layout design through I/O interface 1410 or network interface 1412. The information is transferred to processor 1402 by bus 1408 to determine a layout design for producing at least integrated circuit 600. The layout design is then stored in computer readable medium 1404 as layout design 1416. System 1400 is configured to receive information related to a user interface through I/O interface 1410 or network interface 1412. The information is stored in computer readable medium 1404 as user interface 1418. System 1400 is configured to receive information related to a fabrication tool 1420 through I/O interface 1410 or network interface 1412. The information is stored in computer readable medium 1404 as fabrication tool 1420. In some embodiments, the fabrication tool 1420 includes fabrication information utilized by system 1400. In some embodiments, the fabrication tool 1420 corresponds to mask fabrication 1534 of FIG. 15.

In some embodiments, methods 100-300B and 1300 is implemented as a standalone software application for execution by a processor. In some embodiments, methods 100-300B and 1300 is implemented as a software application that is a part of an additional software application. In some embodiments, methods 100-300B and 1300 is implemented as a plug-in to a software application. In some embodiments, methods 100-300B and 1300 is implemented as a software application that is a portion of an EDA tool. In some embodiments, methods 100-300B and 1300 is implemented as a software application that is used by an EDA tool. In some embodiments, the EDA tool is used to generate a layout of the integrated circuit device. In some embodiments, the layout is stored on a non-transitory computer readable medium. In some embodiments, the layout is generated using a tool such as VIRTUOSO® available from CADENCE DESIGN SYSTEMS, Inc., or another suitable layout generating tool. In some embodiments, the layout is generated based on a netlist which is created based on the schematic design. In some embodiments, methods 100-300B and 1300 is implemented by a manufacturing device to manufacture an integrated circuit using a set of masks manufactured based on one or more layout designs generated by system 1400. In some embodiments, system 1400 is a manufacturing device configured to manufacture an integrated circuit using a set of masks manufactured based on one or more layout designs of the present disclosure. In some embodiments, system 1400 of FIG. 14 generates layout designs of an integrated circuit that are smaller than other approaches. In some embodiments, system 1400 of FIG. 14 generates layout designs of integrated circuit structure that occupy less area and provide better routing resources than other approaches.

FIG. 15 is a block diagram of an integrated circuit (IC) manufacturing system 1500, and an IC manufacturing flow associated therewith, in accordance with at least one embodiment of the present disclosure. In some embodiments, based on a layout diagram, at least one of (A) one or more semiconductor masks or (B) at least one component in a layer of a semiconductor integrated circuit is fabricated using manufacturing system 1500.

In FIG. 15, IC manufacturing system 1500 (hereinafter "system 1500") includes entities, such as a design house 1520, a mask house 1530, and an IC manufacturer/fabricator ("fab") 1540, that interact with one another in the design, development, and manufacturing cycles and/or services related to manufacturing an IC device 1560. The entities in system 1500 are connected by a communications network. In some embodiments, the communications network is a single network. In some embodiments, the communications network is a variety of different networks, such as an intranet and the Internet. The communications network includes wired and/or wireless communication channels. Each entity interacts with one or more of the other entities and provides services to and/or receives services from one or more of the other entities. In some embodiments, one or more of design house 1520, mask house 1530, and IC fab 1540 is owned by a single larger company. In some embodiments, one or more of design house 1520, mask house 1530, and IC fab 1540 coexist in a common facility and use common resources.

Design house (or design team) 1520 generates an IC design layout 1522. IC design layout 1522 includes various geometrical patterns designed for an IC device 1560. The geometrical patterns correspond to patterns of metal, oxide, or semiconductor layers that make up the various components of IC device 1560 to be fabricated. The various layers combine to form various IC features. For example, a portion of IC design layout 1522 includes various IC features, such as an active region, gate electrode, source electrode and drain electrode, metal lines or vias of an interlayer interconnection, and openings for bonding pads, to be formed in a semiconductor substrate (such as a silicon wafer) and various material layers disposed on the semiconductor substrate. Design house 1520 implements a proper design procedure to form IC design layout 1522. The design procedure includes one or more of logic design, physical design or place and route. IC design layout 1522 is presented in one or more data files having information of the geometrical patterns. For example, IC design layout 1522 can be expressed in a GDSII file format or DFII file format.

Mask house 1530 includes data preparation 1532 and mask fabrication 1534. Mask house 1530 uses IC design layout 1522 to manufacture one or more masks 1545 to be used for fabricating the various layers of IC device 1560 according to IC design layout 1522. Mask house 1530 performs mask data preparation 1532, where IC design layout 1522 is translated into a representative data file (RDF). Mask data preparation 1532 provides the RDF to mask fabrication 1534. Mask fabrication 1534 includes a mask writer. A mask writer converts the RDF to an image on a substrate, such as a mask (reticle) 1545 or a semiconductor wafer 1542. The IC design layout 1522 is manipulated by mask data preparation 1532 to comply with particular characteristics of the mask writer and/or requirements of IC fab 1540. In FIG. 15, mask data preparation 1532 and mask fabrication 1534 are illustrated as separate elements. In some embodiments, mask data preparation 1532 and mask fabrication 1534 can be collectively referred to as mask data preparation.

In some embodiments, mask data preparation 1532 includes optical proximity correction (OPC) which uses lithography enhancement techniques to compensate for image errors, such as those that can arise from diffraction, interference, other process effects and the like. OPC adjusts IC design layout 1522. In some embodiments, mask data preparation 1532 includes further resolution enhancement techniques (RET), such as off-axis illumination, sub-resolution assist features, phase-shifting masks, other suitable techniques, and the like or combinations thereof. In some embodiments, inverse lithography technology (ILT) is also used, which treats OPC as an inverse imaging problem.

In some embodiments, mask data preparation 1532 includes a mask rule checker (MRC) that checks the IC design layout that has undergone processes in OPC with a set of mask creation rules which contain certain geometric and/or connectivity restrictions to ensure sufficient margins, to account for variability in semiconductor manufacturing processes, and the like. In some embodiments, the MRC modifies the IC design layout to compensate for limitations during mask fabrication 1534, which may undo part of the modifications performed by OPC in order to meet mask creation rules.

In some embodiments, mask data preparation 1532 includes lithography process checking (LPC) that simulates processing that will be implemented by IC fab 1540 to fabricate IC device 1560. LPC simulates this processing based on IC design layout 1522 to create a simulated manufactured device, such as IC device 1560. The processing parameters in LPC simulation can include parameters associated with various processes of the IC manufacturing cycle, parameters associated with tools used for manufacturing the IC, and/or other aspects of the manufacturing process. LPC takes into account various factors, such as aerial image contrast, depth of focus (DOF), mask error enhancement factor (MEEF), other suitable factors, and the like or combinations thereof. In some embodiments, after a simulated manufactured device has been created by LPC, if the simulated device is not close enough in shape to satisfy design rules, OPC and/or MRC are be repeated to further refine IC design layout 1522.

It should be understood that the above description of mask data preparation 1532 has been simplified for the purposes of clarity. In some embodiments, data preparation 1532 includes additional features such as a logic operation (LOP) to modify the IC design layout according to manufacturing rules. Additionally, the processes applied to IC design layout 1522 during data preparation 1532 may be executed in a variety of different orders.

After mask data preparation 1532 and during mask fabrication 1534, a mask 1545 or a group of masks 1545 are fabricated based on the modified IC design layout 1522. In some embodiments, mask fabrication 1534 includes performing one or more lithographic exposures based on IC design 1522. In some embodiments, an electron-beam (e-beam) or a mechanism of multiple e-beams is used to form a pattern on a mask (photomask or reticle) 1545 based on the modified IC design layout 1522. The mask 1545 can be formed in various technologies. In some embodiments, the mask 1545 is formed using binary technology. In some embodiments, a mask pattern includes opaque regions and transparent regions. A radiation beam, such as an ultraviolet (UV) beam, used to expose the image sensitive material layer (e.g., photoresist) which has been coated on a wafer, is blocked by the opaque region and transmits through the transparent regions. In one example, a binary version of mask 1545 includes a transparent substrate (e.g., fused quartz) and an opaque material (e.g., chromium) coated in the opaque regions of the binary mask. In another example, the mask 1545 is formed using a phase shift technology. In the phase shift mask (PSM) version of mask 1545, various features in the pattern formed on the mask are configured to have proper phase difference to enhance the resolution and imaging quality. In various examples, the phase shift mask can be attenuated PSM or alternating PSM. The mask(s) generated by mask fabrication 1534 is used in a variety of processes. For example, such a mask(s) is used in an ion implantation process to form various doped regions in the semiconductor wafer, in an etching process to form various etching regions in the semiconductor wafer, and/or in other suitable processes.

IC fab 1540 is an IC fabrication entity that includes one or more manufacturing facilities for the fabrication of a variety of different IC products. In some embodiments, IC Fab 1540 is a semiconductor foundry. For example, there may be a manufacturing facility for the front end fabrication of a plurality of IC products (front-end-of-line (FEOL) fabrication), while a second manufacturing facility may provide the back end fabrication for the interconnection and packaging of the IC products (back-end-of-line (BEOL) fabrication), and a third manufacturing facility may provide other services for the foundry entity.

IC fab 1540 includes wafer fabrication tools 1552 (hereinafter "fabrication tools 1552") configured to execute various manufacturing operations on semiconductor wafer 1542 such that IC device 1560 is fabricated in accordance with the mask(s), e.g., mask 1545. In various embodiments, fabrication tools 1552 include one or more of a wafer stepper, an ion implanter, a photoresist coater, a process chamber, e.g., a CVD chamber or LPCVD furnace, a CMP system, a plasma etch system, a wafer cleaning system, or other manufacturing equipment capable of performing one or more suitable manufacturing processes as discussed herein.

IC fab 1540 uses mask(s) 1545 fabricated by mask house 1530 to fabricate IC device 1560. Thus, IC fab 1540 at least indirectly uses IC design layout 1522 to fabricate IC device 1560. In some embodiments, a semiconductor wafer 1542 is fabricated by IC fab 1540 using mask(s) 1545 to form IC device 1560. In some embodiments, the IC fabrication includes performing one or more lithographic exposures based at least indirectly on IC design 1522. Semiconductor wafer 1542 includes a silicon substrate or other proper substrate having material layers formed thereon. Semiconductor wafer 1542 further includes one or more of various doped regions, dielectric features, multilevel interconnects, and the like (formed at subsequent manufacturing steps).

System 1500 is shown as having design house 1520, mask house 1530 or IC fab 1540 as separate components or entities. However, it is understood that one or more of design house 1520, mask house 1530 or IC fab 1540 are part of the same component or entity.

FIGS. 16A-16D are corresponding cross-sectional views of a semiconductor device 1600, in accordance with some embodiments. The details of semiconductor device 1600 of FIGS. 16A-16D are described above in FIG. 12B.

FIG. 16A is a cross-sectional view of semiconductor device 1600 before operation 1220 of method 1200B in accordance with one or more embodiments. FIG. 16B is a cross-sectional view of semiconductor device 1600 following operation 1220 of method 1200B in accordance with one or more embodiments. FIG. 16C is a cross-sectional view of semiconductor device 1600 following operation 1224 of method 1200B in accordance with one or more embodiments. FIG. 16D is a cross-sectional view of semiconductor device 1600 following operation 1226 of method 1200B in accordance with one or more embodiments.

One aspect of this description relates to an integrated circuit. In some embodiments, the integrated circuit includes a first active region extending in a first direction, and being on a first level of a substrate. In some embodiments, the integrated circuit further includes a second active region extending in the first direction, and being on the first level of the substrate, and being separated from the first active region in a second direction different from the first direction. In some embodiments, the integrated circuit further includes a floating gate extending in the second direction, being located on a second level different from the first level, and overlapping the second active region, and the floating gate being electrically floating. In some embodiments, the integrated circuit further includes a first dummy gate extending in the second direction, being located on the second level, and being separated from the floating gate in the second direction, and the first dummy gate and the floating gate separating a first cell from a second cell in the integrated circuit, wherein the first cell corresponds to a first transistor, and the second cell corresponds to a second transistor. In some embodiments, the integrated circuit further includes a first conductor and a second conductor extending in the second direction, being on a third level different from the first level and the second level, and being separated from each other in the first direction, and overlapping the second active region, the first conductor and the second conductor being electrically coupled to a corresponding source and a corresponding drain of the second active region, and the first conductor and the second conductor being configured to supply a same signal or a same supply voltage to the corresponding source and the corresponding drain of the second active region, and the floating gate is between the first conductor and the second conductor. In some embodiments, the integrated circuit further includes a first power rail extending in the first direction, being located on a fourth level different from the first level, the second level and the third level, the first power rail being configured to supply a first supply voltage. In some embodiments, the integrated circuit further includes a second power rail extending in the first direction, being located on the fourth level, and being separated from the first power rail in a second direction different from the first direction, the second power rail being configured to supply a second supply voltage different from the first supply voltage. In some embodiments, the first active region and the second active region are between the first power rail and the second power rail. In some embodiments, the integrated circuit further includes a first via between the first conductor and the second power rail, the first via electrically coupling the first conductor to the second power rail. In some embodiments, the integrated circuit further includes a second via between the second conductor and the second power rail, the second via electrically coupling the second conductor to the second power rail. In some embodiments, the first conductor and the second conductor being configured to supply the second supply voltage to the corresponding source and the corresponding drain of the second active region. In some embodiments, the integrated circuit further includes a third conductor extending in the first direction, being located on the fourth level, and overlapping the floating gate; a fourth conductor extending in the first direction, being located on the fourth level, and overlapping the floating gate; a fifth conductor extending in the first direction, being located on the fourth level, and overlapping the first dummy gate; and a sixth conductor extending in the first direction, being located on the fourth level, and overlapping the first dummy gate. In some embodiments, each of the third conductor, the fourth conductor, the fifth conductor and the sixth conductor are separated from each other in the second direction. In some embodiments, the integrated circuit further includes a first gate extending in the second direction, being located on the second level, overlapping the second active region, and being separated from the floating gate in the first direction. In some embodiments, the integrated circuit further includes a third via between the fourth conductor and the first gate, the third via electrically coupling the fourth conductor and the first gate together. In some embodiments, the integrated circuit further includes a third via between the first conductor and the first active region, the third via electrically coupling the first conductor and the first active region together. In some embodiments, the integrated circuit further includes a second dummy gate extending in the second direction, being located on the second level, being separated from the first dummy gate and the floating gate in the first direction, the second dummy gate continuously extending from at least the first power rail to the second power rail, and being adjacent to the second conductor. In some embodiments, the second dummy gate further separates the first cell and the second cell from each other. In some embodiments, the third conductor, the fourth conductor, the fifth conductor and the sixth conductor further overlap the second dummy gate. In some embodiments, the integrated circuit further includes a third conductor extending in the first direction, overlapping the first dummy gate, the first conductor and the second conductor, and being located on a fourth level different from the first level, the second level and the third level. In some embodiments, the integrated circuit further includes a first via between the first conductor and the third conductor, the first via electrically coupling the first conductor to the third conductor. In some embodiments, the integrated circuit further includes a second via between the second conductor and the third conductor, the second via electrically coupling the second conductor to the third conductor. In some embodiments, the first conductor and the second conductor further overlap the first active region, and the third conductor being configured to supply the same signal to the first conductor and the second conductor. In some embodiments, the first transistor is part of a first inverter of a flip-flop, and the second transistor is part of a latch of the flip-flop. In some embodiments, the floating gate is part of a floating gate transistor, the source of the second active region is a source of the floating gate transistor, and the drain of the second active region is a drain of the floating gate transistor.

Another aspect of this description relates to an integrated circuit that includes a first transistor of a first type. In some embodiments, the integrated circuit further includes a floating gate transistor coupled to the first transistor, and being separated from the first transistor in a first direction. In some embodiments, the floating gate transistor includes a drain coupled to a first voltage supply, a source coupled to the first voltage supply, and a floating gate extending in a second direction different from the first direction, being located on a first level, and the floating gate being electrically floating. In some embodiments, the integrated circuit further includes a second transistor of a second type different from the first type, the second transistor being separated from the first transistor in the second direction. In some embodiments, the second transistor includes a first gate extending in the second direction, and being separated from the floating gate in the first direction. In some embodiments, the integrated circuit further includes a first conductor extending in the first direction, being on a second level different from the first level, and overlapping at least the floating gate, the first conductor is not electrically coupled to the floating gate. In some embodiments, the integrated circuit further includes a second conductor extending in the first direction, being on the second level, overlapping at least the first gate, and being separated from the first conductor in the second direction, and the second conductor being electrically coupled to the second transistor. In some embodiments, the integrated circuit further includes a first active region extending in the first direction, and being on a third level different from the first level and the second level, the first active region being overlapped by the floating gate and the first gate. In some embodiments, the first active region includes a first region corresponding to a first source/drain region of the floating gate transistor, and being coupled to the first voltage supply; a second region corresponding to a second source/drain region of the floating gate transistor and the first transistor, and being coupled to the first voltage supply; and a third region corresponding to a third source/drain region of the first transistor. In some embodiments, the integrated circuit further includes a second active region extending in the first direction, being on the third level, and being separated from the first active region in the second direction, the second active region being overlapped by at least the first gate. In some embodiments, the second active region includes a fourth region corresponding to a fourth source/drain region of the second transistor, and being coupled to a second voltage supply different from the first voltage supply; and a fifth region corresponding to a fifth source/drain region of the second transistor. In some embodiments, the integrated circuit further includes a third conductor extending in the first direction, being on the second level, and overlapping the first gate, and being adjacent to the first conductor. In some embodiments, the integrated circuit further includes a fourth conductor extending in the first direction, being on the second level, and overlapping the floating gate, and being adjacent to the second conductor, the fourth conductor is not electrically coupled to the floating gate. In some embodiments, the integrated circuit further includes a first via between the third conductor and the first gate, the first via electrically coupling the third conductor and the first gate together. In some embodiments, the integrated circuit further includes a second via between the second conductor and the fifth region, the second via electrically coupling the second conductor and the fifth region together. In some embodiments, the first transistor and the second transistor are part of a first inverter, and the third region and the fifth region are electrically coupled together and correspond to an output node of the first inverter. In some embodiments, the integrated circuit further includes a third transistor of the second type, the third transistor being adjacent to the second transistor, and being separated from the floating gate transistor in the second direction. In some embodiments, the third transistor includes a second gate extending in the second direction, being separated from the floating gate in the second direction, and overlapping the second active region. In some embodiments, the first conductor further overlaps the first gate, and is not electrically coupled to the first gate. In some embodiments, the second conductor further overlaps the second gate, and is electrically coupled to the second gate. In some embodiments, the second active region further comprises a sixth region corresponding to a sixth source/drain region of the third transistor; the fourth region further corresponds to the fifth source/drain region of the third transistor; and the third region is coupled to the first voltage supply. In some embodiments, the integrated circuit further includes a first contact extending in the second direction, overlapping the first region, electrically coupled to the first region and being on a fourth level different from the second level and the third level. In some embodiments, the integrated circuit further includes a second contact extending in the second direction, overlapping the second region, electrically coupled to the second region and being on the fourth level. In some embodiments, the integrated circuit further includes a third contact extending in the second direction, overlapping the third region, electrically coupled to the third region and being on the fourth level. In some embodiments, the integrated circuit further includes a fourth contact extending in the second direction, overlapping the fourth region, electrically coupled to the fourth region, being on the fourth level, and being separated from the third contact in the second direction. In some embodiments, the integrated circuit further includes a fifth contact extending in the second direction, overlapping the fifth region, electrically coupled to the fifth region, being on the fourth level, and being separated from the second contact in the second direction. In some embodiments, the integrated circuit further includes a sixth contact extending in the second direction, overlapping the sixth region, electrically coupled to the sixth region, being on the fourth level, and being separated from the first contact in the second direction. In some embodiments, the first contact, the second contact and the third contact are separated from each other in the first direction, and the fourth contact, the fifth contact and the sixth contact are separated from each other in the first direction. In some embodiments, the integrated circuit further includes a first via between the second conductor and the second gate, the first via electrically coupling the second conductor and the second gate together. In some embodiments, the integrated circuit further includes a second via between the second conductor and the fourth contact, the second via electrically coupling the second conductor and the fourth contact together.

Still another aspect of this description relates to a method of forming an integrated circuit. In some embodiments, the method includes fabricating a set of active regions of a set of transistors in a front-side of a substrate, the set of active regions extending in a first direction, the set of active regions including a first active region and a second active region, the first active region and the second active region being separated from each other in a second direction different from the first direction, the first active region including a first well and a second well. In some embodiments, the method further includes fabricating a set of gate structures extending in the second direction, overlapping the set of active regions, being located on a first level of the integrated circuit, the set of gate structures including a first gate structure that overlaps the first well and the second well. In some embodiments, the method further includes replacing a first portion of the first gate structure with a dummy gate. In some embodiments, the method further includes replacing a second portion of the first gate structure with a floating gate, the floating gate corresponding to a floating dummy gate of a floating gate transistor, the floating gate and the dummy gate being separated from each other in the second direction. In some embodiments, the method further includes depositing a first conductive material on a second level of the integrated circuit thereby forming a first set of conductors extending in the second direction, the first set of conductors including a first conductor and a second conductor on the second level different from the first level, being separated from each other in the first direction, and overlapping the second active region, and the floating gate is between the first conductor and the second conductor. In some embodiments, the method further includes fabricating a first set of vias, the first set of vias including a first via and a second via over the corresponding first conductor and the second conductor. In some embodiments, the method further includes depositing a second conductive material on a third level thereby forming a second set of conductors and a set of power rails, wherein at least one of a conductor of the second set of conductors or a first power rail of the set of power rails is electrically coupled to the first via and the second via. In some embodiments, the first conductor and the second conductor are configured to supply a same signal or a same supply voltage to a corresponding source and a drain of the second active region. In some embodiments, replacing the first portion of the first gate structure with the dummy gate includes depositing an inter-layer dielectric (ILD) over at least the set of active regions, removing a material of the first portion of the first gate structure thereby forming a first opening in the ILD, removing a portion of the first active region defined by the first opening to form a first trench, and filling the first trench with a dielectric material thereby forming a dielectric structure, the dielectric structure corresponding to the dummy gate.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An integrated circuit comprising:
a first active region extending in a first direction, and being on a first level of a substrate;
a second active region extending in the first direction, and being on the first level of the substrate, and being separated from the first active region in a second direction different from the first direction;
a floating gate extending in the second direction, being located on a second level different from the first level, and overlapping the second active region, and the floating gate being electrically floating;
a first dummy gate extending in the second direction, being located on the second level, and being separated from the floating gate in the second direction, and the first dummy gate and the floating gate separating a first cell from a second cell in the integrated circuit, wherein the first cell corresponds to a first transistor, and the second cell corresponds to a second transistor; and
a first conductor and a second conductor extending in the second direction, being on a third level different from the first level and the second level, and being separated from each other in the first direction, and overlapping the second active region, the first conductor and the second conductor being electrically coupled to a corresponding source and a corresponding drain of the second active region, and the first conductor and the second conductor being configured to supply a same signal or a same supply voltage to the corresponding source and the corresponding drain of the second active region, and the floating gate is between the first conductor and the second conductor;

wherein the first transistor is part of a first inverter of a flip-flop; and the second transistor is part of a latch of the flip-flop.

2. The integrated circuit of claim 1, further comprising:
a first power rail extending in the first direction, being located on a fourth level different from the first level, the second level and the third level, the first power rail being configured to supply a first supply voltage; and
a second power rail extending in the first direction, being located on the fourth level, and being separated from the first power rail in the second direction, the second power rail being configured to supply a second supply voltage different from the first supply voltage,
wherein the first active region and the second active region are between the first power rail and the second power rail.

3. The integrated circuit of claim 2, further comprising:
a first via between the first conductor and the second power rail, the first via electrically coupling the first conductor to the second power rail; and
a second via between the second conductor and the second power rail, the second via electrically coupling the second conductor to the second power rail,
wherein the first conductor and the second conductor being configured to supply the second supply voltage to the corresponding source and the corresponding drain of the second active region.

4. The integrated circuit of claim 3, further comprising:
a third conductor extending in the first direction, being located on the fourth level, and overlapping the floating gate;
a fourth conductor extending in the first direction, being located on the fourth level, and overlapping the floating gate;
a fifth conductor extending in the first direction, being located on the fourth level, and overlapping the first dummy gate; and
a sixth conductor extending in the first direction, being located on the fourth level, and overlapping the first dummy gate,
wherein each of the third conductor, the fourth conductor, the fifth conductor and the sixth conductor are separated from each other in the second direction.

5. The integrated circuit of claim 4, further comprising:
a first gate extending in the second direction, being located on the second level, overlapping the second active region, and being separated from the floating gate in the first direction; and
a third via between the fourth conductor and the first gate, the third via electrically coupling the fourth conductor and the first gate together.

6. The integrated circuit of claim 4, further comprising:
a third via between the first conductor and the first active region, the third via electrically coupling the first conductor and the first active region together.

7. The integrated circuit of claim 4, further comprising:
a second dummy gate extending in the second direction, being located on the second level, being separated from the first dummy gate and the floating gate in the first direction, the second dummy gate continuously extending from at least the first power rail to the second power rail, and being adjacent to the second conductor,
wherein the second dummy gate further separates the first cell and the second cell from each other; and
the third conductor, the fourth conductor, the fifth conductor and the sixth conductor further overlap the second dummy gate.

8. The integrated circuit of claim 1, further comprising:
a third conductor extending in the first direction, overlapping the first dummy gate, the first conductor and the second conductor, and being located on a fourth level different from the first level, the second level and the third level.

9. The integrated circuit of claim 8, further comprising:
a first via between the first conductor and the third conductor, the first via electrically coupling the first conductor to the third conductor; and
a second via between the second conductor and the third conductor, the second via electrically coupling the second conductor to the third conductor,
wherein the first conductor and the second conductor further overlap the first active region, and the third conductor being configured to supply the same signal to the first conductor and the second conductor.

10. The integrated circuit of claim 1, wherein
the floating gate is part of a floating gate transistor;
the source of the second active region is a source of the floating gate transistor; and
the drain of the second active region is a drain of the floating gate transistor.

11. An integrated circuit, comprising:
a first active region extending in a first direction, and being on a first level of a substrate;
a second active region extending in the first direction, and being on the first level of the substrate, and being separated from the first active region in a second direction different from the first direction;
a floating gate extending in the second direction, being located on a second level above the first level, and overlapping the second active region, and the floating gate being electrically floating;
a first dummy gate extending in the second direction, being located on the second level, and being separated from the floating gate in the second direction, and the first dummy gate and the floating gate separating a first cell from a second cell in the integrated circuit, wherein the first cell corresponds to a first transistor, and the second cell corresponds to a second transistor;
a first conductor and a second conductor extending in the second direction, being on a third level different from the first level and the second level, and being separated from each other in the first direction, and overlapping the second active region, the first conductor and the second conductor being electrically coupled to a corresponding source and a corresponding drain of the second active region, and the first conductor and the second conductor being configured to supply a same signal or a same supply voltage to the corresponding source and the corresponding drain of the second active region, and the floating gate is between the first conductor and the second conductor; and
a third conductor extending in the first direction, being located on a fourth level different from the first level, the second level and the third level, the third conductor being configured to supply a first supply voltage or a first signal;
wherein the first transistor is part of a first inverter of a flip-flop; and
the second transistor is part of a latch of the flip-flop.

12. The integrated circuit of claim 11, further comprising:
a fourth conductor extending in the first direction, being located on the fourth level, and being separated from the third conductor in the second direction, the fourth conductor being configured to supply a second supply voltage different from the first supply voltage or a second signal.

13. An integrated circuit comprising:
a first active region extending in a first direction, and being on a first level of a substrate;
a second active region extending in the first direction, and being on the first level of the substrate, and being separated from the first active region in a second direction different from the first direction;
a floating gate extending in the second direction, being located on a second level different from the first level, and overlapping the second active region, and the floating gate being electrically floating;
a first dummy gate overlapping the first active region, extending in the second direction, being located on the second level, and being separated from the floating gate in the second direction by a first distance, and the first dummy gate and the floating gate separating a first cell from a second cell in the integrated circuit, wherein the first cell corresponds to a first transistor, and the second cell corresponds to a second transistor; and
a first conductor and a second conductor extending in the second direction, being on a third level different from the first level and the second level, being separated from each other in the first direction, and overlapping the second active region, the first conductor and the second conductor being electrically coupled to a corresponding source and a corresponding drain of the second active region, and the first conductor and the second conductor being configured to supply a same supply voltage to the corresponding source and the corresponding drain of the second active region, and the floating gate is between the first conductor and the second conductor;
wherein the first transistor is part of a first inverter of a flip-flop; and
the second transistor is part of a latch of the flip-flop.

14. The integrated circuit of claim 13, further comprising:
a first power rail extending in the first direction, being located on a fourth level different from the first level, the second level and the third level, the first power rail being configured to supply a first supply voltage; and
a second power rail extending in the first direction, being located on the fourth level, and being separated from the first power rail in the second direction, the second power rail being configured to supply a second supply voltage different from the first supply voltage,
wherein the first active region and the second active region are between the first power rail and the second power rail.

15. The integrated circuit of claim 14, further comprising:
a first via between the first conductor and the second power rail, the first via electrically coupling the first conductor to the second power rail; and
a second via between the second conductor and the second power rail, the second via electrically coupling the second conductor to the second power rail,
wherein the first conductor and the second conductor being configured to supply the second supply voltage to the corresponding source and the corresponding drain of the second active region.

16. The integrated circuit of claim 15, further comprising:
a third conductor extending in the first direction, being located on the fourth level, and overlapping the floating gate;
a fourth conductor extending in the first direction, being located on the fourth level, and overlapping the floating gate;
a fifth conductor extending in the first direction, being located on the fourth level, and overlapping the first dummy gate; and
a sixth conductor extending in the first direction, being located on the fourth level, and overlapping the first dummy gate,
wherein each of the third conductor, the fourth conductor, the fifth conductor and the sixth conductor are separated from each other in the second direction.

17. The integrated circuit of claim 16, further comprising:
a first gate extending in the second direction, being located on the second level, overlapping the second active region, and being separated from the floating gate in the first direction; and
a third via between the fourth conductor and the first gate, the third via electrically coupling the fourth conductor and the first gate together.

18. The integrated circuit of claim 16, further comprising:
a third via between the first conductor and the first active region, the third via electrically coupling the first conductor and the first active region together.

19. The integrated circuit of claim 16, further comprising:
a second dummy gate extending in the second direction, being located on the second level, being separated from the first dummy gate and the floating gate in the first direction, the second dummy gate continuously extending from at least the first power rail to the second power rail, and being adjacent to the second conductor,
wherein the second dummy gate further separates the first cell and the second cell from each other; and
the third conductor, the fourth conductor, the fifth conductor and the sixth conductor further overlap the second dummy gate.

20. The integrated circuit of claim 13, further comprising:
a third conductor extending in the first direction, overlapping the first dummy gate, the first conductor and the second conductor, and being located on a fourth level different from the first level, the second level and the third level.

* * * * *